United States Patent
Kimura et al.

(10) Patent No.: US 11,171,669 B2
(45) Date of Patent: *Nov. 9, 2021

(54) APPARATUS FOR TRANSMITTING DATA IN INTERLEAVE DIVISION MULTIPLE ACCESS (IDMA) SYSTEM

(71) Applicant: SONY CORPORATION, Tokyo (JP)

(72) Inventors: Ryota Kimura, Tokyo (JP); Yifu Tang, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/898,779

(22) Filed: Jun. 11, 2020

(65) Prior Publication Data

US 2020/0304153 A1   Sep. 24, 2020

Related U.S. Application Data

(63) Continuation of application No. 16/250,097, filed on Jan. 17, 2019, now Pat. No. 10,771,093, which is a
(Continued)

(30) Foreign Application Priority Data

Oct. 17, 2014   (JP) ................. 2014-218184

(51) Int. Cl.
*H03M 13/27*   (2006.01)
*H04L 1/00*   (2006.01)

(52) U.S. Cl.
CPC ... *H03M 13/2792* (2013.01); *H03M 13/2778* (2013.01); *H03M 13/2789* (2013.01);
(Continued)

(58) Field of Classification Search
CPC . H04L 1/00; H04L 1/01; H04L 1/0058; H04L 1/0071; H03M 13/276; H03M 13/2792; H03M 13/2778; H03M 13/2789
See application file for complete search history.

(56) References Cited

U.S. PATENT DOCUMENTS 8,533,575 B2* 9/2013 Li ............... H03M 13/6362
                                              714/790
2006/0234628 A1 10/2006 Horiguchi et al.
(Continued)

FOREIGN PATENT DOCUMENTS

CN   101069377 A   11/2007
CN   101425871 A   5/2009
(Continued)

OTHER PUBLICATIONS

Yoshizawa et al, "Hardware implementation of an interference canceller for IDMA wireless communications", International Symposium on Intelligent Signal Processing and Communication Systems, IEEE, pp. 06, Date: Nov. 12, 2013 to Nov. 15, 2013.
(Continued)

*Primary Examiner* — Shelly A Chase
(74) *Attorney, Agent, or Firm* — Chip Law Group

(57) ABSTRACT

There is provided an apparatus including an acquisition unit configured to acquire an information block generated from transmission data for a user and subjected to error correction coding; and an interleaving unit configured to interleave a bit sequence of the information block using an interleaver unique to the user. The interleaving unit interleaves the bit sequence by interleaving each of two or more partial sequences obtained from the bit sequence.

16 Claims, 29 Drawing Sheets

Related U.S. Application Data continuation of application No. 15/519,862, filed as application No. PCT/JP2015/070650 on Jul. 21, 2015, now Pat. No. 10,224,965.

(52) U.S. Cl.
CPC .............. *H04L 1/00* (2013.01); *H04L 1/0058* (2013.01); *H04L 1/0071* (2013.01)

(56) References Cited

U.S. PATENT DOCUMENTS

| | | | |
|---|---|---|---|
| 2007/0206664 | A1 | 9/2007 | Grant |
| 2009/0327843 | A1* | 12/2009 | Palanki ............... H03M 13/276 |
| | | | 714/776 |
| 2011/0214023 | A1 | 9/2011 | Barlow et al. |
| 2011/0296285 | A1 | 12/2011 | Li |

FOREIGN PATENT DOCUMENTS

| | | |
|---|---|---|
| CN | 102195672 A | 9/2011 |
| EP | 1803247 A1 | 7/2007 |
| JP | 2006-203355 A | 8/2006 |
| JP | 4284280 B2 | 6/2009 |
| JP | 2010-154250 A | 7/2010 |
| WO | 2006/077993 A1 | 7/2006 |
| WO | 2009/145514 A2 | 12/2009 |

OTHER PUBLICATIONS

Yoshizawa et al., "Hardware Implementation of Interference Canceller for IDMA Wireless Systems", IEICE Technical Report, pp. 06, Date: Nov. 12, 2013 to Nov. 15, 2013, Translation of Abstract only.

Luo et al, "IDMA-based cooperative partial packet recovery: principles and applications", EURASIP Journal on Wireless Communications and Networking, pp. 14, Date: Dec. 2012.

Peng et al., "Linear congruential interleaves design for IDMA system", IEEE International Conference on Communication Technology, pp. 03, Date: Sep. 25, 2011 to Sep. 28, 2011.

Office Action for BR Patent Application No. 20171108227 dated Sep. 8, 2020.

Notice of Allowance for U.S. Appl. No. 15/519,862, dated Oct. 12, 2018, 06 pages.

Non-Final Office Action for U.S. Appl. No. 15/519,862, dated Jun. 15, 2018, 15 pages.

Extended European Search Report of EP Patent Application No. 15856105.0, dated Oct. 2, 2018, 15 pages.

Yoshizawa, et al.,"Hardware Implementation of an Interference Canceller for IDMA Wireless Communications", International Symposium on Intelligent Signal Processing and Communication Systems, IEEE, 2013, pp. 645-650.

Peng, et al., "Linear Congruential Interleavers Design for IDMA System", 13th International Conference on Communication Technology, IEEE, Feb. 27, 2012, 04 pages.

Cristea, et al., "Turbo receivers for interleave division multiple access systems", IEEE, Transactions on Communications, vol. 57, No. 7, Jul. 17, 2009, pp. 2090-2097.

Juliet, et al., "Concert Investigation of Novel Deterministic Interleavers for OFDM-IDMA System", Indian Journal of Computer Science and Engineering (IJCSE), vol. 4, No. 5, Oct. 2013, pp. 353-363.

Ritt et al., "Text Proposal on IDMA for Inter-cell interference mitigation in TR 25.814", 3GPP TSG-RAN WG1, 42nd Meeting, R1-050783, Sep. 2, 2005, 17 pages.

Shingo, et al., "Hardware Implementation of Interference Canceller for IDMA Wireless Systems", IEICE Technical Report, RCS, vol. 113, No. 93, Jun. 13, 2013, pp. 91-96.

International Search Report and Written Opinion of PCT Application No. PCT/JP2015/070650, dated Oct. 13, 2015, 08 pages of English Translation and 07 pages of ISRWO.

International Preliminary Report on Patentability of PCT Application No. PCT /JP2015/070650, dated May 11, 2017, 08 pages of English Translation and 04 pages of IPRP.

Shu-Ming Tseng, "IDMA Based on Deterministic Interleavers", International Journal of Communications, Network and System Sciences, vol. 3, No. 1, Jan. 2010, pp. 94-97.

Wu, et al.,"User-Specific Chip-Level Interleaver Design for IDMA Systems", Electronics Letters, vol. 42, No. 4, Feb. 16, 2006, 02 pages.

Hao, et al., "Helical Interleaver Set Design For Interleave-Division Multiplexing and related Techniques", IEEE, Communications Letters, vol. 12, No. 11, Nov. 2008, pp. 843-845.

Pupeza, et al., "Efficient Generation of Interleavers for IDMA", International Conference on Communications, IEEE, 2006, 06 pages.

Office Action for JP Patent Application No. 2016-556390, dated Aug. 6, 2019, 03 pages of Office Action and 03 pages of English Translation.

Non-Final Office Action for U.S. Appl. No. 16/250,097, dated Nov. 18, 2019, 11 pages.

Notice of Allowance for U.S. Appl. No. 16/250,097, dated Apr. 29, 2020, 06 pages.

Wu, et al., "A Parallel Interleaver Design for IDMA Systems", IEEE, International Conference on Wireless Communications & Signal Processing, Dec. 31, 2009, 05 pages.

Luo, et al., "IDMA-Based Cooperative Partial Packet Recovery: Principles and Applications", EURASIP, Journal on Wireless Communications and Networking, 2012, 14 pages.

* cited by examiner

APPARATUS FOR TRANSMITTING DATA IN INTERLEAVE DIVISION MULTIPLE ACCESS (IDMA) SYSTEM

CROSS REFERENCE TO RELATED APPLICATIONS

The present disclosure is a continuation of U.S. patent application Ser. No. 16/250,097 filed in USPTO on Jan. 17, 2019 which is a continuation of U.S. patent application Ser. No. 15/519,862 filed in USPTO on Apr. 18, 2017 which is a U.S. National Phase of International Patent Application No. PCT/JP2015/070650 filed on Jul. 21, 2015, which claims the benefit of priority from prior Japanese Priority Patent Application JP 2014-218184 filed in the Japan Patent Office on Oct. 27, 2014. The above-referenced applications are hereby incorporated herein by reference in its entirety.

TECHNICAL FIELD

The present invention relates to an apparatus.

BACKGROUND ART

The number of users in cellular systems has significantly increased. Accordingly, systems of 5th Generation have been increasingly demanded. Shifting from 4th Generation to 5th Generation demands some breakthroughs (e.g., improvement of both spectral efficiency and energy efficiency, and advanced radio frequency domain processing).

From the viewpoint of an improvement in spectrum efficiency, a multiple access technology (MAT) is one of the important elements. As multiple access technologies, interleave division multiple access (IDMA), filter bank multicarrier (IDMA), filter bank multicarrier (FBM), and non-orthogonal multiple access (NOMA), and the like can be considered. In particular, in IDMA systems, interleavers can distinguish different users from each other and efficiently remove interference between the users. Accordingly, design of interleavers is one of the most important elements in an IDMA system. Each user uses an interleaver unique to the user. As an interleaver becomes longer, correlation with an interleaver of a different user becomes lower, data of the different user can be detected more easily, and performance of a bit error rate (BER)/block error rate (BLER) becomes more preferable.

For example, Non-Patent Literatures 1 to 5 have proposed interleavers for IDMA systems. Specifically, Non-Patent Literature 1 proposes a pseudo-random interleaver (PRI), Non-Patent Literature 2 proposes a power interleaver (PI), Non-Patent Literature 3 proposes a helical interleaver (HI), Non-Patent Literature 4 proposes a deterministic interleaver (DI), and Non-Patent Literature 5 proposes a linear congruential interleaver (LCI).

CITATION LIST

Non-Patent Literature

Non-Patent Literature 1: Ioachim Pupeza, Aleksandar Kavicic and Li Ping, Efficient Generation of Interleavers for IDMA, Communications, 2006. ICC' 06. IEEE International Conference, vol. 4, June 2006, pp. 1508 to 1513

Non-Patent Literature 2: H. Wu, L. Ping and A. Perotti, User-specific chip-level interleaver design for IDMA systems, Electronics Letters, Vol. 42, Issue 4, February 2006, pp. 233 to 234

Non-Patent Literature 3: Dapeng Hao and Peter Adam Hoecher, Helical Interleaver Set Design for Interleave-Division Multiplexing and Related Techniques, Communications Letters, IEEE, vol. 12, Issue 11, November 2008, pp. 843-845

Non-Patent Literature 4: Shu-Ming TSENG, IDMA based on Deterministic Interleavers, Int. J. Communications, Network and System Sciences, March 2010, pp. 94 to 97

Non-Patent Literature 5: Tao Peng, Xiao-xin Yi, Kun Xu, and Lin-feng Hu, Linear Congruential Interleavers Design for IDMA System, IEEE ICCT 2011, September 2011.

DISCLOSURE OF INVENTION

Technical Problem

However, for example, when an existing interleaver such as an interleaver proposed in each of Non-Patent Literatures 1 to 5 or a random interleaver (RI) is used, a burden on a terminal apparatus and a system increases or flexibility of data transmission is lowered.

For example, when an RI is used, it is necessary for a transmitter to transmit an interleaver to a receiver. Therefore, a large memory is necessary in the transmitter and an additional radio resource is necessary in order for the transmitter to transmit the interleaver to the receiver. That is, a burden on the transmitter and the system increases. In particular, when the number of users increases, data (interleavers) to be transmitted increases. As a result, memory shortage and delay or the like can occur. Also, even when the PRI proposed in Non-Patent Literature 1, the PI proposed in Non-Patent Literature 2, or the HI proposed in Non-Patent Literature 3 is used, it is necessary for a transmitter to transmit an initial interleaver generated at random to a receiver. Therefore, even when the PRI, the PI, or the HI is used, there is a concern of the same problems occurring.

For example, when the DI proposed in Non-Patent Literature 4 or the LCI proposed in Non-Patent Literature 5 is used, an interleaver can be generated in each of a transmitter and a receiver and it is not necessary for the transmitter to transmit the interleaver to the receiver. However, a bit sequence necessarily has a length of a power of two. Therefore, flexibility of data transmission is lowered.

Accordingly, it is desirable to provide a structure that makes it possible to transmit data more flexibly and with a lesser burden in an IDMA system.

Solution to Problem

According to the present disclosure, there is provided an apparatus including: an acquisition unit configured to acquire an information block generated from transmission data for a user and subjected to error correction coding; and an interleaving unit configured to interleave a bit sequence of the information block using an interleaver unique to the user. The interleaving unit interleaves the bit sequence by interleaving each of two or more partial sequences obtained from the bit sequence.

Further, according to the present disclosure, there is provided an apparatus including: an acquisition unit configured to acquire a received bit sequence; and a de-interleaving unit configured to generate a bit sequence of an information block not subjected to error correction decoding by de-interleaving the received bit sequence using a de-interleaver corresponding to an interleaver unique to a user. The de-interleaving unit de-interleaves the received bit sequence by de-interleaving each of two or more partial sequences obtained from the received bit sequence.

Further, according to the present disclosure, there is provided an apparatus including: an acquisition unit configured to acquire an information block generated from transmission data for a user and subjected to error correction coding; and an interleaving unit configured to interleave a bit sequence using an interleaver unique to the user or another interleaver obtained from the interleaver unique to the user and longer than the bit sequence of the information block.

Further, according to the present disclosure, there is provided an apparatus including: an acquisition unit configured to acquire a received bit sequence; and a de-interleaving unit configured to generate a bit sequence of an information block not subjected to error correction decoding by de-interleaving the received bit sequence using a de-interleaver corresponding to another interleaver obtained from an interleaver longer than the received bit sequence and unique to a user.

Further, according to the present disclosure, there is provided an apparatus including: an acquisition unit configured to acquire an information block generated from transmission data for a user; and an interleaving unit configured to interleave a bit sequence of the information block using an interleaver unique to the user. The information block is a block after segmentation for error correction coding and the error correction coding and before integration after the error correction coding.

Further, according to the disclosure, there is provided an apparatus including: an acquisition unit configured to acquire a received bit sequence; and a de-interleaving unit configured to generate a bit sequence of an information block by de-interleaving the received bit sequence using a de-interleaver corresponding to an interleaver unique to a user. The information block is a block after segmentation for error correction decoding and before the error correction decoding.

Advantageous Effects of Invention

According to the present disclosure described above, it is possible to transmit data more flexibly and with a lesser burden in an IDMA system. Note that the effects described above are not necessarily limited, and along with or instead of the effects, any effect that is desired to be introduced in the present specification or other effects that can be expected from the present specification may be exhibited.

MODE(S) FOR CARRYING OUT THE INVENTION

Figure 1:
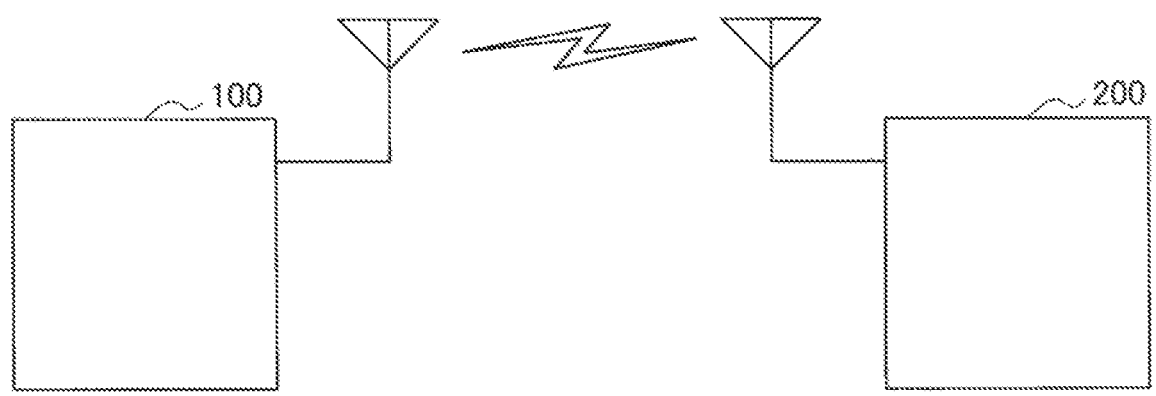
FIG. 1 is an explanatory diagram illustrating an example of a schematic configuration of a system according to an embodiment.

Hereinafter, (a) preferred embodiment(s) of the present disclosure will be described in detail with reference to the appended drawings. In this specification and the appended drawings, structural elements that have substantially the same function and structure are denoted with the same reference numerals, and repeated explanation of these structural elements is omitted.

Further, in the present specification and the drawings, elements of the same names are distinguished from each other by suffixing different alphabetic letters to the same reference numerals in some cases. For example, a plurality of elements having the same names such as partial sequences 13A, 13B, and 13C are distinguished from each other, as necessary. However, when it is not necessary to distinguish a plurality of elements having the same names from each other, only the same reference numerals are given. For example, when it is not particularly necessary to distinguish the partial sequences 13A, 13B, and 13C from each other, the partial sequences 13A, 13B, and 13C are simply referred to as the partial sequences 13.

Also, the description will be made in the following order.
1. Examples of interleavers which can be generated by transmitter and receiver
2. Schematic configuration of system
3. Configuration of each apparatus
3.1. Configuration of first radio communication apparatus
3.2. Configuration of second radio communication apparatus
4. First Embodiment
4.1. Overview
4.2. Example of interleaving
4.3. Technical features
5. Second Embodiment
5.1. Overview
5.2. First technique of interleaving
5.3. Second technique of interleaving
5.4. Variations of interleaving
5.5. Technical features
6. Third Embodiment
6.1. Overview
6.2. Example of interleaving
6.3. Technical features
7. Fourth Embodiment
7.1. Overview
7.2. Example of interleaving
7.3. Technical features
8. Fifth Embodiment
8.1. Overview
8.2. Technical features
9. Application examples
10. Conclusion

1. Examples of Interleavers Which Can Be Generated by Transmitter and Receiver For example, as examples of interleavers which can be generated by a transmitter and a receiver, there are a DI and an LCI. In other words, the interleavers are interleavers which can be generated based on a calculation equation.

(1) Deterministic Interleaver (DI)
The DI is expressed by the following equation.

$$I(m)=((2k+1)m(m+1)/2) \bmod N \quad \text{[Math. 1]}$$

Here, k is a user ID. The user ID may be a radio network temporary identifier (RNTI). Further, m is a bit index of a bit in an input bit sequence. N is the length of an interleaver. In other words, N is the length of the input bit sequence (that is, a total number of bits). I(m) is a value of an interleaver in regard to a bit of which a bit index is m. That is, a bit of which a bit index is m in an input bit sequence is output as a bit of which a bit index is I(m) in an output bit sequence.

As described above, a DI can be generated based on a user ID(k) and the length of an interleaver (the length of an input bit sequence).

In the DI, N which is the length of an interleaver (the length of an input bit sequence) is obtained as a power of two. When N is not a power of two, values of interleavers can be the same for two or more bits with different bit indexes in an input bit sequence. That is, I(a) and I(b) can be the same for mutually different a and b. As a result, performance of BER/BLER can deteriorate.

Also, in a DI, I(0)=0 is established for any k and any N. That is, irrespective of a user and the length of an input bit sequence, the first bit in the input bit sequence is output as the first bit in an output bit sequence.

(2) Linear Congruential Interleaver (LCI)
An LCI is expressed by the following equation.

$$I(m)=(aI(m-1)+b) \bmod N$$

$$I(0) \in \{0, N-1\} \quad \text{[Math. 2]}$$

N is the length of an interleaver. In other words, N is the length of an input bit sequence (that is, a total number of bits). As a first condition, b and N are relatively prime (that is, the maximum common divisor of b and N is 1). As a second condition, a-1 is an integer multiple of any prime number p. Here, p is a value obtained by dividing N. As a third condition, a-1 is an integer multiple of 4 when N is an integer multiple of 4. I(m) is a value of an interleaver for a bit of which a bit index is m. That is, a bit of which a bit index is m in an input bit sequence is output as a bit of which a bit index is I(m) in an output bit sequence. Also, in the above-described equations, a parameter unique to a user is unnecessary.

In an LCI, as in a DI, N which is the length of an interleaver (the length of an input bit sequence) is obtained as a power of two.

2. Schematic Configuration of System

A schematic configuration of a system 1 according to an embodiment of the present disclosure will be described with reference to FIG. 1. FIG. 1 is an explanatory diagram illustrating an example of a schematic configuration of a system 1 according to an embodiment. Referring to FIG. 1, the system 1 includes a first radio communication apparatus 100 and a second radio communication apparatus 200. The system 1 is a system to which IDMA is applied.

The first radio communication apparatus 100 performs radio communication with other radio communication apparatuses. The second radio communication apparatus 200 performs radio communication with other radio communication apparatuses.

For example, the first radio communication apparatus 100 transmits a signal to the second radio communication apparatus 200. Then, the second radio communication apparatus 200 receives the signal. For example, the second radio communication apparatus 200 transmits a signal to the first radio communication apparatus 100. Then, the first radio communication apparatus 100 receives the signal.

One of the first radio communication apparatus 100 and the second radio communication apparatus 200 may be a base station and the other of the first radio communication apparatus 100 and the second radio communication apparatus 200 may be a terminal apparatus which can communicate with a base station. The base station may be a base station of a cellular system.

3. Configuration of Each Apparatus

Next, an example of a configuration of each apparatus according to the embodiment of the present disclosure will be described with reference to FIGS. 2 to 7.

<3.1. Configuration of First Radio Communication Apparatus>

Figure 2:
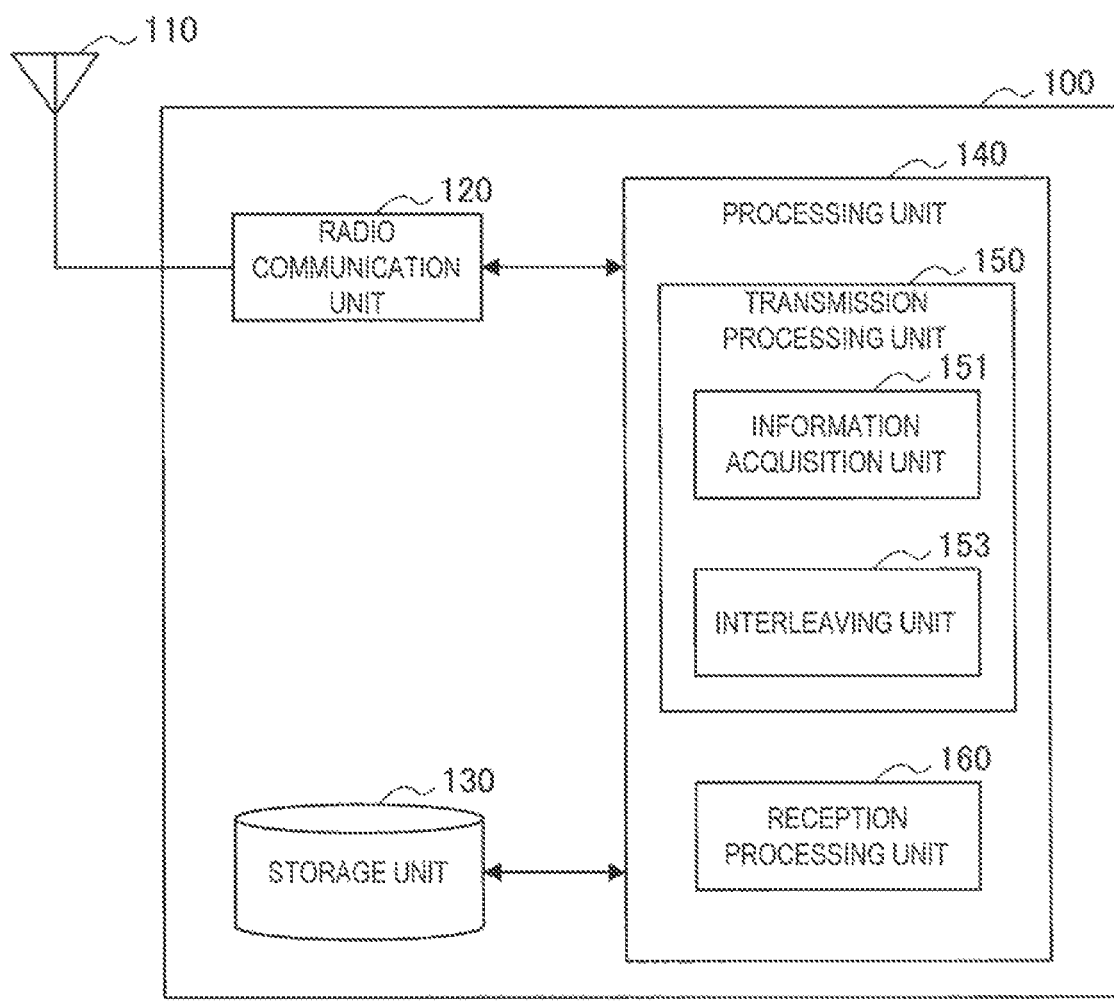
FIG. 2 is a block diagram illustrating an example of a configuration of a first radio communication apparatus according to the embodiment.

First, an example of a configuration of the first radio communication apparatus 100 according to the embodiment of the present disclosure will be described with reference to FIGS. 2 to 4. FIG. 2 is a block diagram illustrating an example of a configuration of the first radio communication apparatus 100 according to the embodiment of the present disclosure. Referring to FIG. 2, the first radio communication apparatus 100 includes an antenna unit 110, a radio communication unit 120, a storage unit 130, and a processing unit 140.

(1) Antenna Unit 110

The antenna unit 110 radiates a signal output by the radio communication unit 120 as radio waves to a space. Further, the antenna unit 110 converts radio waves of a space into a signal and outputs the signal to the radio communication unit 120.

(2) Radio Communication Unit 120

The radio communication unit 120 transmits or receives a signal. For example, the radio communication unit 120 transmits a signal to another apparatus and receives a signal from another apparatus.

(3) Storage Unit 130

The storage unit 130 temporarily or permanently stores a program and data for operating the first radio communication apparatus 100.

(4) Processing Unit 140

The processing unit 140 provides various functions of the first radio communication apparatus 100. The processing unit 140 includes a transmission processing unit 150 and a reception processing unit 160. Also, the processing unit 140 may further include other constituent elements other than these constituent elements. That is, the processing unit 140 can also perform operations other than operations of these constituent elements.

(5) Transmission Processing Unit 150

The transmission processing unit 150 performs a transmission process of transmitting transmission data for a user. The transmission processing unit 150 includes an information acquisition unit 151 and an interleaving unit 153.

(a) Transmission Data

The first radio communication apparatus 100 may be a base station and the transmission data may be transmission data destined for the user. Alternatively, the first radio communication apparatus 100 may be a terminal apparatus of the user and the transmission data may be transmission data from the user.

(b) Example of Transmission Process

Figure 3:
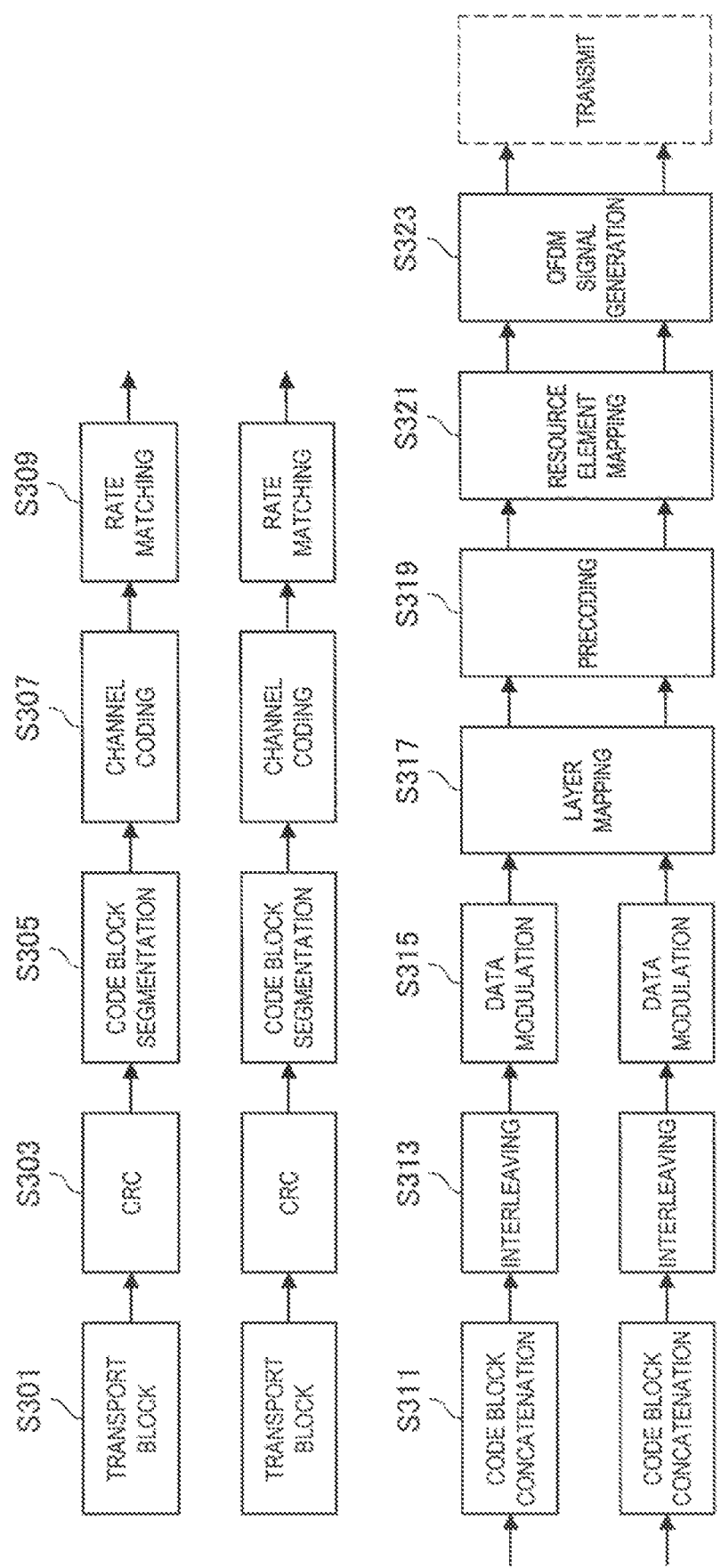
FIG. 3 is an explanatory diagram illustrating an example of a transmission process of the first radio communication apparatus.

FIG. 3 is an explanatory diagram illustrating an example of a transmission process of the first radio communication apparatus 100. The transmission process is a process of a physical layer when IDMA is applied to a long term evolution (LTE) system.

S301: Generation of Transport Block (TB)

In a physical layer defined in LTE, a transport block (TB) is transmitted through a transmission chain. According to a size of a source, the maximum number of TBs transmitted with a physical downlink shared channel (PDSCH) is calculated in advance. In LTE, a maximum of two transport blocks can be transmitted simultaneously. When the number of transport blocks is obtained, a bit sequence of the transport blocks is generated.

S303: Cyclic Redundancy Check (CRC)

In LTE, CRC is used to perform error checking (that is, determine whether data has been correctly transmitted). The CRC is added to a generated transport block.

S305: Code Block Segmentation

For example, an error correction code is used as channel coding. Specifically, for example, turbo coding is used. Since a bit sequence which has the longest length imported to a turbo encoder is limited to 6144 bits, a bit sequence exceeding 6144 bits is segmented into several code blocks (CBs). After the bit sequence is segmented, a CRC is added to each CB.

In the CB segmentation, there are two criterions. A first criterion is that the CB is not greater than 6144 bits. A second criterion is that the number of CBs is as small as possible.

Also, according to execution of the turbo coding, BER/BLER is calculated based on the CBs.

S307: Channel Coding

Error correction coding is performed as channel coding. In LTE, the channel coding differs according to a channel.

In a process on a downlink shared channel (DL-SCH) and an uplink shared channel (UL-SCH), the turbo coding is used as the channel coding. A turbo code is also referred to as a parallel concatenated convolution code (PCCC). A turbo encoder mainly includes two encoders and one interleaver. An input bit sequence is input directly through a first encoder. Further, the input bit sequence is input to a second encoder after passing through the interleaver. The turbo encoder outputs a systematic bit sequence and two parity bit sequences respectively encoded by the first and second encoders. The interleaver disposed before the second encoder plays an important role in performance of the turbo coding. In LTE, quadratic permutation polynomials (QPP) are defined for the turbo coding.

Also, for example, a tail biting convolution code is used in a process on a broadcast channel (BCH).

S309: Rate Matching

In rate matching, the lengths of three bit sequences to be output are adjusted and sets of bits to be transmitted are extracted.

The rate matching includes subblock interleaving, bit collection, and bit selection. In the subblock interleaving, a systematic bit sequence and two parity bit sequences are each randomized. In the bit collection, the three sequences are concatenated. In the bit collection, consecutive bits are extracted from a buffer.

S311: Code Block Concatenation

As described above, for example, a bit sequence exceeding 6144 bits is segmented into several code blocks (CBs). When the bit sequence is segmented, the CBs after the coding and the rate matching are concatenated.

An output of CB concatenation is referred to as a codeword. Also, when the CB segmentation and the CB concatenation are not performed, an output of the rate matching is a codeword.

S313: Interleaving

In particular, in the embodiment of the present disclosure, the codeword is interleaved by an interleaver unique to a user. The interleaver may be unique to a cell, a codeword (or a transport block), and/or a link direction (that is, a downlink or an uplink).

Also, not the interleaver but a scrambler is used for, for example, a system to which orthogonal frequency-division multiple access (OFDMA) or a code division multiple access (CDMA) is applied.

S315: Modulation

In LTE, binary phase shift keying (BPSK), quadrature phase-shift keying (QPSK), 16 quadrature amplitude modulation (16QAM), and 64 quadrature amplitude modulation (64QAM) are supported as modulation schemes. Further, in LTE, a modulation scheme is selected according to a channel quality indicator (COI).

S317: Layer Mapping

After the modulation, a symbol is mapped to another layer. In LTE, a codeword is mapped to a maximum of four layers.

S319: Precoding

To maximize a system throughput in a MIMO system, precoding is necessary according to a transmission mode. The transmission mode is set in open loop spatial multiplexing (OSLM).

S321: Resource Element Mapping

After precoding, a data sequence is mapped to radio resources in each channel. In LTE, a resource element (RE) and a resource block (RB) are defined as radio resources.

Each radio frame includes ten subframes which is 10 ms, each of which is 1 ms. Each subframe includes two slots, each of which is 0.5 ms. Each slot includes six or seven symbols. One RE is a radio resource of one symbol and one subcarrier. One RB is a radio resource of one slot and twelve subcarriers (that is, 72 or 84 REs).

S323: OFDM Signal Generation

After the resource element mapping, an OFDM signal is generated. The generation of the OFDM signal includes insertion of inverse fast Fourier transform (IFFT) and a cyclic prefix (CP).

Also, the generated OFDM signal is converted from a digital signal to an analog signal to be transmitted.

(c) Example of Interleaving

Figure 4:
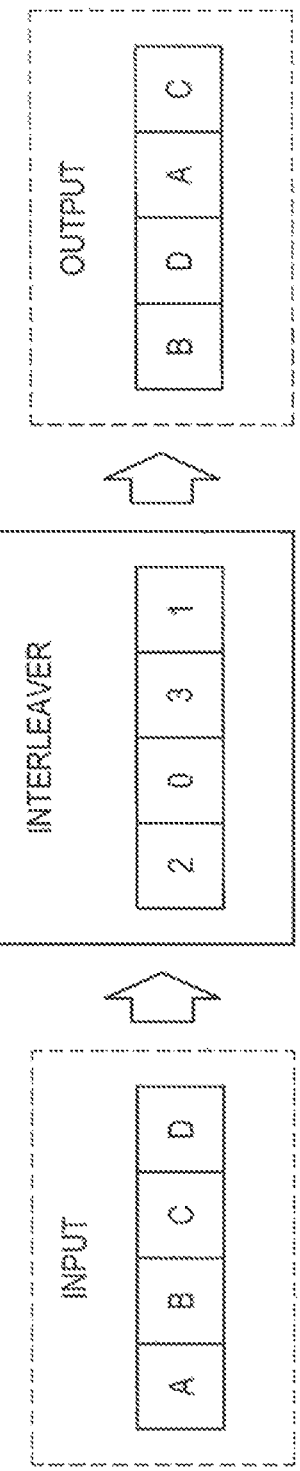
FIG. 4 is an explanatory diagram illustrating a simplified example of interleaving.

FIG. 4 is an explanatory diagram illustrating a simplified example of interleaving. Referring to FIG. 4, an interleaver (2031) which has a length of 4 bits is illustrated. For example, when a bit sequence ABCD is input to the interleaver, the bit sequence is interleaved and a bit sequence BDAC is output.

(d) Operations of Information Acquisition Unit 151 and Interleaving Unit 153 The information acquisition unit 151 acquires an information block generated from transmission data for a user and subjected to the error correction coding and the interleaving unit 153 interleaves a bit sequence of the information block.

For example, the information acquisition unit 151 and the interleaving unit 153 perform the above-described interleaving (S313). That is, the information acquisition unit 151 acquires the codeword generated from the transport block (transmission data) and subjected to the turbo coding (the information block subjected to the error correction coding) and the interleaving unit 153 interleaves the bit sequence of the codeword.

Also, the interleaver used by the interleaving unit 153 may be mounted as hardware (for example, programmable hardware) or may be mounted as software. An interleave pattern of the interleaver may be replaceable.

(6) Reception Processing Unit 160

The reception processing unit 160 performs a reception process of receiving the transmission data for a user.

For example, the reception processing unit 160 performs the same process as a reception processing unit 250 of the second radio communication apparatus 200 to be described below.

<3.2. Configuration of Second Radio Communication Apparatus>

Figure 5:
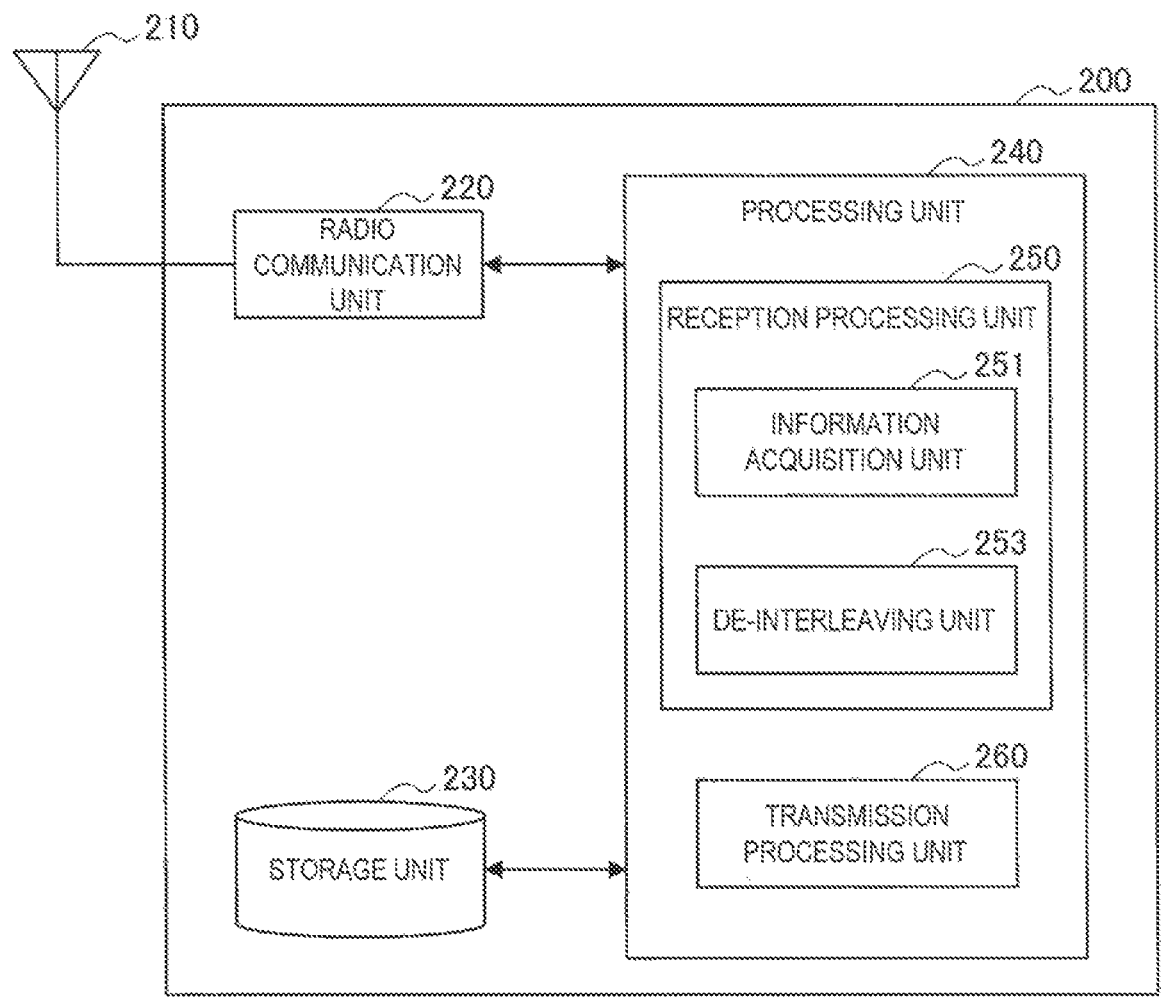
FIG. 5 is a block diagram illustrating an example of a configuration of a second radio communication apparatus according to the embodiment.

Next, an example of a configuration of the second radio communication apparatus 200 according to the embodiment of the present disclosure will be described with reference to FIGS. 5 to 7. FIG. 5 is a block diagram illustrating an example of the configuration of the second radio communication apparatus 200 according to the embodiment of the present disclosure. Referring to FIG. 5, the second radio communication apparatus 200 includes an antenna unit 210, a radio communication unit 220, a storage unit 230, and a processing unit 240.

(1) Antenna Unit 210

The antenna unit 210 radiates a signal output by the radio communication unit 220 as radio waves to a space. Further, the antenna unit 210 converts radio waves of a space into a signal and outputs the signal to the radio communication unit 220.

(2) Radio Communication Unit 220

The radio communication unit 220 transmits or receives a signal. For example, the radio communication unit 220 transmits a signal to another apparatus and receives a signal from another apparatus.

(3) Storage Unit 230

The storage unit 230 temporarily or permanently stores a program and data for operating the second radio communication apparatus 200.

(4) Processing Unit 240

The processing unit 240 provides various functions of the second radio communication apparatus 200. The processing unit 240 includes a reception processing unit 250 and a transmission processing unit 260. Also, the processing unit 240 may further include other constituent elements other than these constituent elements. That is, the processing unit 240 can also perform operations other than operations of these constituent elements.

(5) Reception Processing Unit 250

The reception processing unit 250 performs a reception process of receiving transmission data for a user. The reception processing unit 250 includes an information acquisition unit 251 and a de-interleaving unit 253.

(a) Transmission data

The second radio communication apparatus 200 may be a terminal apparatus of a user and the transmission data may be transmission data destined for the user. Alternatively, the second radio communication apparatus 200 may be a base station and the transmission data may be transmission data from the user.

(b) Example of Reception Process

Figure 6:
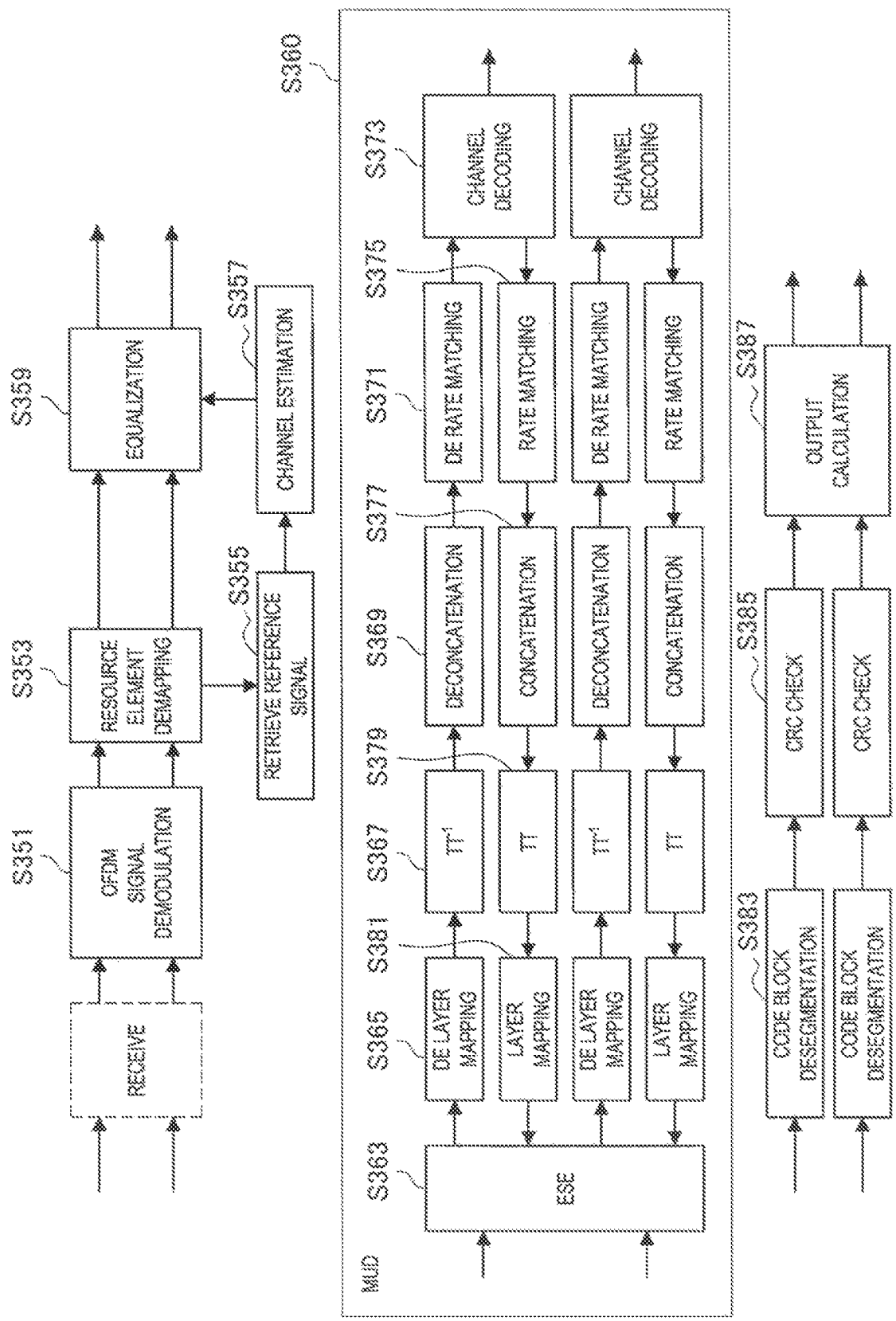
FIG. 6 is an explanatory diagram illustrating an example of a reception process of the second radio communication apparatus.

FIG. 6 is an explanatory diagram illustrating an example of a reception process of the second radio communication apparatus 200. The reception process is a process of a physical layer when IDMA is applied to an LTE system.

S351 to S357

After a signal is received, OFDM signal demodulation (S351) and resource element demapping (S353) are performed. Furthermore, a cell-specific reference signal (CRS) is retrieved (S355) and channel estimation is performed using the CRS (S357).

S359: Equalization

An equalizer corrects distortion of a signal. As the equalizer, there is a linear equalizer or a nonlinear equalizer.

More specifically, as the equalizer, for example, there are zero forcing (ZF) equalizer, a minimum mean square error (MMSE) equalizer, and a soft sphere decoder (SSD) equalizer. Theoretically, the SSD equalizer has more preferable performance of BER/BLER than the other two main equalizers. To obtain lower calculation complexity, a maximum likelihood detection (MLD) is mounted. However, when the degree of modulation and the number of users increase, complexity of MLD considerably increases. To remedy the increase in the complexity, SSD equalization is performed in a certain area instead of treating all points inside signal constellation. As a result, the complexity of calculation decreases.

S360: Multi-User Detection (MUD)

In MUD, elementary signal estimator (ESE) (S363), de layer mapping (S365), de-interleaving (S367), de rate matching (S369), deconcatenation (S371), and channel decoding (S373) are performed. In the de-interleaving (S367), an opposite operation to interleaving on a transmission side is performed. The channel decoding is, for example, error correction decoding. Specifically, the channel decoding is, for example, turbo decoding.

Furthermore, in MUD, a feedback architecture is designed. Specifically, after the channel decoding (S373), a sequence is processed similarly to the transmission side (S375 to S381). For example, interleaving is performed (S379). In the interleaving, the same interleaver as the interleaver on the transmission side is used.

In MUD, detection can be performed in parallel for all the users in order to detect signals from different users. That is, bit sequences of the users can be detected simultaneously.

Also, when the second radio communication apparatus 200 is not a base station but a terminal apparatus (that is, a user), a process of detecting a single user may be performed rather than MUD.

S383 to S387

Code block desegmentation (S383) and CRC checking (S385) are performed on the decoded code block. Then, the transport block is output (S387).

(c) Example of De-Interleaving

Figure 7:
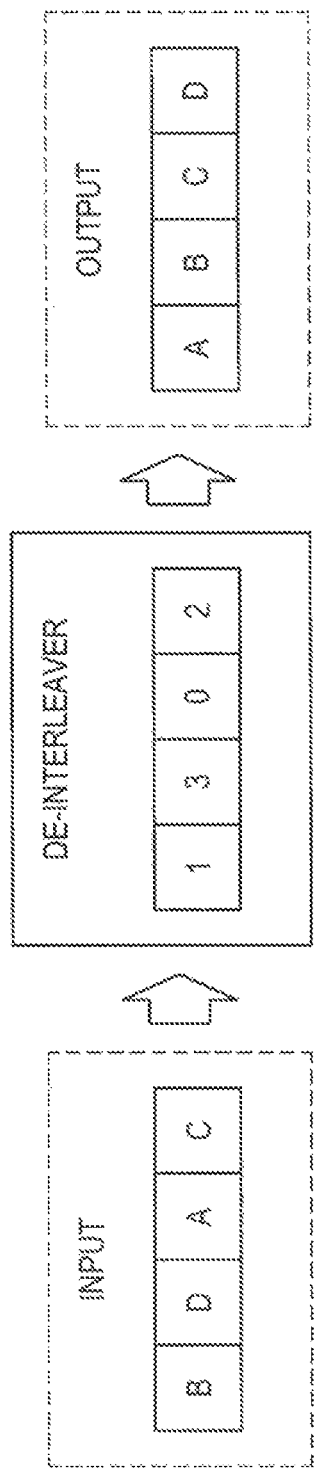
FIG. 7 is an explanatory diagram illustrating a simplified example of de-interleaving.

FIG. 7 is an explanatory diagram illustrating a simplified example of de-interleaving. Referring to FIG. 7, a de-interleaver (1302) which has a length of 4 bits is illustrated. For example, when a bit sequence BDAC is input to the de-interleaver, the bit sequence is interleaved and a bit sequence ABCD is output.

(d) Operations of Information Acquisition Unit 251 and De-Interleaving Unit 253

The information acquisition unit 251 acquires a received bit sequence and the de-interleaving unit 253 de-interleaves the received bit sequence to generate the bit sequence of the information block not subjected to the error correction decoding.

For example, the information acquisition unit 251 and the de-interleaving unit 253 perform the above-described de-interleaving (S367). That is, the information acquisition unit 251 acquires a received bit sequence after the ESE and de layer mapping. Then, the de-interleaving unit 253 generates the bit sequence of the codeword before the turbo decoding (the bit sequence of the information block not subjected to the error correction decoding) by de-interleaving the received data sequence.

Also, the de-interleaver used by the de-interleaving unit 253 may be mounted as hardware (for example, programmable hardware) or may be mounted as software. A de-interleave pattern of the de-interleaver may be replaceable.

(6) Transmission Processing Unit 260

The transmission processing unit 260 performs a transmission process of transmitting transmission data for a user.

For example, the transmission processing unit 260 performs the same process as the transmission processing unit 150 of the first radio communication apparatus 100 described above.

4. First Embodiment

Next, a first embodiment of the present disclosure will be described with reference to FIGS. 8 to 11.

<4.1. Overview>

(1) Technical Problem

As interleavers for an IDMA system, RI, PRI, PI, HI, DI, LCI, and the like have been proposed.

However, for example, when such an existing interleaver is used in an IDMA system, a burden on a terminal apparatus and a system increases or flexibility of data transmission is lowered.

For example, when RI is used, a transmitter necessarily transmits an interleaver to a receiver. Therefore, a large memory is necessary in the transmitter. Additional radio resources are necessary in order for the transmitter to transmit an interleaver to the receiver. That is, a burden on the transmitter and the system increases. In particular, when the number of users increases, data (interleavers) to be transmitted increases. As a result, memory shortage and delay or the like can occur. Also, even when the PI proposed in Non-Patent Literature 2 or the HI proposed in Non-Patent Literature 3 is used, it is necessary for a transmitter to transmit an initial interleaver generated at random to the receiver. Therefore, even when the PRI, the PI, or the HI is used, there is a concern of the same problems occurring.

For example, when the DI or the LCI is used, an interleaver can be generated in each of the transmitter and the receiver and it is not necessary for the transmitter to transmit the interleaver to the receiver. However, a bit sequence necessarily has a length of a power of two. Therefore, flexibility of data transmission is lowered.

Accordingly, it is desirable to provide a structure that makes it possible to transmit data more flexibly and with a lesser burden in an IDMA system. More specifically, for example, in the IDMA system, it is desirable to provide a structure that makes it possible to transmit a bit sequence which has any length without transmitting and receiving interleavers between a transmission side and a reception side.

(2) Technical Means

In the first embodiment, the information acquisition unit 151 acquires an information block after error correction coding generated from transmission data for a user. The interleaving unit 153 interleaves a bit sequence of the information block using an interleaver unique to the user. In particular, the interleaving unit 153 interleaves the bit sequence by interleaving each of two or more partial sequences obtained from the bit sequence.

Furthermore, in the first embodiment, each of the two or more partial sequences is included in the bit sequence and does not overlap the other of the two or more partial sequences.

Thus, for example, it is possible to transmit data more flexibly and with a lesser burden in an IDMA system. More specifically, for example, a bit sequence which has any length can be transmitted without transmitting and receiving an interleaver between the transmission side and the reception side in the IDMA system.

<4.2. Example of Interleaving>

Next, an example of interleaving according to the first embodiment will be described with reference to FIGS. 8 to 11.

(1) Partial Sequence and Interleaver

Any positive integer N can be expressed as a sum of powers of two as follows.

$$N = \sum_{i=0}^{k} a_i 2^i, \quad a_i \in \{0, 1\} \quad \text{[Math. 3]}$$

Accordingly, even when a length M of a bit sequence of an information block (for example, a codeword) is not a length of a power of two, the length M can be expressed as a sum of lengths of powers of two. In other words, the bit sequence can be divided into two or more partial sequences that each have a length of a power of two.

Accordingly, it is possible to generate an interleaver which is unique to a user and has the same length as the length of each partial sequence. For example, the interleaver is a DI. Hereinafter, a specific example will be described with reference to FIG. 8.

Figure 8:
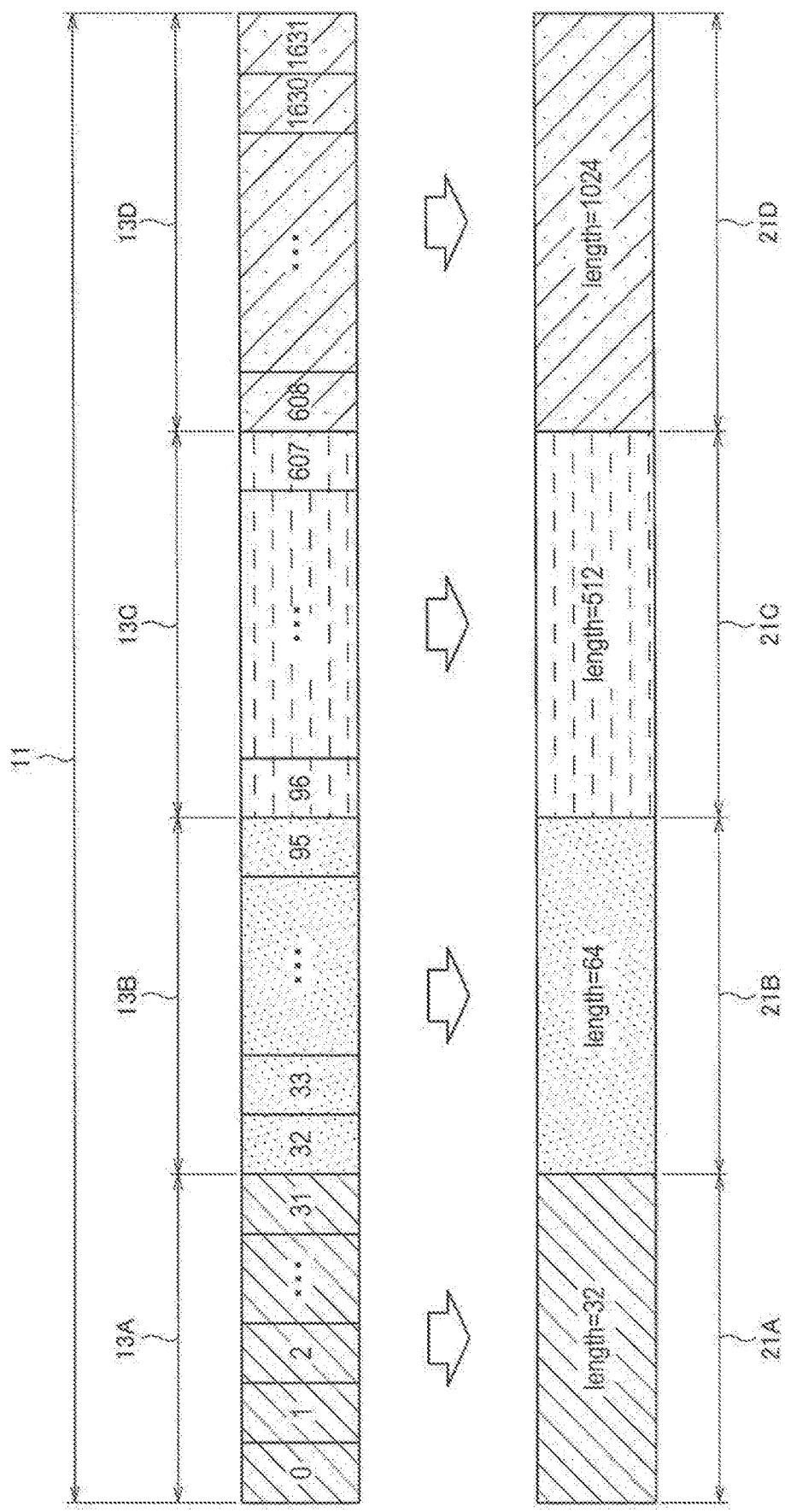
FIG. 8 is an explanatory diagram illustrating partial sequences and examples of interleavers corresponding to the partial sequences according to a first embodiment.

FIG. 8 is an explanatory diagram illustrating partial sequences and examples of interleavers corresponding to the partial sequences according to the first embodiment. Referring to FIG. 8, a bit sequence 11 with 1632 bits is illustrated. Here, 1632 is expressed as 1024+512+64+32. Accordingly, the bit sequence 11 can be divided into a partial sequence 13A with 32 ($=2^5$) bits, a partial sequence 13B with 64 ($=2^6$) bits, a partial sequence 13C with 512 ($=2^9$) bits, and a partial sequence 13D with 1024 ($=2^{10}$) bits. Therefore, interleavers 21 corresponding the partial sequences 13 (that is, interleavers which are unique to users and have the same lengths as the lengths of the partial sequences 13) can be generated. Specifically, interleavers 21A, 21B, 21C, and 21D respectively corresponding to the partial sequences 13A, 13B, 13C, and 13D can be generated. For example, the interleaver 21 is a DI.

Also, one concatenated interleaver that includes the interleaver corresponding to each of the two or more partial sequences (interleavers that are unique to users and have the same lengths as the lengths of the partial sequences) and has the same length as the length of the bit sequence may be generated. When the interleaver corresponding to each partial sequence is a DI, the one concatenated interleaver may be referred to as a concatenated deterministic interleaver (CDI). Hereinafter, a specific example will be described with reference to FIG. 9.

Figure 9:
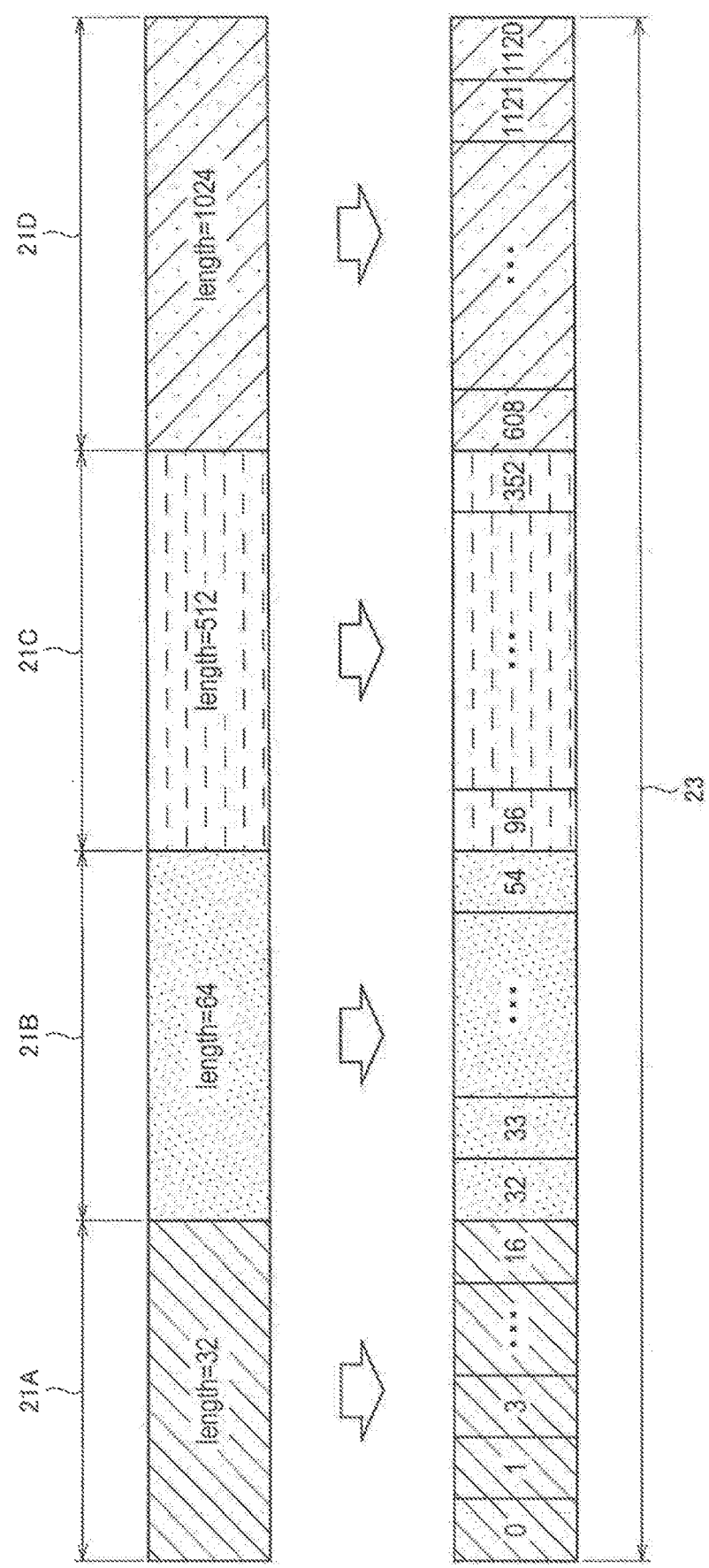
FIG. 9 is an explanatory diagram illustrating an example of a concatenated interleaver according to the first embodiment.

FIG. 9 is an explanatory diagram illustrating an example of a concatenated interleaver according to the first embodiment. Referring to FIG. 9, the interleavers 21A, 21B, 21C, and 21D described with reference to FIG. 8 are illustrated. For example, a concatenated interleaver 23 which has the same length as the length of the bit sequence 11 described with reference to FIG. 8 is generated by changing input bits and output bits of the interleavers 21B, 21C, and 21D through shifting and concatenating the changed interleavers 21A, 21B, 21C, and 21D. For example, the input bits and the output bits of the interleaver 21B are shifted by the length (that is, 32 bits) of the interleaver 21A. For example, the input bits and the output bits of the interleaver 21C are shifted by a sum (that is, 96 bits) of the lengths of the interleavers 21A and 21B. For example, the input bits and the output bits of the interleaver 21D are shifted by a sum (that is, 608 bits) of the lengths of the interleavers 21A, 21B, and 21C. For example, each of the interleavers 21A, 21B, 21C, and 21D is a DI and the concatenated interleaver 23 is a Ca (2) Interleaving For example, the interleaving unit 153 interleaves each of the two or more partial sequences using the corresponding interleaver.

(a) First Example

As a first example, the interleaving unit 153 acquires a partial sequence in regard to each of two or more bit sequences included in a bit sequence and interleaves the partial sequence using an interleaver corresponding to the partial sequence. Then, the interleaving unit 153 concatenates the interleaved two or more partial sequences.

(a-1) Specific Example

Referring back to FIG. 8, the interleaving unit 153 acquires the partial sequence 13A and interleaves the partial sequence 13A using the interleaver 21A corresponding to the partial sequence 13A. Similarly, the interleaving unit 153 interleaves the partial sequences 13B, 13C, and 13D. Then, the interleaving unit 153 concatenates the interleaved partial sequences 13A, 13B, 13C, and 13D.

(a-2) Flow of Process

Figure 10:
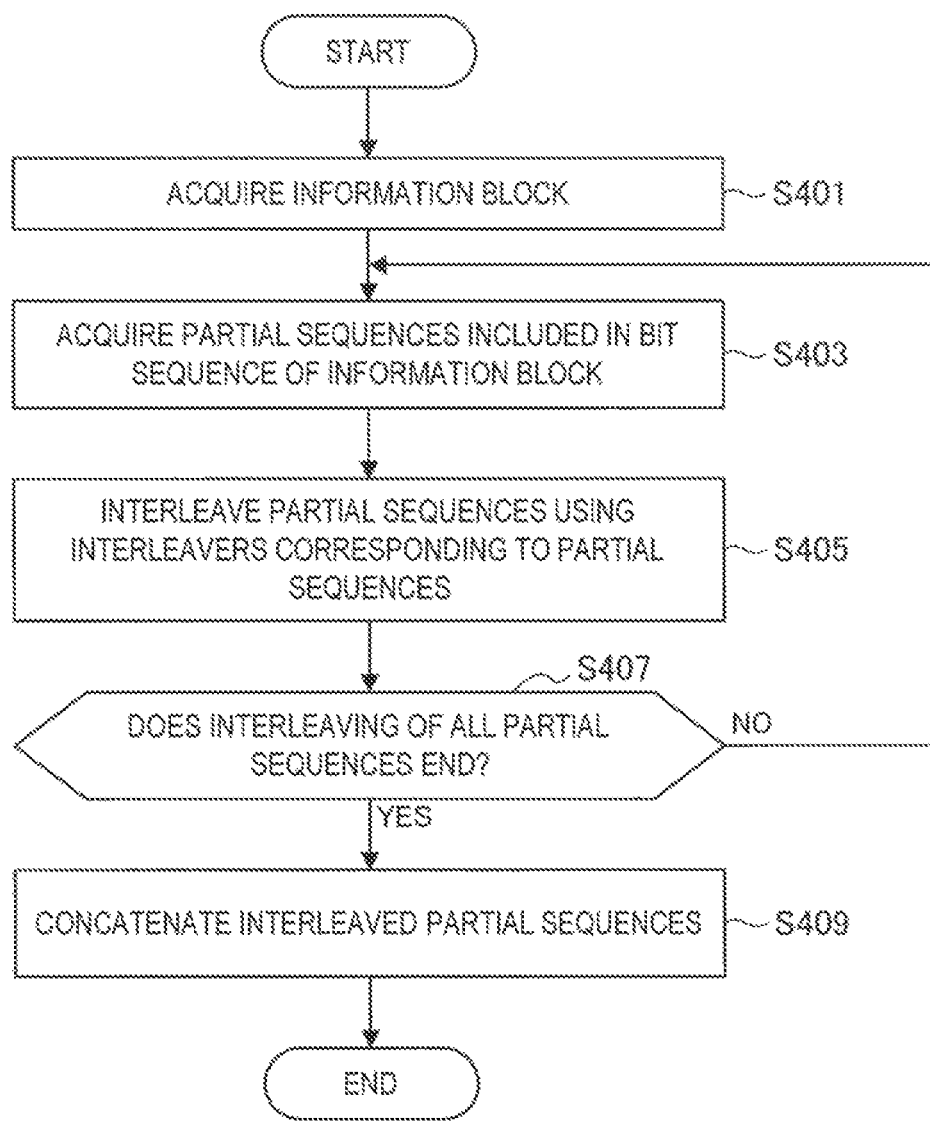
FIG. 10 is a flowchart illustrating a first example of a schematic flow of a process according to the first embodiment.

FIG. 10 is a flowchart illustrating a first example of a schematic flow of a process according to the first embodiment.

The information acquisition unit 151 acquires the information block (for example, a codeword) generated from the transmission data (for example, a transport block) for a user and subjected to the error correction coding (S401).

The interleaving unit 153 acquires the partial sequences included in the bit sequence of the information block (S403). The partial sequence has a length of a power of two.

The interleaving unit 153 interleaves the partial sequences using the interleavers corresponding to the partial sequences (S405). The interleavers have the same lengths as the lengths of the partial sequences. The interleavers are interleavers (for example, DIs) unique to the users.

When the interleaving on all the partial sequences included in the bit sequence ends (YES in S407), the interleaving unit 153 concatenates the interleaved partial sequences (S409). Then, the process ends.

When the interleaving on any one of the partial sequences included in the bit sequence does not end (NO in S407), the process returns to step S403.

Also, of course, the interleaving of two or more partial sequences may be performed in parallel.

(b) Second Example

As a second example, the interleaving unit 153 interleaves the bit sequence using one concatenated interleaver including an interleaver corresponding to each of two or more bit sequences included in a bit sequence.

(b-1) Specific Example

Referring back to FIGS. 8 and 9, the interleaving unit 153 may interleave the bit sequence 11 using one concatenated interleaver 23 including the interleavers 21A, 21B, 21C, and 21D corresponding to the partial sequences 13A, 13B, 13C, and 13D included in the bit sequence 11.

Also, the concatenated interleaver includes interleavers corresponding to partial sequences. Therefore, the second example is also the same as the first example in that the partial sequences are interleaved using the interleavers corresponding to the partial sequences.

(b-2) Flow of Process

Figure 11:
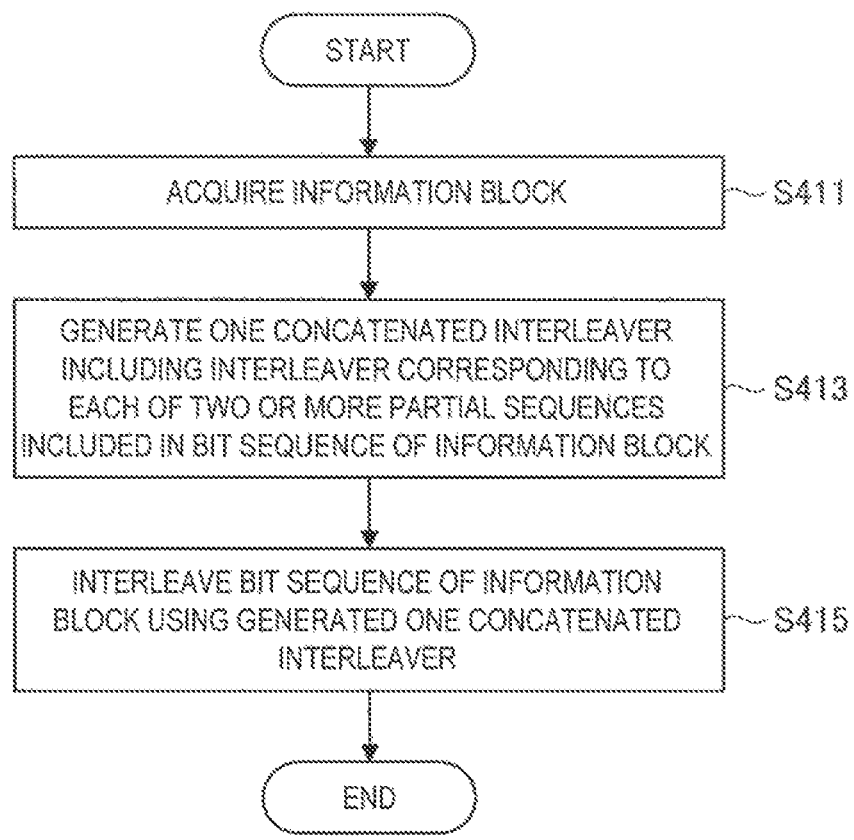
FIG. 11 is a flowchart illustrating a second example of the schematic flow of a process according to the first embodiment.

FIG. 11 is a flowchart illustrating a second example of the schematic flow of a process according to the first embodiment.

The information acquisition unit 151 acquires the information block (for example, a codeword) generated from the transmission data (for example, a transport block) for a user and subjected to the error correction coding (S411).

The interleaving unit 153 generates one concatenated interleaver including the interleaver corresponding to each of two or more partial sequences included in a bit sequence of the information block (S413). The interleavers corresponding to the two or more partial sequences are interleavers (for example, DIs) that have the same lengths as the lengths of the partial sequences and are unique to the users.

The interleaving unit 153 interleaves the bit sequence of the information block using the one concatenated interleaver (S415). Then, the process ends.

(3) De-Interleaving

Also, the second radio communication apparatus 200 performs de-interleaving corresponding to the above-described interleaving in the first radio communication apparatus 100.

Referring back to FIG. 8, for example, the de-interleaving unit 253 de-interleaves the partial sequences obtained from the received bit sequence using de-interleavers corresponding to the interleavers 21A, 21B, 21C, and 21D. As a result, the bit sequence 11 including the partial sequences 13A, 13B, 13C, and 13D can be obtained.

Referring back to FIGS. 8 and 9, the de-interleaving unit 253 may de-interleave the received bit sequence using the de-interleavers corresponding to the concatenated interleaver 23. As a result, the bit sequence 11 may be obtained. Also, the de-interleaver corresponding to the concatenated interleaver 23 includes the de-interleavers corresponding to the interleavers 21A, 21B, 21C, and 21D. Therefore, this example is also substantially the same as the above-described example.

<4.3. Technical Features>

(1) Interleaving

As described above, in the first embodiment, the information acquisition unit 151 acquires the information block generated from the transmission data for the user and subjected to the error correction coding. The interleaving unit 153 interleaves the bit sequence of the information block using the interleaver unique to the user. In particular, the interleaving unit 153 interleaves the bit sequence by interleaving two or more partial sequences obtained from the bit sequence.

Furthermore, in the first embodiment, each of the two or more partial sequences is included in the bit sequence and does not overlap the other of the two or more partial sequences.

(a) Transmission Data

The first radio communication apparatus 100 may also be a base station and the transmission data may also be transmission data destined for the user. Alternatively, the first radio communication apparatus 100 may also be a terminal apparatus of the user and the transmission data may be transmission data from the user.

For example, the transmission data is a transport block.

(b) Information Block.

For example, the information block is a codeword. Alternatively, as in a fourth embodiment to be described below, the information block may also be a code block.

(c) Bit Sequence of Information Block

For example, the bit sequence of the information block has a length which is not a power of two.

Referring back to FIG. 8, for example, the bit sequence is the bit sequence 11 and has a length of 1632 bits.

(d) Partial Sequences

As described above, each of the two or more partial sequences is included in the bit sequence and does not overlap the other of the two or more partial sequences.

For example, the two or more partial sequences each have a length of a power of two. Furthermore, for example, the two or more partial sequences have different lengths. Furthermore, for example, a total sum of the lengths of the two or more partial sequences is equal to the length of the bit sequence.

Referring back to FIG. 8, for example, the two or more partial sequences are the partial sequences 13A, 13B, 13C, and 13D. Each of the partial sequences 13A, 13B, 13C, and 13D is included in the bit sequence 11 and does not overlap the other partial sequences. Furthermore, the partial sequences 13A, 13B, 13C, and 13D each have lengths of powers of two and have different lengths. Furthermore, a total sum of the lengths of the partial sequences 13A, 13B, 13C, and 13D is equal to the length of the bit sequence 11.

(e) Interleaving

For example, the interleaving unit 153 interleaves each of the two or more partial sequences using the corresponding interleaver.

(e-1) Interleaver

For example, the corresponding interleaver is an interleaver which has the same length as the length of the partial sequence and is unique to the user. Furthermore, the corresponding interleaver may be an interleaver unique to the transmission data (for example, a transport block) or the information block (for example, a codeword or a code block).

For example, the corresponding interleaver is an interleaver which can be generated in each of a transmitter and a receiver (in other words, an interleaver which can be generated based on a calculation equation). For example, the corresponding interleaver is a DI. As another example, the corresponding interleaver may be an LCI. Also, the corresponding interleaver is not limited to these examples.

The corresponding interleaver may also be mounted as hardware (for example, programmable hardware) or may also be mounted as software. An interleave pattern of the corresponding interleaver may be replaceable.

(e-2) Specific Example

Referring back to FIG. 8, for example, the interleaving unit 153 interleaves the partial sequence 13A using the interleaver 21A. Similarly, the interleaving unit 153 interleaves the partial sequence 13B using the interleaver 21B, interleaves the partial sequence 13C using the interleaver 21C, and interleaves the partial sequence 13D using the interleaver 21D.

(e-3) Parallel Process

The interleaving unit 153 may interleave the two or more partial sequences in parallel. Thus, the interleaving can be performed more rapidly.

(e-4) Concatenated Interleaver

The interleaving unit 153 may interleave the bit sequence using one concatenated interleaver which includes an interleaver corresponding to each of the two or more partial sequences and has the same length as the length of the bit sequence.

Referring back to FIGS. 8 and 9, the concatenated interleaver 23 includes the interleavers 21A, 21B, 21C, and 21D and has the same length as the length of the bit sequence 11. The interleaving unit 153 may interleave the bit sequence 11 using the concatenated interleaver 23. Also, even in this case, each of the partial sequences 13A, 13B, 13C, and 13D is substantially interleaved using the corresponding interleaver 21.

As described above, the interleaving unit 153 interleaves the bit sequence of the information block. Thus, for example, it is possible to transmit data more flexibly and with a lesser burden in the IDMA system.

More specifically, for example, in the IDMA system, it is possible to transmit a bit sequence which has any length without transmitting and receiving interleavers between a transmission side and a reception side. For example, since the interleaver may not be transmitted and received between the transmitter and the receiver, a large memory is not necessary in the transmitter and additional radio resources are not necessary either. Therefore, it is possible to reduce a burden on the transmitter and the system. Further, since the length of the bit sequence of the information block is not limited to a power of two, it is possible to transmit data more flexibly.

Also, in the first embodiment, since bits included in the bit sequence are interleaved only once, it is possible to shorten an interleaving process.

(2) De-Interleaving

The information acquisition unit 251 acquires a received bit sequence. The de-interleaving unit 253 generates a bit sequence of the information block not subjected to error correction decoding by de-interleaving the received bit sequence using de-interleavers corresponding to interleavers unique to users. In particular, the de-interleaving unit 253 de-interleaves the received bit sequence by de-interleaving two or more partial sequences obtained from the received bit sequence.

Furthermore, in the first embodiment, each of the two or more partial sequences is included in the received bit sequence and does not overlap the other of the two or more partial sequences.

(a) Information Block

For example, the information block is a codeword. Alternatively, as in the fourth embodiment to be described below, the information block may also be a code block.

(b) Received Bit Sequence

For example, the received bit sequence is a sequence received in a subframe. For example, the received bit sequence is a sequence after ESE and de layer mapping. For example, the received bit sequence has a length which is not a power of two.

(c) Partial Sequences

As described above, each of the two or more partial sequences is included in the received bit sequence and does not overlap the other of the two or more partial sequences.

For example, the two or more partial sequences each have a length of a power of two. Furthermore, for example, the two or more partial sequences have different lengths. Furthermore, for example, a total sum of the lengths of the two or more partial sequences is equal to the length of the received bit sequence.

(d) De-Interleaving

For example, the de-interleaving unit 253 de-interleaves each of the two or more partial sequences using the corresponding de-interleaver.

(d-1) De-interleaver

For example, the corresponding de-interleaver is a de-interleaver which has the same length as the length of the partial sequence and corresponds to the interleaver unique to the user.

For example, the interleaver unique to the user is an interleaver which can be generated in each of a transmitter and a receiver (in other words, an interleaver which can be generated based on a calculation equation). For example, the interleaver unique to the user is a DI. As another example, the interleaver unique to the user may be an LCI. Also, the interleaver unique to the user is not limited to the examples.

The corresponding interleaver may also be mounted as hardware (for example, programmable hardware) or may also be mounted as software. A de-interleave pattern of the corresponding de-interleaver may be replaceable.

(d-2) Specific Example

Referring back to FIG. 8, for example, the de-interleaving unit 253 de-interleaves the partial sequences obtained from the received bit sequence using the de-interleavers corresponding to the interleavers 21A, 21B, 21C, and 21D. As a result, the bit sequence 11 including the partial sequences 13A, 13B, 13C, and 13D can be obtained.

(d-3) Parallel Process

The de-interleaving unit 253 may de-interleave the two or more partial sequences in parallel. Thus, the de-interleaving can be performing more rapidly.

(d-4) Concatenated De-Interleaver

The de-interleaving unit 253 may de-interleave the received bit sequence using one concatenated de-interleaver that includes de-interleavers corresponding to the two or more partial sequences and has the same length as the length of the received bit sequence.

Referring back to FIGS. 8 and 9, for example, de-interleaving unit 253 may de-interleave the received bit sequence using a de-interleaver corresponding to the concatenated interleaver 23. As a result, the bit sequence 11 may be obtainable. Also, the de-interleaver corresponding to the concatenated interleaver 23 includes the de-interleavers corresponding to the interleavers 21A, 21B, 21C, and 21D.

5. Second Embodiment

Next, a second embodiment of the present disclosure will be described with reference to FIGS. 12 to 18.

<5.1. Overview>

(1) Technical Problem

A technical problem according to the second embodiment is the same as the technical problem according to the first embodiment. Accordingly, the repeated description thereof will be omitted here.

(2) Technical Means

In the second embodiment, the information acquisition unit 151 acquires an information block generated from transmission data for a user and subjected to error correction coding. The interleaving unit 153 interleaves a bit sequence of the information block using an interleaver unique to the user. In particular, the interleaving unit 153 interleaves the bit sequence by interleaving two or more partial sequences obtained from the bit sequence.

Furthermore, in the second embodiment, at least one of the two or more partial sequences includes a part of a sequence obtained by interleaving the other of the two or more partial sequences. That is, at least a part of the bit sequence is interleaved repeatedly.

Thus, for example, it is possible to transmit data more flexibly and with a lesser burden in an IDMA system. More specifically, for example, a bit sequence which has any length can be transmitted without transmitting and receiving an interleaver between the transmission side and the reception side in the IDMA system.

<5.2. First Technique of Interleaving>

Next, a first technique of the interleaving according to the second embodiment will be described with reference to FIGS. 12 to 14.

(1) Length/Interleaver

In the first technique, a length according to the length M of a bit sequence of the information block (for example, a codeword) is selected from a plurality of predetermined lengths and an interleaver with the selected length is used. In other words, the interleaver which has the length according to the length M of the bit sequence is selected from a plurality of predetermined interleavers which have predetermined different lengths.

Specifically, for example, a maximum length is selected from one or more lengths equal to or less than the length M included in the plurality of predetermined lengths. In other words, a longest interleaver is selected from one or more interleavers which have lengths equal to or less than the length M and are included in the plurality of predetermined interleavers.

For example, the plurality of predetermined lengths are 128 bits, 256 bits, 512 bits, 1024 bits, 2048 bits, and 4096 bits. The length M of the bit sequence is 1632 bits. In this case, of four lengths (128 bits, 256 bits, 512 bits, and 1024 bits) equal to or less than 1632 bits, the longest length which is 1024 bits is selected. As a result, an interleaver which has the length of 1024 bits is used. That is, the interleaver which has the length of 1024 bits is selected.

Also, the bit sequence is a bit sequence of an information block generated from transmission data for a user and the interleaver is an interleaver unique to the user. For example, the interleaver has a length of a power of two. For example, the interleaver is a DI.

(2) Interleaving

When the selected length is equal to the length M of the bit sequence, as described above, the interleaving unit 153 interleaves the bit sequence using an interleaver which has the selected length (that is, the selected interleaver).

Conversely, when the selected length is less than the length M of the bit sequence, as described above, the interleaving unit 153 interleaves two or more partial sequences obtained from the bit sequence using the interleaver which has the selected length (that is, the selected interleaver). In particular, the interleaving unit 153 interleaves a part of the bit sequence repeatedly. Hereinafter, a specific example will be described with reference to FIG. 12.

Figure 12:
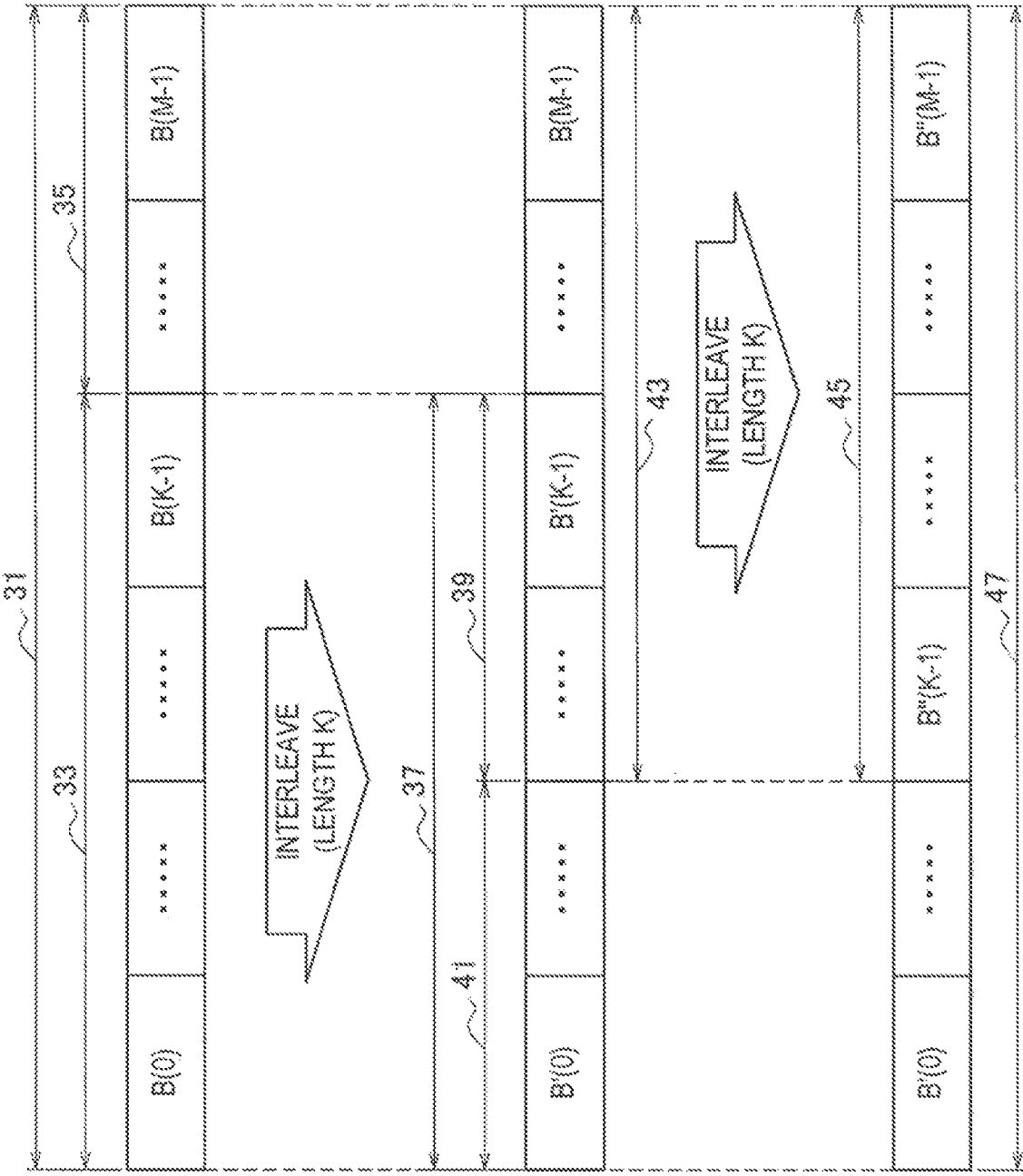
FIG. 12 is an explanatory diagram illustrating an example of a first technique of interleaving according to a second embodiment.

FIG. 12 is an explanatory diagram illustrating an example of a first technique of interleaving according to the second embodiment. Referring to FIG. 12, a bit sequence 31 which has the length M is illustrated. In this case, a length K according to the length M is selected from a plurality of predetermined lengths. That is, an interleaver which has the length K according to the length M is selected from the plurality of predetermined interleavers. For example, the length M is 1632 bits and the length K is 1024 bits. First, a partial sequence 33 (0-th to k−1-th bits) which has a length K in the bit sequence 31 is interleaved using the selected interleaver. As a result, a sequence 37 is obtained. Thereafter, the sequence 37 is concatenated with a remaining sequence 35 (K-th to M−1-th bits) in the bit sequence 31. Furthermore, a partial sequence (M−K-th to M−1-th bits) which has the length K in the concatenated bit sequence is interleaved using the selected interleaver. A partial sequence 43 includes a sequence 39 in the sequence 37 and a remaining sequence 35 in the bit sequence 31. Then, by concatenating a remaining sequence 41 (in other words, the remaining sequence 41 in the concatenated bit sequence) in the sequence 37 and a sequence 45 obtained by interleaving the partial sequence 43, it is possible to obtain an interleaved bit sequence 47.

(3) Flow of Process (a) Overall Flow

Figure 13:
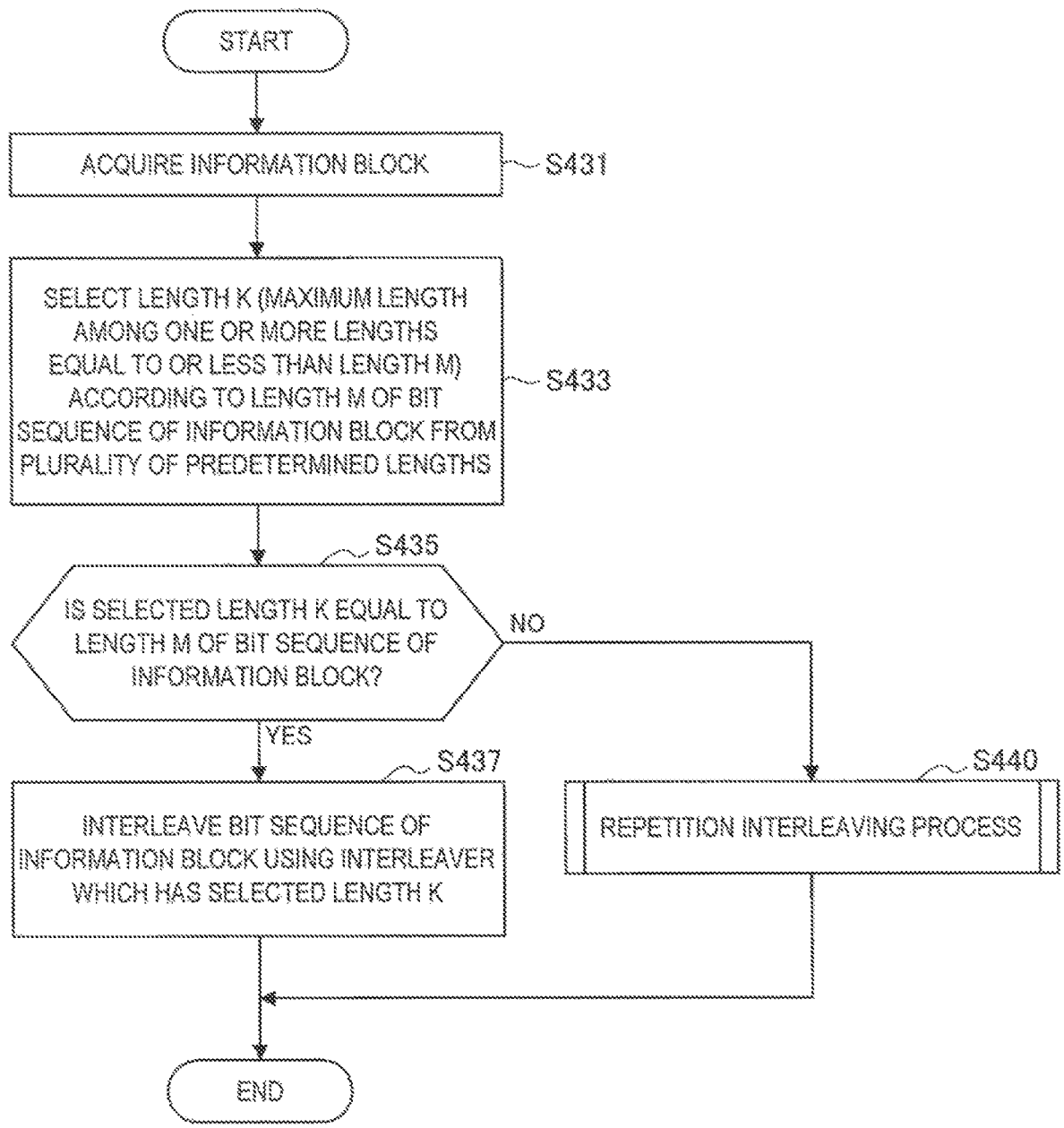
FIG. 13 is a flowchart illustrating an example of a schematic flow of a process related to a first technique according to the second embodiment.

FIG. 13 is a flowchart illustrating an example of a schematic flow of a process related to the first technique according to the second embodiment.

The information acquisition unit 151 acquires the information block (for example, a codeword) generated from the transmission data (for example, a transport block) for a user and subjected to the error correction coding (S431).

The interleaving unit 153 selects the length K according to the length M of the bit sequence of the information block from the plurality of predetermined lengths (S433). The length K is the maximum length among one or more lengths equal to or less than the length M and included in the plurality of predetermined lengths.

When the selected length K is equal to the length M of the bit sequence of the information block (YES in S435), the interleaving unit 153 interleaves the bit sequence of the information block using the interleaver which has the selected length K (that is, the selected interleaver). Then, the process ends.

When the selected length K is less than the length M of the bit sequence of the information block (NO in S435), the interleaving unit 153 performs a repetition interleaving process (S440). Then, the process ends.

(b) Repetition Interleaving Process

Figure 14:
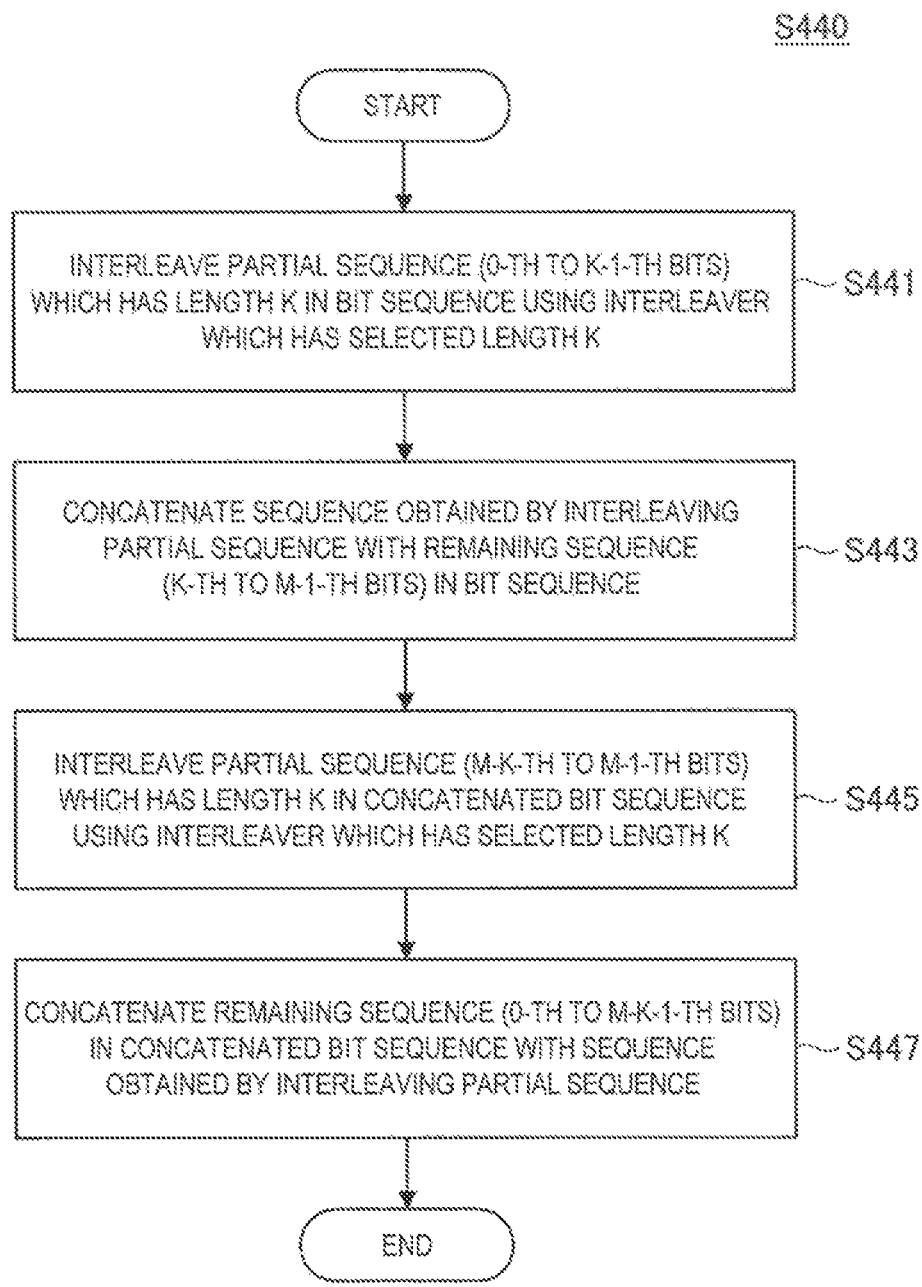
FIG. 14 is a flowchart illustrating an example of a schematic flow of a repetition interleaving process related to the first technique according to the second embodiment.

FIG. 14 is a flowchart illustrating an example of a schematic flow of a repetition interleaving process related to the first technique according to the second embodiment.

The interleaving unit 153 interleaves a partial sequence (0-th to K−1-th bits) which has the length K in the bit sequence of the information block using the interleaver which has the selected length K (that is, the selected interleaver) (S441). The interleaver is an interleaver unique to a user.

The interleaving unit 153 concatenates a sequence obtained by interleaving the partial sequence with a remaining sequence (K-th to M−1-th bits) in the bit sequence (S443).

Furthermore, the interleaving unit 153 interleaves a partial sequence (M−K-th to M−1-th bits) which has the length K in the concatenated bit sequence using the interleaver which has the selected length K (S445).

The interleaving unit 153 concatenates a remaining sequence (0-th to M−K−1-th bits) of the concatenated bit sequence with a sequence obtained by interleaving the partial sequence (S447). Then, the process ends.

(4) De-Interleaving

Also, the second radio communication apparatus 200 performs de-interleaving corresponding to the above-described interleaving in the first radio communication apparatus 100.

Referring back to FIG. 12, for example, when it is assumed that the bit sequence 47 is a received bit sequence, the length K according to the length M of the bit sequence 47 is selected from the plurality of predetermined lengths and a de-interleaver which has the length K is used. That is, a de-interleaver which has the length K is selected. The de-interleaver corresponds to an interleaver which has the length K and is unique to a user. First, the partial sequence 45 which has the length K in the received bit sequence 47 is de-interleaved using the de-interleaver. As a result, the sequence 43 is obtained. Then, the remaining sequence 41 in the received bit sequence 47 is concatenated with the sequence 43. Furthermore, the partial sequence 37 which has the length K in the concatenated bit sequence is de-interleaved using the de-interleaver. As a result, the sequence 33 is obtained. Then, the sequence 33 is concatenated with the remaining sequence 35 in the concatenated bit sequence to obtain the de-interleaved bit sequence 31.

<5.3. Second Technique of Interleaving>

Next, a second technique of the interleaving according to the second embodiment will be described with reference to FIGS. 15 to 17.

(1) Length/Interleaver

In the second technique, an interleaver which has one predetermined length K is used to interleave the bit sequence.

Also, the bit sequence is a bit sequence of an information block generated from transmission data for a user. The interleaver is an interleaver unique to the user. For example, the predetermined length K (the length of the interleaver) is a length of a power of two. For example, the interleaver is a DI.

(2) Interleaving

In the second technique, the interleaving unit 153 first interleaves one or more partial sequences which have the predetermined length K and are included in the bit sequence using the interleaver.

Specifically, for example, the number N of partial sequences which have the predetermined length K and are included in the bit sequence which has the length M is calculated as follows, and the number of partial sequences is interleaved using the interleaver.

$$N = \text{floor}\left(\frac{M}{K}\right) \quad [\text{Math. 4}]$$

Thereafter, the N sequences obtained through the interleaving are concatenated.

When the length M is a K multiple of the predetermined length K, the concatenated sequence including N sequences is output as an interleaved bit sequence. Conversely, when the length M is not a multiple of the predetermined length K, the interleaving unit 153 performs new interleaving (repetition interleaving). In particular, the interleaving unit 153 interleaves a part of the bit sequence repeatedly. Hereinafter, a specific example will be described with reference to FIG. 15.

Figure 15:
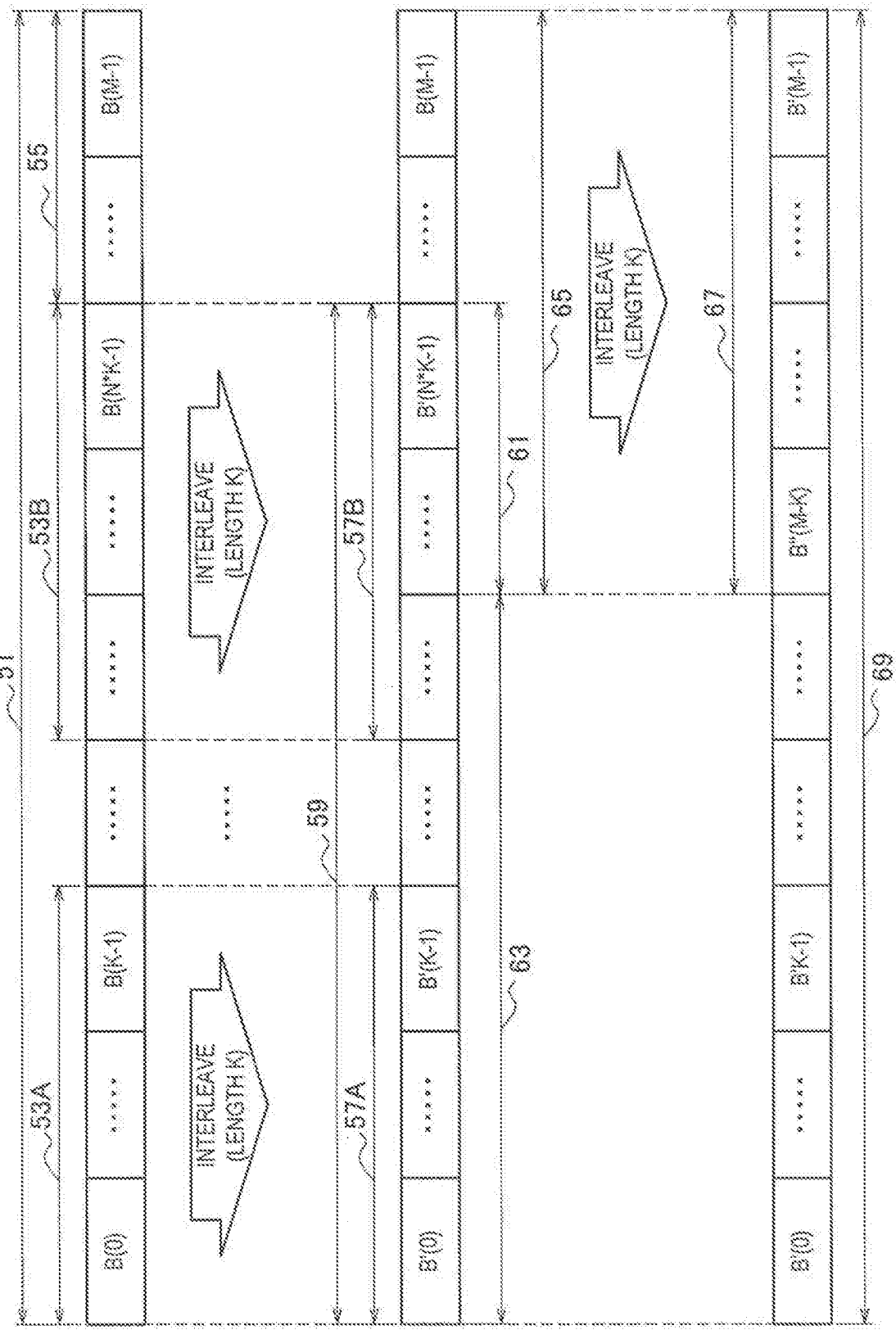
FIG. 15 is an explanatory diagram illustrating an example of a second technique of the interleaving according to the second embodiment.

FIG. 15 is an explanatory diagram illustrating an example of the second technique of the interleaving according to the second embodiment. Referring to FIG. 15, a bit sequence 51 which has a length M is illustrated. In this case, the number N of partial sequences 53 which has the predetermined length K and is included in the bit sequence 51 is calculated. Then, N partial sequences 53 (partial sequences 53A and 53B and the like) are interleaved using the interleaver which has the predetermined length K. As a result, N sequences 57 (sequences 57A and 57B and the like) are obtained. Then, the N sequences 57 are concatenated to obtain a sequence 59. In this example, the length M is not a multiple of the length K. Therefore, the sequence 59 is further concatenated with a remaining sequence 55 (K*N-th to M−1-th bits) in the bit sequence 51. Then, a partial sequence 65 (M−K-th to M−1-th bits) which has the length K in the further concatenated bit sequence is interleaved using the interleaver which has the predetermined length K. The partial sequence 65 includes a sequence 61 in the sequence 59 and the remaining sequence 55. Then, a remaining sequence 63 (0-th to M−K−1-th bits) in the sequence 59 is concatenated with a sequence 67 obtained by interleaving the partial sequence 65 to obtain an interleaved bit sequence 69.

(3) Flow of Process (a) Overall Flow

Figure 16:
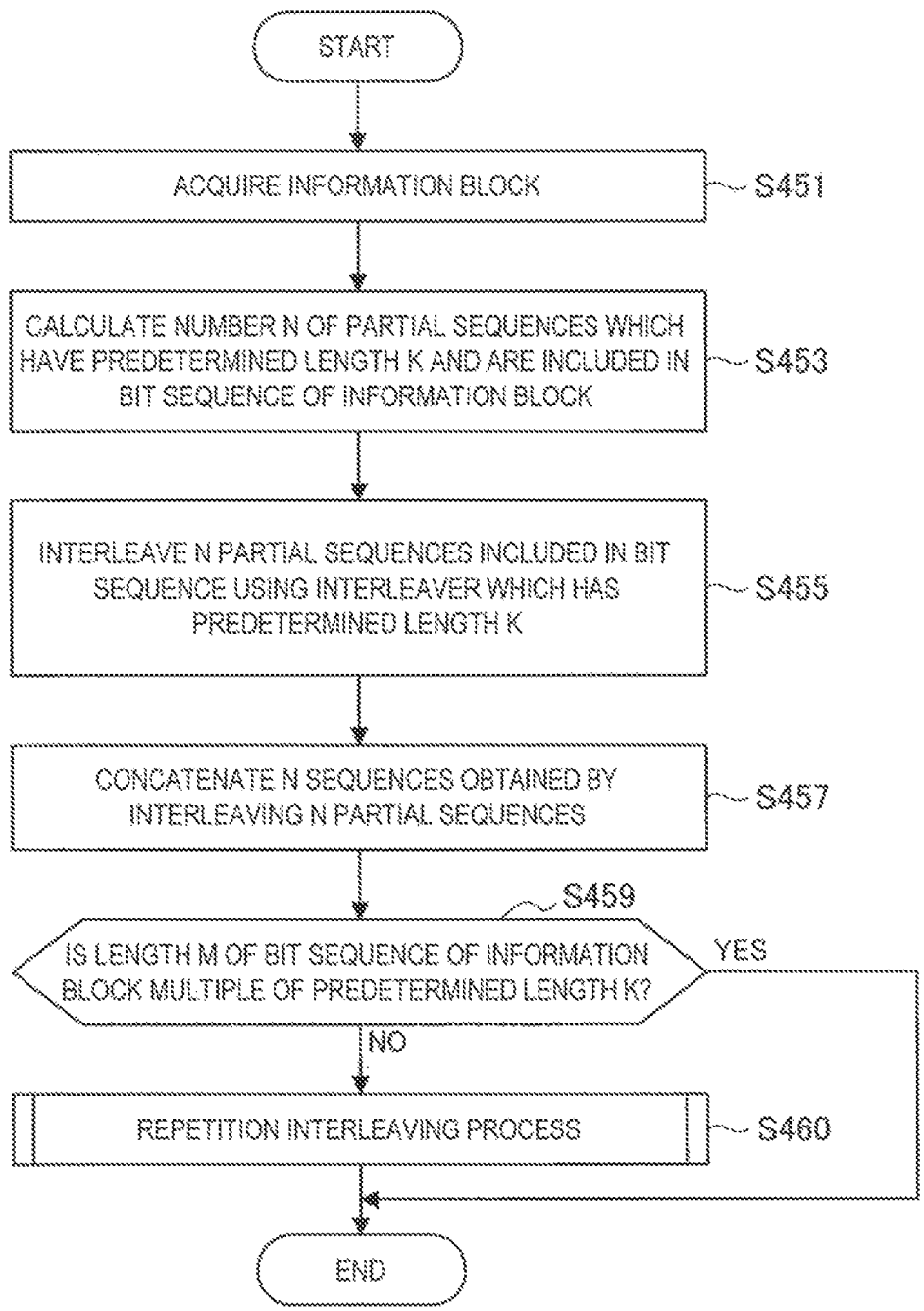
FIG. 16 is a flowchart illustrating an example of a schematic flow of a process related to the second technique according to the second embodiment.

FIG. 16 is a flowchart illustrating an example of a schematic flow of a process related to the second technique according to the second embodiment.

The information acquisition unit 151 acquires the information block (for example, a codeword) generated from transmission data (for example, a transport block) for a user and subjected to error correction coding (S451).

The interleaving unit 153 calculates the number N of partial sequences which have the predetermined length K and are included in the bit sequence of the information block (S453).

The interleaving unit 153 interleaves the N partial sequences included in the bit sequence using the interleaver which has the predetermined length K (S455).

The interleaving unit 153 concatenates the N sequences obtained by interleaving the N partial sequences (S457).

When the length M of the bit sequence of the information block is a multiple of the predetermined length K (YES in S459), the process ends.

Otherwise (NO in S459), the interleaving unit 153 performs a repetition interleaving process (S460). Then, the process ends.

(b) Repetition Interleaving Process

Figure 17:
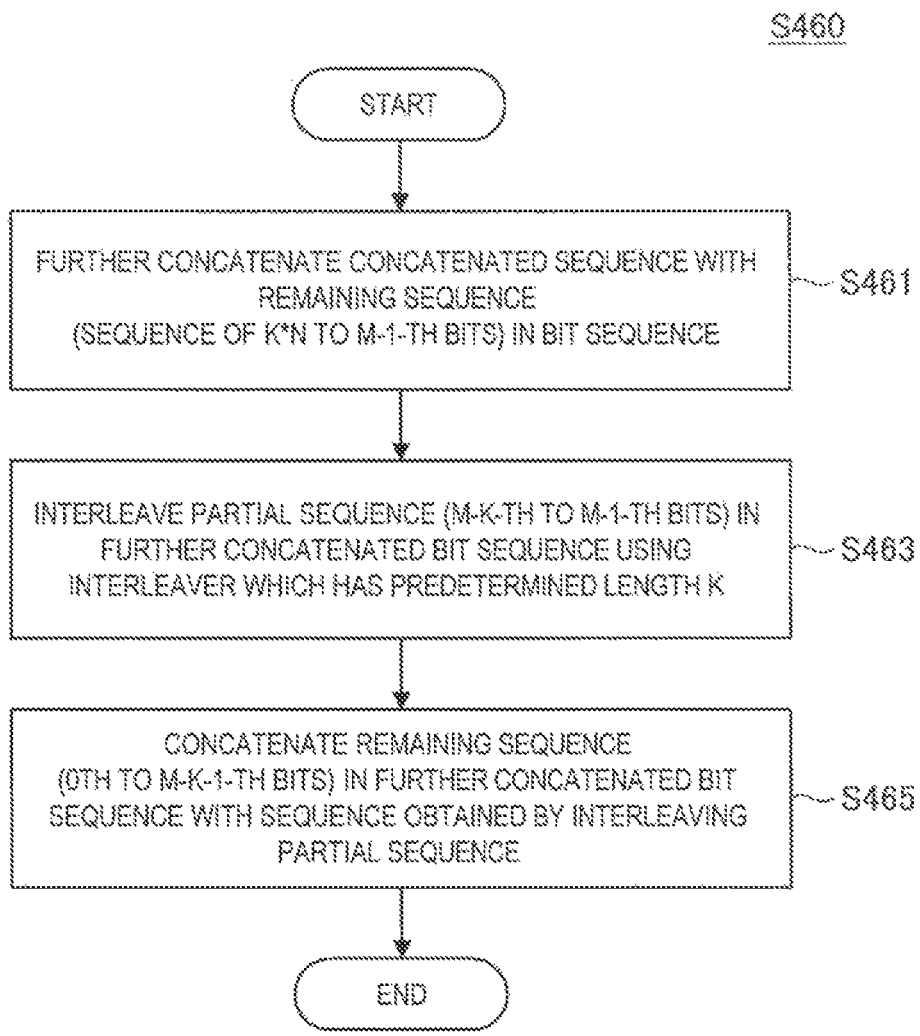
FIG. 17 is a flowchart illustrating an example of a schematic flow of a repetition interleaving process related to the second technique according to the second embodiment.

FIG. 17 is a flowchart illustrating an example of a schematic flow of a repetition interleaving process related to the second technique according to the second embodiment.

The interleaving unit 153 further concatenates the concatenated sequence with the remaining sequence (K*N-th to M−1-th bits) in the bit sequence of the information block (S461).

The interleaving unit 153 interleaves the partial sequence (M−K-th to M−1-th bits) in the further concatenated bit sequence using the interleaver which has the predetermined length K (S463).

The interleaving unit 153 concatenates the remaining bit sequence (0-th to M−K−1-th bits) in the further concatenated bit sequence with the sequence obtained by interleaving the partial sequence (S465). Then, the process ends.

(4) De-Interleaving

Also, the second radio communication apparatus 200 performs de-interleaving corresponding to the above-described interleaving in the first radio communication apparatus 100.

Referring back to FIG. 15, for example, when it is assumed that the bit sequence 69 is the received bit sequence, the partial sequence 67 that has the predetermined length K in the received bit sequence 69 is first de-interleaved using a de-interleaver (a de-interleaver corresponding to the interleaver unique to the user) which has the predetermined length K. As a result, the sequence 65 is obtained. Then, the remaining sequence 63 in the received bit sequence 69 is concatenated with the sequence 65. Furthermore, the plurality of partial sequences 57 which have the predetermined length K in the concatenated bit sequence are de-interleaved using the de-interleaver which has the predetermined length K. As a result, the plurality of sequences 53 are obtained. Then, the plurality of sequences 53 and the sequence 55 are concatenated to obtain the de-interleaved bit sequence 51.

<5.4. Variations of Interleaving>

Next, variations of the interleaving according to the second embodiment will be described with reference to FIG. 18.

As the examples of the first and second techniques described above, the examples in which the bit sequence of the information block is interleaved using one interleaver have been described, but the second embodiment is not limited to the examples. The bit sequence may be interleaved using two or more interleavers.

Further, as the examples of the first and second techniques described above, the examples in which the number of regions interleaved twice or more is 1 have been described, but the second embodiment is not limited to the examples. The number of regions to be interleaved twice or more may be 2 or more.

Figure 18:
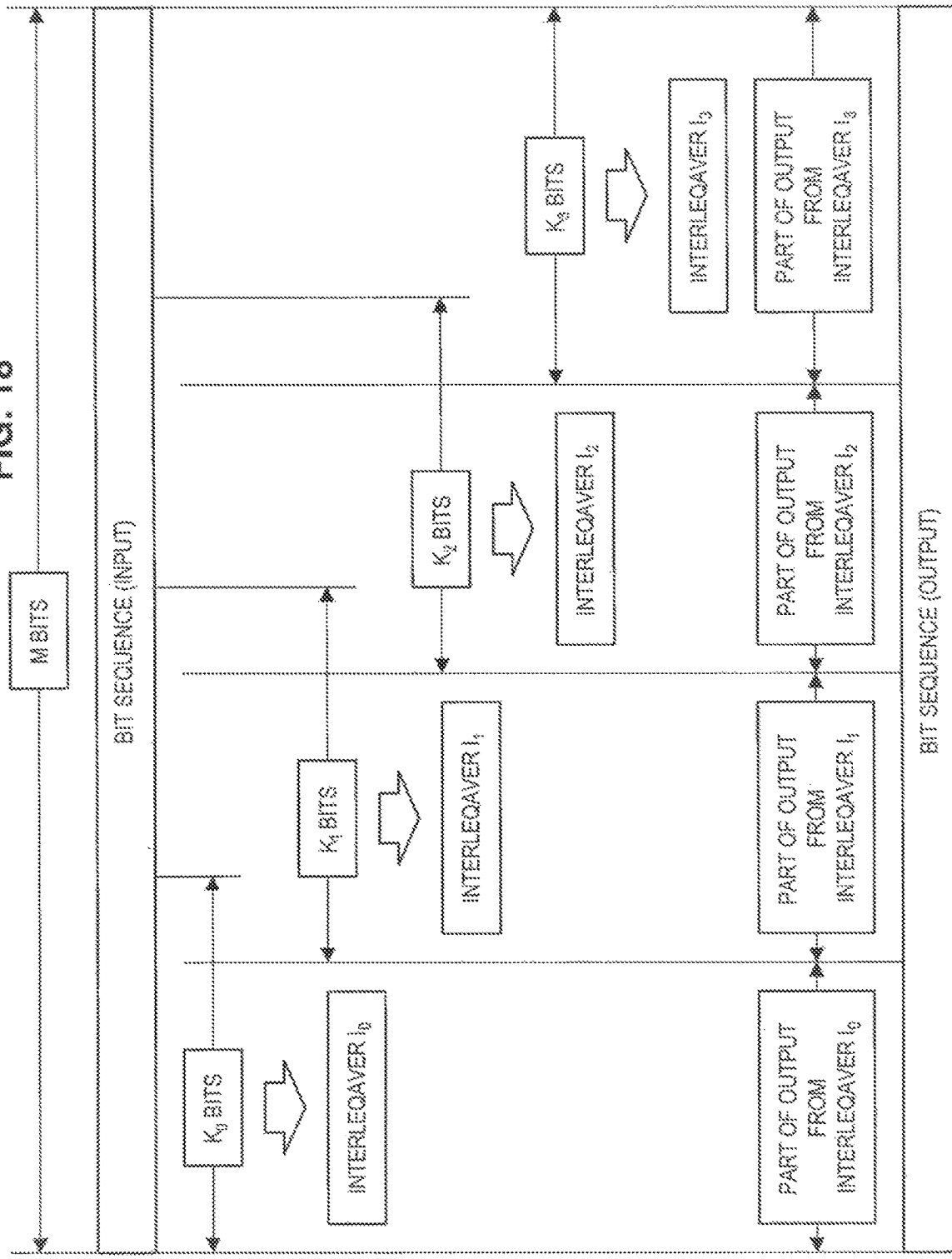
FIG. 18 is an explanatory diagram illustrating another example of the interleaving according to the second embodiment.

FIG. 18 is an explanatory diagram illustrating another example of the interleaving according to the second embodiment. Referring to FIG. 18, a bit sequence of M bits is illustrated. In this example, the bit sequence is interleaved using interleavers $I_0$, $I_1$, $I_2$, and $I_3$ which have lengths of $K_0$ bits, $K_1$ bits, $K_2$ bits, and $K_3$ bits. Furthermore, in this example, a part of the sequence generated by performing interleaving using the interleaver $I_0$ is interleaved using the interleaver $I_1$. Similarly, a part of the sequence generated by performing interleaving using the interleaver $I_1$ is interleaved using the interleaver 12 and a part of the sequence generated by performing interleaving using the interleaver 12 is interleaved using the interleaver 13.

<5.5. Technical Features>

(1) Interleaving

As described above, in the second embodiment, the information acquisition unit 151 acquires the information block generated from the transmission data for the user and subjected to the error correction coding. The interleaving unit 153 interleaves the bit sequence of the information block using the interleaver unique to the user. In particular, the interleaving unit 153 interleaves the bit sequence by interleaving the two or more partial sequences obtained from the bit sequence.

Furthermore, in the second embodiment, at least one of the two or more partial sequences includes a part of the sequence obtained by interleaving the other of the two or more partial sequences. That is, at least a part of the bit sequence is interleaved repeatedly.

(a) Transmission data

The first radio communication apparatus 100 may be a base station and the transmission data may be transmission data destined for the user. Alternatively, the first radio communication apparatus 100 may be a terminal apparatus of the user and the transmission data may be transmission data from the user.

For example, the transmission data is a transport block.

(b) Information Block

For example, the information block is a codeword. Alternatively, as in the fourth embodiment to be described below, the information block may also be a code block.

(c) Bit Sequence of Information Block

For example, the bit sequence of the information block has a length which is not a power of two.

(d) Partial Sequences

As described above, at least one of the two or more partial sequences includes a part of the sequence obtained by interleaving the other of the two or more partial sequences. That is, at least a part of the bit sequence is interleaved repeatedly.

For example, the at least one of the partial sequences further includes a part of the bit sequence.

For example, a total sum of the lengths of the two or more partial sequences is greater than the length of the bit sequence. For example, each of the two or more partial sequences has a length of a power of two. For example, the two or more partial sequences have the same length.

Referring back to FIG. 12, the two or more partial sequences are partial sequences 33 and 43. The partial sequence 43 includes a part (sequence 39) of the sequence 37 obtained by interleaving the partial sequence 33. The partial sequence 43 further includes a part (sequence 35) of the bit sequence 31. A total sum of the lengths of the partial sequences 33 and 43 is greater than the length of the bit sequence 31. The partial sequences 33 and 43 have the same length as a power of two.

Referring back to FIG. 15, the two or more partial sequences are the plurality of partial sequences 53 and 65. The partial sequence 65 includes a part (sequence 61) of the sequence 57B obtained by interleaving the partial sequence 53B. The partial sequence 65 further includes a part (sequence 55) of the bit sequence 51. A total sum of the lengths of the plurality of partial sequences 53 and 65 is greater than the length of the bit sequence 51. The plurality of partial sequences 53 and 65 have the same length as a power of two.

(e) Interleaving

For example, the interleaving unit 153 interleaves each of the two or more partial sequences using the corresponding interleaver.

(e-1) Interleaver

For example, the corresponding interleaver is an interleaver which has the same length as the length of the partial sequence and is unique to the user. Furthermore, the corresponding interleaver may be an interleaver unique to the transmission data (for example, a transport block) or the information block (for example, a codeword or a code block).

For example, the corresponding interleaver is an interleaver which can be generated in each of a transmitter and a receiver (in other words, an interleaver which can be generated based on a calculation equation). For example, the corresponding interleaver is a DI. In this case, the corresponding interleaver may be referred to as an overlapped deterministic interleaver (ODI). As another example, the corresponding interleaver may be an LCI. In this case, the corresponding interleaver may be referred to as an overlapped linear congruential interleaver (OLCI). Also, the corresponding interleaver is not limited to the examples.

The corresponding interleaver may also be mounted as hardware (for example, programmable hardware) or may also be mounted as software. An interleave pattern of the corresponding interleaver may be replaceable.

(e-2) First Technique

For example, the length of each of the two or more partial sequences is a length according to the length of the bit sequence among the plurality of predetermined lengths.

Furthermore, specifically, for example, the length of at least one of the two or more partial sequences is a maximum length among one or more lengths equal to or less than the length of the bit sequence and included in the plurality of predetermined lengths.

Referring back to FIG. 12, the two or more partial sequences are the partial sequences 33 and 43. The length of each of the partial sequences 33 and 43 is a length according to the length of the bit sequence 31 among the plurality of predetermined lengths. More specifically, the length of each of the partial sequences 33 and 43 is a maximum length among one or more lengths equal to or less than the length of the bit sequence 31 and included in the plurality of predetermined lengths. For example, the plurality of predetermined lengths are 128 bits, 256 bits, 512 bits, 1024 bits, 2048 bits, and 4096 bits. The length of the bit sequence 31 is 1632 bits. In this case, each of the partial sequences 33 and 43 is 1024 bits.

(e-3) Second Technique

For example, the length of each of the two or more partial sequences is one predetermined length.

Referring back to FIG. 15, the two or more partial sequences are the plurality of partial sequences 53 and 65. The length of each of the plurality of partial sequences 53 and 65 is one predetermined length.

As described above, the interleaving unit 153 interleaves the bit sequence of the information block. Thus, for example, it is possible to transmit data more flexibly and with a lesser burden in the IDMA system.

More specifically, for example, in the IDMA system, it is possible to transmit a bit sequence which has any length without transmitting and receiving interleavers between a transmission side and a reception side. For example, since the interleaver may not be transmitted and received between the transmitter and the receiver, a large memory is not necessary in the transmitter and additional radio resources are not necessary either. Therefore, it is possible to reduce a burden on the transmitter and the system. Further, since the length of the bit sequence of the information block is not limited to a power of two, it is possible to transmit data more flexibly.

Also, in the second embodiment, since a lower limit of the length of the partial sequence (the length of the interleaver) is provided, it is possible to avoid a situation in which the length of the partial sequence (the length of the interleaver) is considerably shortened. Therefore, the performance of BER/BLER can be more preferable.

In particular, according to the first technique, by using an interleaver closer to the length of the bit sequence of the information block, it is possible to distribute bits more satisfactorily. Therefore, the performance of BER/BLER can be more preferable.

In particular, according to the second technique, it is not necessary to select the length of the partial sequence (the length of the interleaver) according to the length of the bit sequence of the information block. Therefore, it is possible to perform the interleaving more rapidly.

(2) De-Interleaver

The information acquisition unit 251 acquires the received bit sequence. The de-interleaving unit 253 generates the bit sequence of the information block not subjected to error correction decoding by de-interleaving the received bit sequence using the de-interleaver corresponding to the interleaver unique to the user. In particular, the de-interleaving unit 253 de-interleaves the received bit sequence by de-interleaving two or more partial sequences obtained from the received bit sequence.

Furthermore, in the second embodiment, at least one of the two or more partial sequences includes a part of the sequence obtained by de-interleaving the other of the two or more partial sequences. That is, at least a part of the received bit sequence is de-interleaved repeatedly.

(a) Information Block

For example, the information block is a codeword. Alternatively, as in the fourth embodiment to be described below, the information block may also be a code block.

(b) Received Bit Sequence

For example, the received bit sequence is a sequence received in a subframe. For example, the received bit sequence is a sequence after ESE and de layer mapping. For example, the received bit sequence has a length which is not a power of two.

(c) Partial Sequences

As described above, at least one of the two or more partial sequences includes a part of the sequence obtained by de-interleaving the other of the two or more partial sequences. For example, the at least one of the partial sequences further includes a part of the received bit sequence.

For example, a total sum of the lengths of the two or more partial sequences is greater than the length of the received bit sequence.

(d) De-Interleaving

For example, the de-interleaving unit 253 de-interleaves each of the two or more partial sequences using the corresponding de-interleaver.

(d-1) De-Interleaver

For example, the corresponding de-interleaver is a de-interleaver which has the same length as the length of the partial sequence and is a de-interleaver corresponding to the interleaver unique to the user.

For example, the interleaver unique to the user is an interleaver which can be generated in each of a transmitter and a receiver (in other words, an interleaver which can be generated based on a calculation equation). For example, the interleaver unique to the user is a DI. As another example, the interleaver unique to the user may be an LCI. Also, the interleaver unique to the user is not limited to the examples.

The corresponding interleaver may also be mounted as hardware (for example, programmable hardware) or may also be mounted as software. A de-interleave pattern of the corresponding de-interleaver may be replaceable.

(d-2) First Technique

For example, the length of each of the two or more partial sequences is a length according to the length of the received bit sequence among the plurality of predetermined lengths.

Furthermore, specifically, for example, the length of at least one of the two or more partial sequences is a maximum length among one or more lengths equal to or less than the length of the received bit sequence and included in the plurality of predetermined lengths.

Referring back to FIG. 12, for example, the de-interleaving unit 253 de-interleaves the partial sequences 45 and 37 which have the length K using the de-interleaver which has the length K according to the length M of the received bit sequence 47. As a result, the bit sequence 31 can be obtained.

(d-3) Second Technique

For example, the length of each of the two or more partial sequences is one predetermined length.

Referring back to FIG. 15, for example, the de-interleaving unit 253 de-interleaves the partial sequence 67 and the plurality of partial sequences 57 which have the predetermined length K using the de-interleaver which has the predetermined length K. As a result, the bit sequence 51 can be obtained.

6. Third Embodiment

Next, a third embodiment of the present disclosure will be described with reference to FIGS. 19 to 21.

<6.1. Overview>

(1) Technical Problem

A technical problem according to the third embodiment is the same as the technical problem according to the first embodiment. Accordingly, the repeated description thereof will be omitted here.

(2) Technical Means

In the third embodiment, the information acquisition unit 151 acquires an information block generated from transmission data for a user and subjected to error correction coding. The interleaving unit 153 interleaves the bit sequence using another interleaver obtained from the interleaver longer than the bit sequence of the information block and unique to the user or the interleaver unique to the user.

Thus, for example, it is possible to transmit data more flexibly and with a lesser burden in the IDMA system. More specifically, for example, a bit sequence which has any length can be transmitted without transmitting and receiving an interleaver between the transmission side and the reception side in the IDMA system.

<6.2. Example of Interleaving>

Next, an example of interleaving according to the third embodiment will be described with reference to FIGS. 19 to 21.

(1) Interleaver

When the length M of the bit sequence of the information block (for example, a codeword) generated from the transmission data for the user is a length of a power of two, the bit sequence is interleaved using the interleaver which has the length M and is unique to the user. For example, the interleaver is a DI.

Conversely, in particular, when the length M of the bit sequence is not the length of the power of two, the interleaver longer than the length M and unique to the user is acquired. For example, the interleaver is a minimum interleaver longer than the length M among the interleavers which have lengths of powers of two. For example, the interleaver is a DI. Furthermore, another interleaver which has the length M is generated from the interleaver. Hereinafter, a specific example will be described with reference to FIG. 19.

Figure 19:
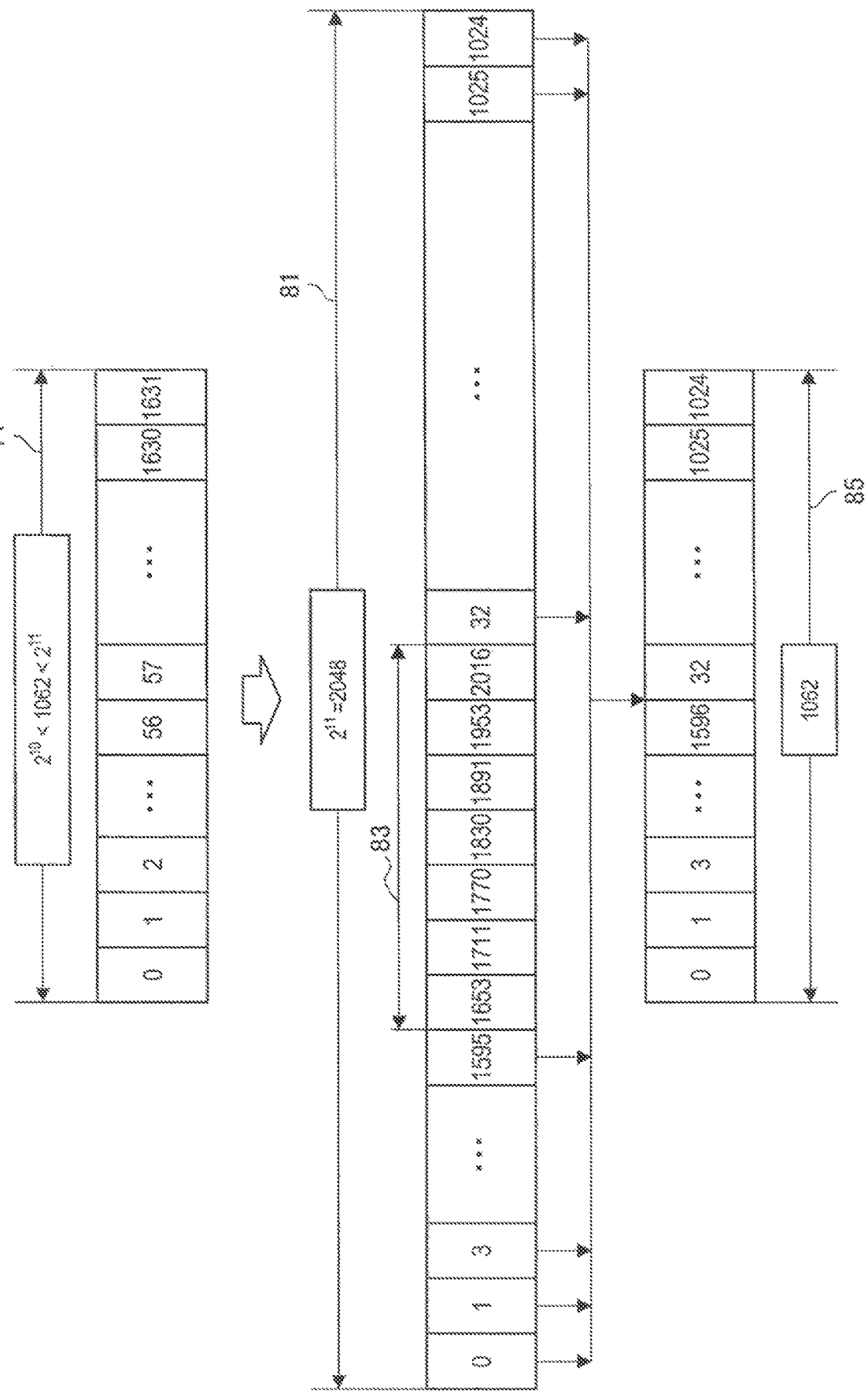
FIG. 19 is an explanatory diagram illustrating an example of an interleaver according to a third embodiment.

FIG. 19 is an explanatory diagram illustrating an example of an interleaver according to the third embodiment. Referring to FIG. 19, a bit sequence 71 of 1632 bits is illustrated. Here, 1632 bits is longer than 1024 ($=2^{10}$) and shorter than 2048 ($=2^{11}$). Accordingly, an interleaver 81 which has a length of 2048 ($=2^{11}$) bits and is unique to a user is acquired. Furthermore, an interleaver 85 which has a length of 1632 bits is generated from the interleaver. Specifically, for example, a portion in which input bits are output to bits not included in an output bit sequence of 1632 bits in the interleaver 81 is excluded. On the other hand, a portion in which input bits are output to bits included in the output bit sequence of 1632 bits in the interleaver 81 remains. Specifically, for example, a portion 83 or the like in the interleaver 81 is excluded. Thus, an interleaver 85 which has a length of 1632 bits is generated.

(2) Interleaving

For example, the interleaving unit 153 interleaves the bit sequence (for example, the bit sequence 71) using the other interleaver (for example, the interleaver 85) which has the length M.

Also, the interleaver (for example, the interleaver 81) longer than the length M may be used instead of using the other interleaver (for example, the interleaver 85) which has the length M. For example, the interleaving unit 153 may interleave the bit sequence not using the portion in which the input bits are output to the bits not included in the output bit sequence in the interleaver longer than the length M but using only the other portion.

(3) Flow of Process (a) Overall Flow

Figure 20:
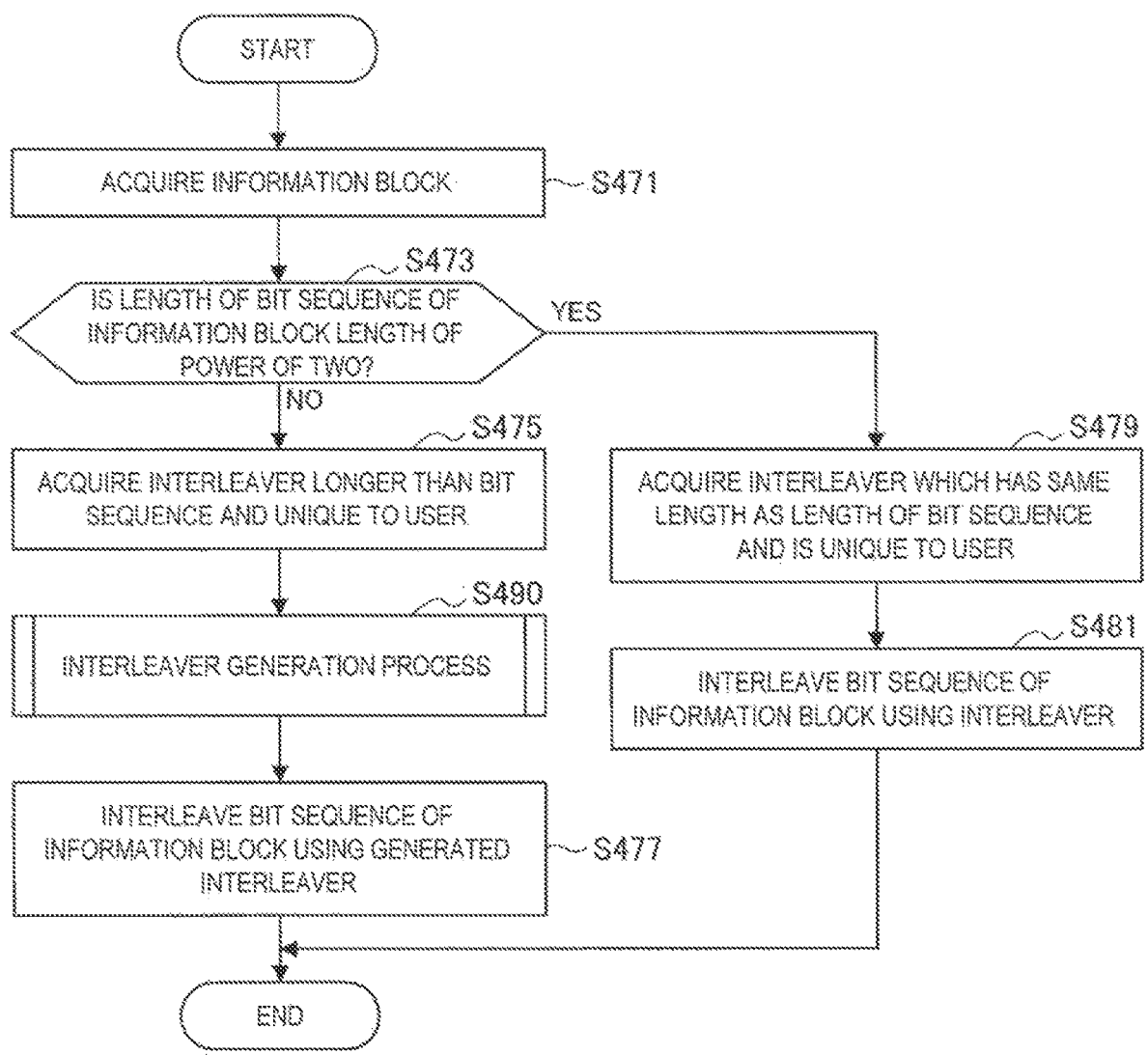
FIG. 20 is a flowchart illustrating an example of a schematic flow of a process according to the third embodiment.

FIG. 20 is a flowchart illustrating an example of a schematic flow of a process according to the third embodiment.

The information acquisition unit 151 acquires the information block (for example, a codeword) generated from transmission data (for example, a transport block) for a user and subjected to error correction coding (S471).

When the length of the bit sequence of the information block is not the length of a power of two (NO in S473), the interleaving unit 153 acquires the interleaver longer than the bit sequence and unique to the user (S475). Then, the interleaving unit 153 performs an interleaver generation process (S490) and interleaves the bit sequence of the information block using the generated interleaver (S477). Then, the process ends.

Conversely, when the length of the bit sequence of the information block is the length of the power of two (YES in S473), the interleaving unit 153 acquires the interleaver which has the same length as the length of the bit sequence and is unique to the user (S479). Then, the interleaving unit 153 interleaves the bit sequence of the information block using the interleaver (S481). Then, the process ends.

Figure 21:
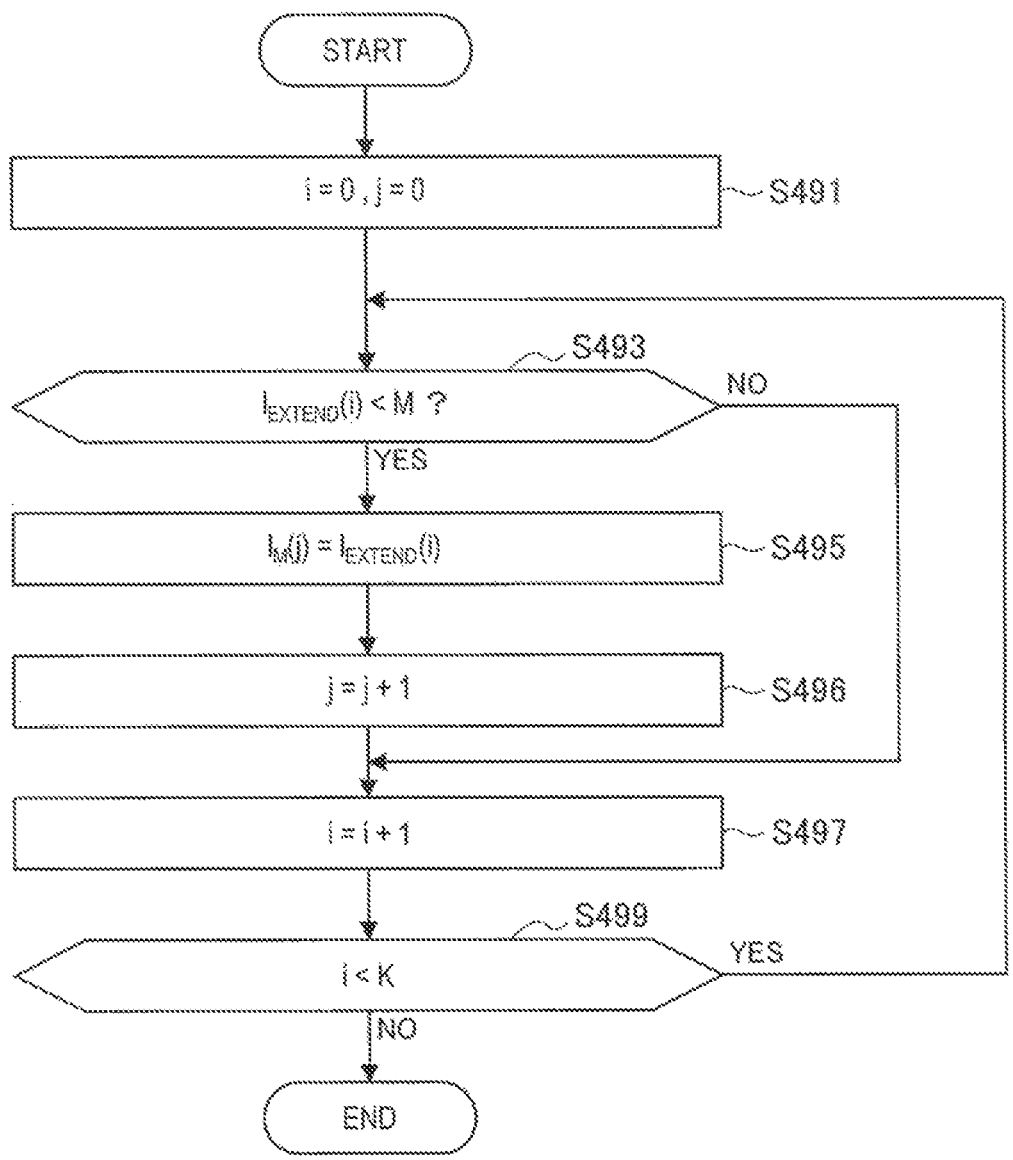
FIG. 21 is a flowchart illustrating an example of a schematic flow of an interleaver generation process according to the third embodiment.

(b) Interleaver generation process FIG. 21 is a flowchart illustrating an example of a schematic flow of the interleaver generation process according to the third embodiment.

First, indexes i and j are initialized to 0 (S491).

When a value $I_{EXTEND}(i)$ of the interleaver longer than the bit sequence is less than the length M of the bit sequence (YES in S493), the value $I_{EXTEND}(i)$ is applied as a value $I_M(j)$ of the interleaver which has the length M (S495). Then, the index j is increased (S496) and the index i is also increased (S497).

When $I_{EXTEND}(i)$ is equal to or greater than the length M of the bit sequence (NO in S493), the index i is increased (S497).

When the index i is less than K (YES in S499), the process returns to step S491. Otherwise (NO in S499), the process ends.

(4) De-Interleaving

Also, the second radio communication apparatus 200 performs de-interleaving corresponding to the above-described interleaving in the first radio communication apparatus 100.

Referring back to FIG. 19, for example, the de-interleaving unit 253 de-interleaves the received bit sequence of 1632 bits using the de-interleaver corresponding to the interleaver 85. As a result, the bit sequence 71 can be obtained.

<6.3. Technical Features>

(1) Interleaving

As described above, in the third embodiment, the information acquisition unit 151 acquires the information block generated from the transmission data for the user and subjected to the error correction coding. The interleaving unit 153 interleaves the bit sequence using another interleaver obtained from the interleaver longer than the bit sequence of the information block and unique to the user or the interleaver unique to the user.

(a) Transmission data

The first radio communication apparatus 100 may also be a base station and the transmission data may also be transmission data destined for the user. Alternatively, the first radio communication apparatus 100 may also be a terminal apparatus of the user and the transmission data may be transmission data from the user.

For example, the transmission data is a transport block.

(b) Information Block

For example, the information block is a codeword. Alternatively, as in the fourth embodiment to be described below, the information block may also be a code block.

(c) Bit Sequence of Information Block

For example, the bit sequence of the information block has a length which is not a power of two.

Referring back to FIG. 19, for example, the bit sequence is the bit sequence 71 and has a length of 1632 bits.

(d) Interleaver (d-1) Interleaver Longer than Bit Sequence and Unique to User

For example, the interleaver longer than the bit sequence and unique to the user is an interleaver which has a length of a power of two. Furthermore, the interleaver may be an interleaver unique to the transmission data (for example, a transport block) or the information block (for example, a codeword or a code block).

For example, the interleaver unique to the user is an interleaver which can be generated in each of a transmitter and a receiver (in other words, an interleaver which can be generated based on a calculation equation). For example, the interleaver unique to the user is a DI. As another example, the interleaver unique to the user may be an LCI. Also, the interleaver unique to the user is not limited to the examples.

Referring back to FIG. 19, for example, the interleaver unique to the user is the interleaver 81.

(d-2) Another Interleaver

For example, the other interleaver is an interleaver which has the same length as the length of the bit sequence of the information block.

Furthermore, for example, the other interleaver is an interleaver obtained by excluding a portion in which input bits are output to bits not included in an output bit sequence which has the same length as the length of the bit sequence from the interleaver unique to the user.

Referring back to FIG. 19, for example, the other interleaver is the interleaver 85. As described above, the interleaver 85 is obtained by excluding the portion (the portion 83 or the like) in which input bits are output to bits not included in an output bit sequence of 1632 bits from the interleaver 81.

(e) Interleaving

As described above, for example, the interleaving unit 153 interleaves the bit sequence using the other interleaver.

Referring back to FIG. 19, for example, the interleaving unit 153 interleaves the bit sequence 71 using the interleaver 85.

Also, the interleaving unit 153 may interleave the bit sequence using the interleaver unique to the user. In this case, the interleaving unit 153 may interleave the bit sequence not using the portion in which the input bits are output to the bits not included in the output bit sequence in the interleaver unique to the user but using only another portion.

As described above, the interleaving unit 153 interleaves the bit sequence of the information block. Thus, for example, it is possible to transmit data more flexibly and with a lesser burden in the IDMA system.

More specifically, for example, in the IDMA system, it is possible to transmit a bit sequence which has any length without transmitting and receiving interleavers between a transmission side and a reception side. For example, since the interleaver may not be transmitted and received between the transmitter and the receiver, a large memory is not necessary in the transmitter and additional radio resources are not necessary either. Therefore, it is possible to reduce a burden on the transmitter and the system. Further, since the length of the bit sequence of the information block is not limited to a power of two, it is possible to transmit data more flexibly.

Also, in the third embodiment, for example, since the interleaver which has the same length as the length of the bit sequence of the information block is used, it is possible to distribute bits more satisfactorily. Therefore, the performance of BER/BLER can be more preferable.

(2) De-Interleaving

The information acquisition unit 251 acquires a received bit sequence. The de-interleaving unit 253 generates a bit sequence of the information block not subjected to error correction decoding by de-interleaving the received bit sequence using a de-interleaver corresponding to another interleaver obtained from the interleaver longer than the received bit sequence and unique to a user.

(a) Information Block

For example, the information block is a codeword. Alternatively, as in the fourth embodiment to be described below, the information block may also be a code block.

(b) Received Bit Sequence

For example, the received bit sequence is a sequence received in a subframe. For example, the received bit sequence is a sequence after ESE and de layer mapping. For example, the received bit sequence has a length which is not a power of two.

(c) De-Interleaver (c-1) Interleaver

For example, the interleaver longer than the received bit sequence and unique to the user is an interleaver which has a length of a power of two. For example, the other interleaver is an interleaver which has the same length as the length of the bit sequence of the information block. The description of the interleaver is the same as the above description. Accordingly, the repeated description thereof will be omitted here.

(c-2) De-interleaver

Referring back to FIG. 19, for example, the de-interleaver corresponding to the other interleaver is a de-interleaver corresponding to the interleaver 85.

(d) De-Interleaver

As described with reference to FIG. 19, for example, the interleaving unit 153 interleaves the received bit sequence of 1632 bits using the de-interleaver corresponding to the interleaver 85. As a result, the bit sequence 71 can be obtained.

7. Fourth Embodiment

Next, a fourth embodiment of the present disclosure will be described with reference to FIGS. 22 to 26.

<7.1. Overview>

(1) Technical Problem

For example, in an IDMA system, a bit sequence of a codeword is interleaved using an interleaver unique to a user. The length of the codeword is one length in a broad range.

However, in the IDMA system, when a range of the length of a bit sequence which is an interleaving target is broad, a situation not preferable in regard to interleaving of the bit sequence can occur.

As one example, in accordance with the technique of the first embodiment, the first technique of the second embodiment, or the technique of the third embodiment, interleavers which have various lengths can be prepared to interleave the bit sequence. Therefore, a burden on a transmitter and a receiver can increase.

As another example, when the bit sequence is interleaved in accordance with the second technique of the second embodiment, the length of the bit sequence can increase considerably compared to an interleaver which has a predetermined length. As a result, when the interleaver is used, bits of the bit sequence are spread locally, but are not spread overall. As a result, the performance of BER/BLER may deteriorate.

Accordingly, it is preferable to provide a structure that makes it possible to further narrow a range of the length of a bit sequence which is an interleaving target in the IDMA system.

(2) Technical Means

In the fourth embodiment, the information acquisition unit 151 acquires an information block generated from transmission data for a user. The interleaving unit 153 interleaves a bit sequence of the information block using an interleaver unique to the user. In particular, the information block is a block after segmentation for error correction coding and the error correction coding and before integration after the error correction coding. For example, the information block is a code block.

Thus, for example, it is possible to further narrow the range of the length of the bit sequence which is the interleaving target in the IDMA system.

<7.2. Example of Interleaving>

Next, an example of interleaving according to the third embodiment will be described with reference to FIGS. 22 to 26.

(1) Interleaving

For example, in a system such as LTE, a plurality of code blocks are concatenated to generate one codeword.

In particular, in this example, not a codeword but one or more code blocks are interleaved using an interleaver unique to a user. For example, two or more code blocks are interleaved in parallel. For example, the interleaver is a DI and can be referred to as a code block parallel deterministic interleaver (CBPDI). The interleaver may be further unique to a cell, a codeword (or a transport block), a code block, or a link direction. Hereinafter, a specific example will be described with reference to FIG. 22.

Figure 22:
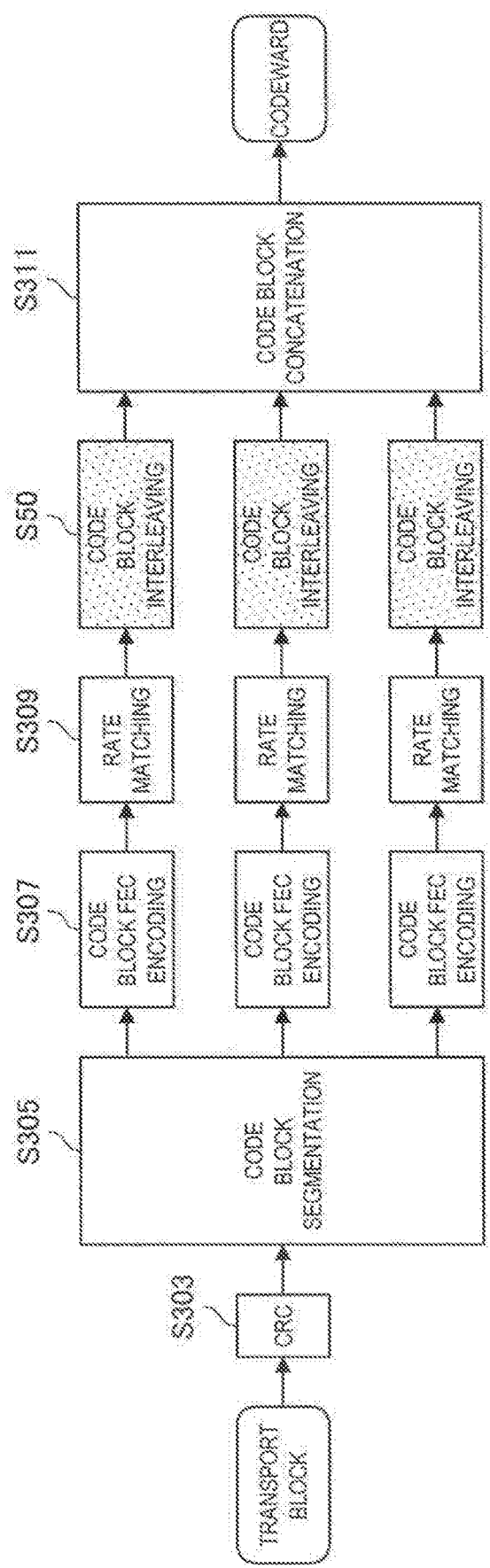
FIG. 22 is an explanatory diagram illustrating an example of interleaving according to a fourth embodiment.

FIG. 22 is an explanatory diagram illustrating an example of interleaving according to a fourth embodiment. Referring to FIG. 22, as described with reference to FIG. 3, after a transport block for a user is generated, the addition of CRC (S303), the code block segmentation (S305), the code block forward error correction (FEC) encoding (S307) which is channel coding, the rate matching (S309), the code block concatenation (S311), and the like are performed. In particular, in this example, after the code block segmentation (S305), the code block FEC encoding (S307), and the rate matching (S309) and before the code block concatenation (S311), the code blocks are interleaved using the interleaver unique to the user. For example, three code blocks corresponding to the same transport block are interleaved using the same interleaver.

Also, as in the example of FIG. 22, when the codeword is interleaved, for example, the interleaving (S313) of the codeword described with reference to FIG. 3 is not performed.

Further, for example, to match the lengths of the code blocks which are interleaving targets, bit padding or bit filtering for the transport block can be performed before the code block segmentation (S305). Alternatively, the bit padding or the bit filtering for the code blocks can be performed between the code block segmentation (S305) and the code block FEC encoding (S307).

(2) Concatenation/Bit Collection (a) Concatenation

For example, two or more code blocks to be interleaved are concatenated to generate a codeword.

(a-1) First Example

As a first example, c(i) which is the value of an i-th bit of an output sequence is expressed as follows.

$$c(i) = b_{i \bmod N_{CB}}\left(\text{floor}\left(\frac{i}{N_{CB}}\right)\right) \qquad [\text{Math. 5}]$$

$N_{CB}$ is the number of code blocks. Further, $b_j(k)$ is the value of a k-th bit in a bit sequence of a j-th code block. An index i is in the range of 0 to $L_{CB}N_{CB}-1$ and $L_{CB}$ is the length of a code block. Hereinafter, a specific example will be described with reference to FIG. 23.

Figure 23:
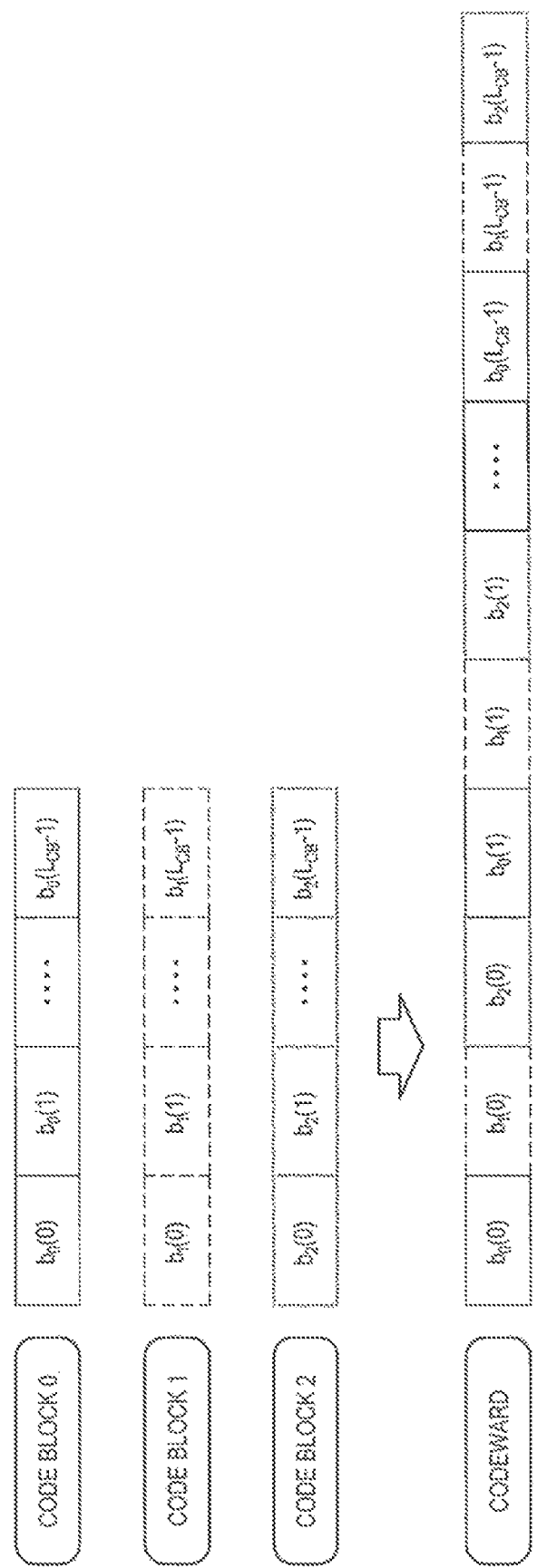
FIG. 23 is an explanatory diagram illustrating a first example of code block concatenation according to the fourth embodiment.

FIG. 23 is an explanatory diagram illustrating the first example of code block concatenation according to the fourth embodiment. Referring to FIG. 23, sequences of three code blocks (code blocks 0, 1, and 2) are illustrated. The sequences of the three code blocks are concatenated to generate a codeword. In the codeword, three bit sets including bits of code blocks 0, 1, and 2 are disposed in order. That is, in the codeword, the three bit sets including $b_0(k)$, $b_1(k)$, and $b_2(k)$ are disposed in order of the index k. The index k is in the range of 0 to $L_{CB}-1$.

(a-2) Second Example

As a second example, an output sequence c(i) may be expressed as follows.

$$c(i) = b_{\text{floor}\left(\frac{i}{L_{CB}}\right)}(i \bmod L_{CB}) \qquad [\text{Math. 6}]$$

As described above, $b_j(k)$ is the value of a k-th bit in a bit sequence of a j-th code block. $L_{CB}$ is the length of a code block. The index i is in the range of 0 to $L_{CB}N_{CB}-1$. $L_{CB}$ is the number of code blocks. Hereinafter, a specific example will be described with reference to FIG. 24.

Figure 24:
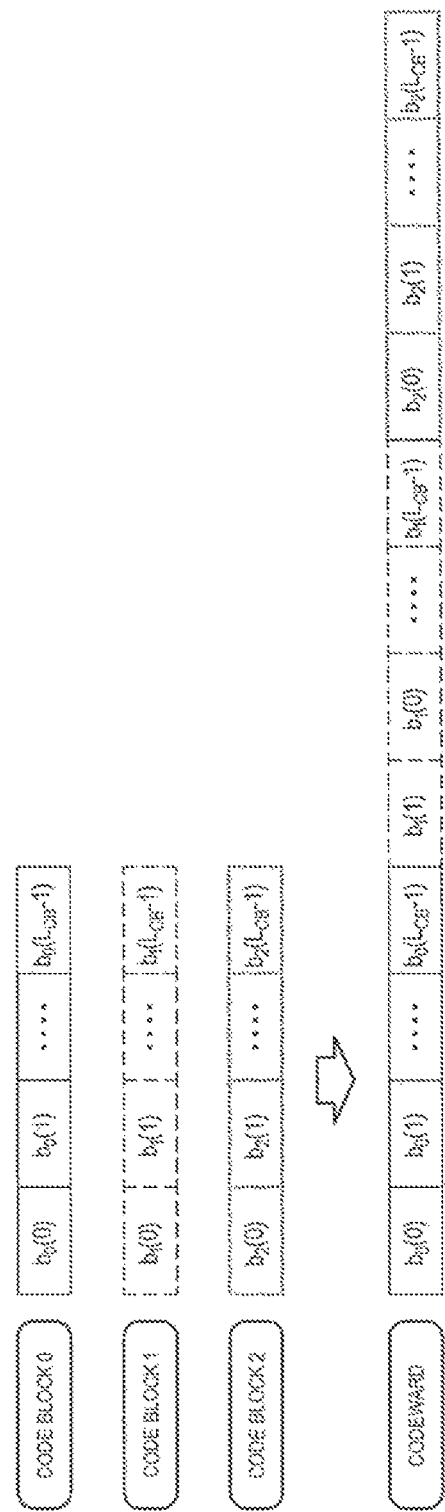
FIG. 24 is an explanatory diagram illustrating a second example of the code block concatenation according to the fourth embodiment.

FIG. 24 is an explanatory diagram illustrating the second example of the code block concatenation according to the fourth embodiment. Referring to FIG. 24, sequences of three code block (code blocks 0, 1, and 2) are illustrated. The three code blocks are concatenated to generate a codeword. In the codeword, code blocks 0, 1, and 2 are disposed in order.

(b) Bit Collection

Bit collection may be performed on the interleaved two or more code blocks. As a result, a codeword may be generated.

The bit collection may be bit collection of exclusive OR (XOR). In this case, c(i) which is the value of an i-th bit of an output sequence may be expressed as follows.

$$c(i) = \bigoplus_{j=0}^{N_{CB}-1} (b_j(i)) \qquad [\text{Math. 7}]$$

Here, $b_j(i)$ is the value of an i-th bit in the bit sequence of a j-th code block. $N_{CB}$ is the number of code blocks. The index i is in the range of 0 to $N_{CB}-1$ and $L_{CB}$ is the length of a code block. Hereinafter, a specific example will be described with reference to FIG. 25.

Figure 25:
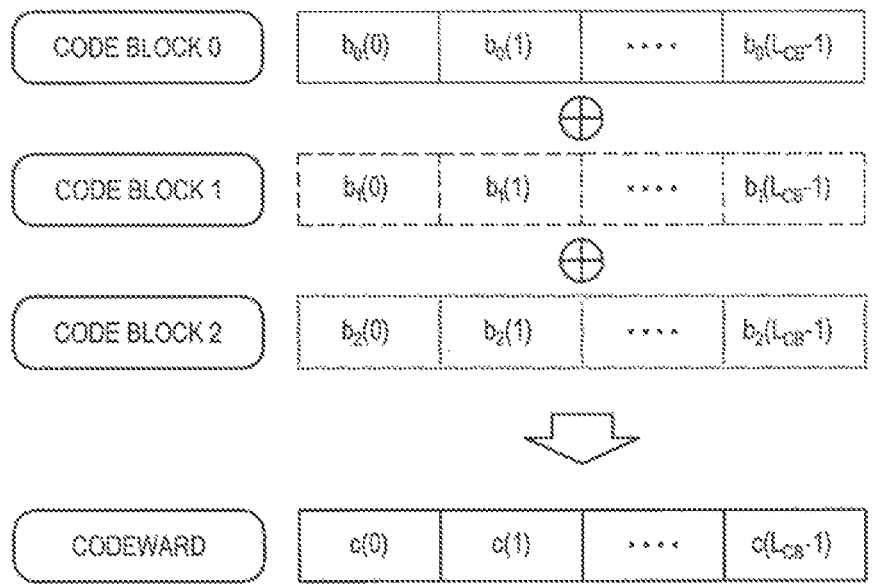
FIG. 25 is an explanatory diagram illustrating a bit collection example of a code block according to the fourth embodiment.

FIG. 25 is an explanatory diagram illustrating a bit collection example of a code block according to the fourth embodiment. Referring to FIG. 25, three code blocks (code blocks 0, 1, and 2) are illustrated. In this example, bit collection is performed by calculating XOR of the three code blocks. As a result, a sequence which has the same length as the length of the sequence of each code block is output.

(3) Flow of Process

Figure 26:
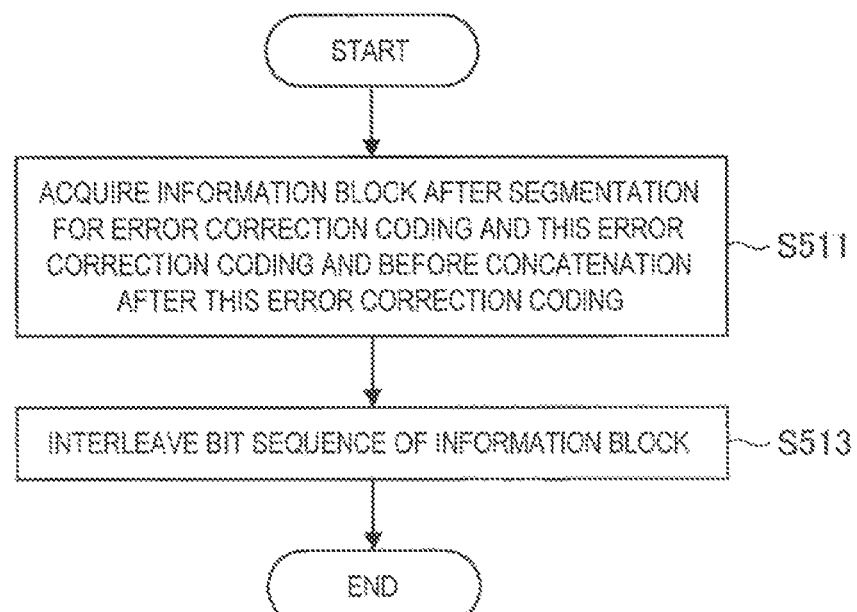
FIG. 26 is a flowchart illustrating an example of a schematic flow of a process according to the fourth embodiment.

FIG. 26 is a flowchart illustrating an example of a schematic flow of a process according to the fourth embodiment.

The information acquisition unit 151 acquires an information block generated from transmission data (for example, a transport block) for a user (S511). The information block is a block (for example, a code block) after segmentation for error correction coding and the error correction coding and before integration (for example, concatenation or bit collection) after the error correction coding.

The interleaving unit 153 interleaves a bit sequence of the information block using the interleaver unique to the user (S513). Then, the process ends.

(4) De-Interleaving

Also, the second radio communication apparatus 200 performs de-interleaving corresponding to the above-described interleaving in the first radio communication apparatus 100.

For example, the de-interleaving unit 253 de-interleaves a received bit sequence using a de-interleaver corresponding to an interleaver unique to a user. For example, the received bit sequence is a bit sequence of a code block before error correction decoding. As a result of the de-interleaving on the received bit sequence, a bit sequence of the code block before the error correction decoding is generated.

<7.3. Technical Features>

(1) Interleaving

As described above, in the fourth embodiment, the information acquisition unit 151 acquires an information block generated from transmission data for a user. The interleaving unit 153 interleaves a bit sequence of the information block using an interleaver unique to the user. In particular, the information block is a block after segmentation for error correction coding and the error correction coding and before integration after the error correction coding.

(a) Transmission Data

The first radio communication apparatus 100 may also be a base station and the transmission data may also be transmission data destined for the user. Alternatively, the first radio communication apparatus 100 may also be a terminal apparatus of the user and the transmission data may be transmission data from the user.

For example, the transmission data is a transport block.

(b) Information Block

For example, the information block is a code block. For example, the segmentation for the error correction coding is code block segmentation. For example, the integration after the error correction coding is concatenation or bit collection of exclusive OR. For example, the concatenation is code block concatenation.

(c) Interleaving (c-1) Interleaver

For example, the interleaver unique to the user is an interleaver which has a length of a power of two.

For example, the interleaver unique to the user is an interleaver which can be generated in each of a transmitter and a receiver (in other words, an interleaver which can be generated based on a calculation equation). For example, the interleaver unique to the user is a DI. As another example, the interleaver unique to the user may be an LCI. Also, the interleaver unique to the user is not limited to the examples.

The interleaver unique to the user may be an interleaver unique to a cell, a unit block larger than the information block, or a link direction. The unit block may be the transmission data (for example, a transport block) or may be a codeword. Alternatively, the interleaver may be an interleaver which is not unique to the unit block and is unique to the information block (for example, a code block).

(c-2) Information Block Corresponding to Same Unit Block

For example, the interleaving unit 153 interleaves bit sequences of two or more information blocks (for example, two or more code blocks) corresponding to the same unit block (for example, the same transport block or the same codeword) using the same interleaver. Alternatively, the interleaving unit 153 may interleave a bit sequence of an information block (for example, a code block) using an interleaver unique to the information block.

For example, the same unit block is the same transport block or the same codeword.

Referring back to FIG. 22, for example, the interleaving unit 153 interleaves three codewords using the same interleaver unique to a user.

As described above, the interleaving unit 153 interleaves the bit sequence of the information block. Thus, for example, it is possible to further narrow the range of the length of the bit sequence which is the interleaving target in the IDMA system. More specifically, for example, the bit sequence which is an interleaving target is not a bit sequence of a codeword but a bit sequence of a code block, and a range of the length of the bit sequence which is an interleaving target is narrowed.

Also, in the fourth embodiment, for example, a process (for example, MUD and ESE) on a reception side can be performed in a code block unit rather than a codeword unit. As a result, it is possible to decrease latency of demodulation, decoding, and the like.

(2) De-Interleaving

The information acquisition unit 251 acquires a received bit sequence. The de-interleaving unit 253 generates a bit sequence of an information block by de-interleaving the received bit sequence using a de-interleaver corresponding to an interleaver unique to a user. The information block is a block after segmentation for error correction decoding and before the error correction decoding.

(a) Information Block

For example, the information block is a code block. For example, the segmentation for the error correction decoding is code block deconcatenation.

(b) Received Bit Sequence

For example, the received bit sequence is a sequence received in a subframe. For example, the received bit sequence is a sequence after segmentation for error correction decoding (for example, code block deconcatenation) and before the error correction decoding.

(c) De-Interleaving (c-1) De-Interleaver

For example, the interleaver unique to the user is an interleaver which has a length of a power of two. The description of the interleaver is the same as the above description. Accordingly, the repeated description thereof will be omitted here.

For example, the de-interleaver also has a length of a power of two.

(c-2) Information Block Corresponding to Same Unit Block

For example, the de-interleaving unit 253 interleaves two or more received bit sequences corresponding to the same unit block using the same de-interleaver.

For example, the same unit block is the same transport block or the same codeword.

The fourth embodiment has been described above. The technical features according to the fourth embodiment may also be applied to the first to third embodiments.

8. Fifth Embodiment

Next, a fifth embodiment of the present disclosure will be described.

<8.1. Overview>

(1) Technical Problem

For example, in the IDMA system, a bit sequence is interleaved using an interleaver unique to a user. As the interleaver, there is an interleaver which can be generated in each of a transmitter and a receiver (in other words, an interleaver which can be generated based on a calculation equation). For example, the interleaver is a DI.

However, even when a DI is an interleaver unique to any user, the first bit in an input bit sequence is output as the first bit in an output bit sequence. As a result, BLER can deteriorate.

Also, even when an interleaver (for example, an LCI) which can be generated based on a calculation equation is used, the same can occur.

Accordingly, it is desirable to provide a structure that makes it possible to reduce overlap of values of interleavers between users in the IDMA system.

(2) Technical Means

In the fifth embodiment, the interleaving unit 153 interleaves a bit sequence of an information block generated from transmission data for a user using an interleaver generated based on a predetermined calculation equation and unique to the user. In particular, the predetermined calculation equation includes a shift value according to identification information regarding the user.

Thus, for example, in the IDMA system, it is possible to reduce overlap of the values of the interleavers between the users.

<8.2. Technical Features>

For example, the interleaving unit 153 acquires an interleaver generated based on a predetermined calculation equation and unique to a user. The interleaving unit 153 interleaves a bit sequence of an information block generated from transmission data for the user using the interleaver. In particular, as described above, the predetermined calculation equation includes a shift value according to identification information regarding a user. The identification information may be an RNTI.

(1) DI with Shift

As one example, the interleaver is a DI with a shift and is expressed as follows.

$$I(m)=((2k+1)m(m+1)/2+S(k)) \bmod N \qquad \text{[Math. 8]}$$

The calculation equation is an equation in which $S(k)$ is added to a normal calculation equation for a DI, as described above. Here, k is a user ID and $S(k)$ is a shift value according to the user ID. Because of addition of $S(k)$, $I(0)$ differs according to a user. The user ID may be an RNTI.

(b) LCI with Shift

As another example, the interleaver may be an LCI with a shift or may be expressed as follows.

$$I(m)=(aI(m-1)+b+S(k)) \bmod N$$

$$I(0) \in \{0, N-1\} \qquad \text{[Math. 9]}$$

The calculation equation is an equation in which $S(k)$ is added to a normal calculation equation for an LCI, as described above. Here, k is a user ID and $S(k)$ is a shift value according to the user ID. Because of addition of $S(k)$, $I(1)$ differs according to a user. The user ID may be an RNTI.

(c) Others

For example, the transmission data is a transport block.

For example, the information block is a codeword. Alternatively, the information block may be a code block.

The fifth embodiment has been described above. The technical features according to the fifth embodiment may also be applied to the first to fourth embodiments.

9. Application Examples

The technology of an embodiment of the present disclosure is applicable to various products. For example, the radio communication apparatus (the first radio communication apparatus 100 or the second radio communication apparatus 200) may be realized as any type of evolved Node B (eNB) such as a macro eNB or a small eNB. A small eNB may be an eNB that covers a cell smaller than a macro cell, such as a pico eNB, micro eNB, or home (femto) eNB. Instead, the radio communication apparatus may be realized as any other types of base stations such as a NodeB and a base transceiver station (BTS). The radio communication apparatus may include a main body (that is also referred to as a base station apparatus) configured to control radio communication, and one or more remote radio heads (RRH) disposed in a different place from the main body. Additionally, various types of terminals to be discussed later may also operate as the radio communication apparatus by temporarily or semi-permanently executing a base station function. Furthermore, at least a part of elements of the radio communication apparatus may be realized in the base station apparatus or a module for the base station apparatus.

For example, the radio communication apparatus (the first radio communication apparatus 100 or the second radio communication apparatus 200) may be realized as a mobile terminal such as a smartphone, a tablet personal computer (PC), a notebook PC, a portable game terminal, a portable/dongle type mobile router, and a digital camera, or an in-vehicle terminal such as a car navigation apparatus. The radio communication apparatus may also be realized as a terminal (that is also referred to as a machine type communication (MTC) terminal) that performs machine-to-machine (M2M) communication. Furthermore, at least a part of elements of the radio communication apparatus may be realized in a module (such as an integrated circuit module including a single die) mounted on each of the terminals.

(First Application Example)

Figure 27:
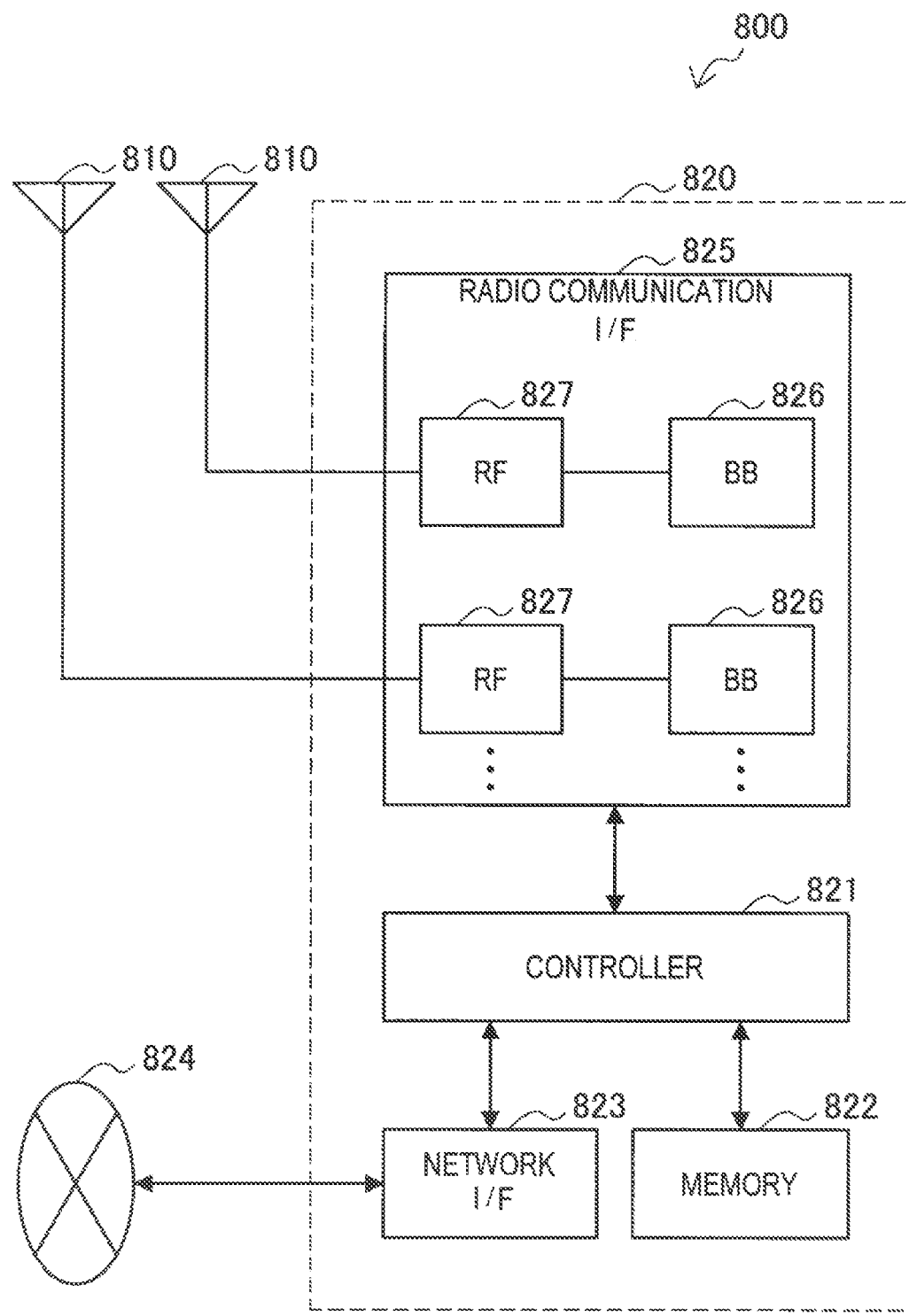
FIG. 27 is a block diagram illustrating a first example of a schematic configuration of an eNB.

FIG. 27 is a block diagram illustrating a first example of a schematic configuration of an eNB to which the technology of an embodiment of the present disclosure may be applied. An eNB 800 includes one or more antennas 810 and a base station apparatus 820. Each antenna 810 and the base station apparatus 820 may be connected to each other via an RF cable.

Each of the antennas 810 includes a single or multiple antenna elements (such as multiple antenna elements included in an MIMO antenna), and is used for the base station apparatus 820 to transmit and receive radio signals. The eNB 800 may include the multiple antennas 810, as illustrated in FIG. 27. For example, the multiple antennas 810 may be compatible with multiple frequency bands used by the eNB 800. Although FIG. 27 illustrates the example in which the eNB 800 includes the multiple antennas 810, the eNB 800 may also include a single antenna 810.

The base station apparatus 820 includes a controller 821, a memory 822, a network interface 823, and a radio communication interface 825.

The controller 821 may be, for example, a CPU or a DSP, and operates various functions of a higher layer of the base station apparatus 820. For example, the controller 821 generates a data packet from data in signals processed by the radio communication interface 825, and transfers the generated packet via the network interface 823. The controller 821 may bundle data from multiple base band processors to generate the bundled packet, and transfer the generated bundled packet. The controller 821 may have logical functions of performing control such as radio resource control, radio bearer control, mobility management, admission control, and scheduling. The control may be performed in corporation with an eNB or a core network node in the vicinity. The memory 822 includes RAM and ROM, and stores a program that is executed by the controller 821, and various types of control data (such as a terminal list, transmission power data, and scheduling data).

The network interface 823 is a communication interface for connecting the base station apparatus 820 to a core network 824. The controller 821 may communicate with a core network node or another eNB via the network interface 823. In that case, the eNB 800, and the core network node or the other eNB may be connected to each other through a logical interface (such as an S1 interface and an X2 interface). The network interface 823 may also be a wired communication interface or a radio communication interface for radio backhaul. If the network interface 823 is a radio communication interface, the network interface 823 may use a higher frequency band for radio communication than a frequency band used by the radio communication interface 825.

The radio communication interface 825 supports any cellular communication scheme such as Long Term Evolution (LTE) and LTE-Advanced, and provides radio connection to a terminal positioned in a cell of the eNB 800 via the antenna 810. The radio communication interface 825 may typically include, for example, a baseband (BB) processor 826 and an RF circuit 827. The BB processor 826 may perform, for example, encoding/decoding, modulating/demodulating, and multiplexing/demultiplexing, and performs various types of signal processing of layers (such as L1, medium access control (MAC), radio link control (RLC), and a packet data convergence protocol (PDCP)). The BB processor 826 may have a part or all of the above-described logical functions instead of the controller 821. The BB processor 826 may be a memory that stores a communication control program, or a module that includes a processor and a related circuit configured to execute the program. Updating the program may allow the functions of the BB processor 826 to be changed. The module may be a card or a blade that is inserted into a slot of the base station apparatus 820. Alternatively, the module may also be a chip that is mounted on the card or the blade. Meanwhile, the RF circuit 827 may include, for example, a mixer, a filter, and an amplifier, and transmits and receives radio signals via the antenna 810.

The radio communication interface 825 may include the multiple BB processors 826, as illustrated in FIG. 27. For example, the multiple BB processors 826 may be compatible with multiple frequency bands used by the eNB 800. The radio communication interface 825 may include the multiple RF circuits 827, as illustrated in FIG. 27. For example, the multiple RF circuits 827 may be compatible with multiple antenna elements. Although FIG. 27 illustrates the example in which the radio communication interface 825 includes the multiple BB processors 826 and the multiple RF circuits 827, the radio communication interface 825 may also include a single BB processor 826 or a single RF circuit 827.

In the eNB 800 illustrated in FIG. 27, the information acquisition unit 151 and the interleaving unit 153 described with reference to FIG. 2 may be mounted on the radio communication interface 825. As one example, a module that includes a part (for example, the BB processor 826) or all of the radio communication interface 825 may be mounted on the eNB 800, and the information acquisition unit 151 and the interleaving unit 153 may be mounted on the module. In this case, the module may store a program causing a processor to function as the information acquisition unit 151 and the interleaving unit 153 (in other words, a program causing a processor to execute operations of the information acquisition unit 151 and the interleaving unit 153) and may execute the program. As another example, a program causing a processor to function as the information acquisition unit 151 and the interleaving unit 153 may be installed in the eNB 800 and the radio communication interface 825 (for example, the BB processor 826) may execute the program. As described above, as an apparatus that includes the information acquisition unit 151 and the interleaving unit 153, the eNB 800, the base station apparatus 820, or the module may be provided or a program causing a processor to function as the information acquisition unit 151 and the interleaving unit 153 may be provided. Further, a readable recording medium that records the program may be provided. For these points, the information acquisition unit 251 and the de-interleaving unit 253 described with reference to FIG. 5 are the same as the information acquisition unit 151 and the interleaving unit 153.

Furthermore, in the eNB 800 illustrated in FIG. 27, the radio communication unit 120 described by using FIG. 2 may be implemented by the radio communication interface 825 (e.g., the RF circuit 827). Further, the antenna 110 may also be implemented by the antenna 810. For this point, the antenna unit 210 and the radio communication unit 220 described with reference to FIG. 5 are the same as the antenna unit 110 and the radio communication unit 120.

(Second Application Example)

Figure 28:
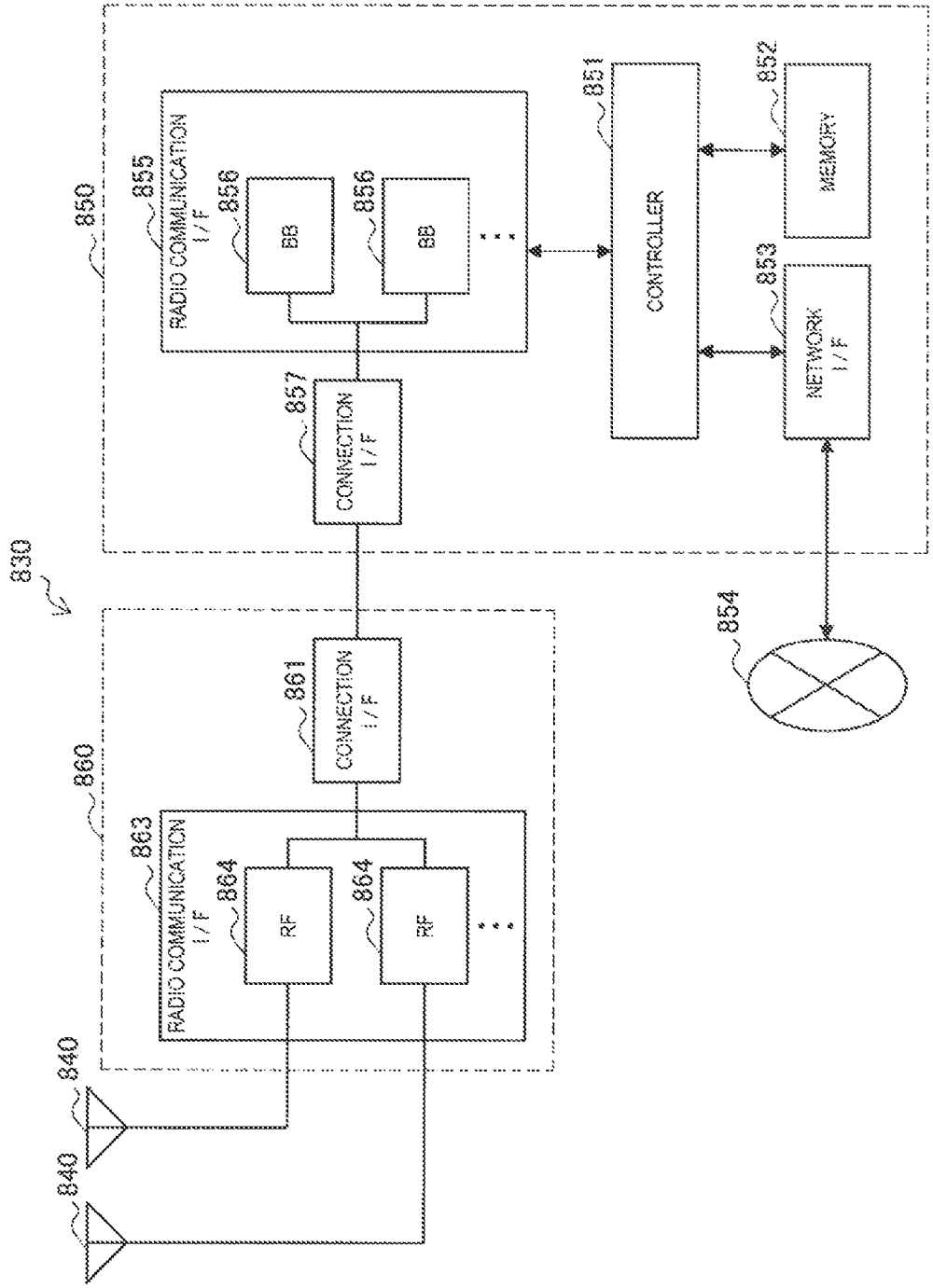
FIG. 28 is a block diagram illustrating a second example of a schematic configuration of an eNB.

FIG. 28 is a block diagram illustrating a second example of a schematic configuration of an eNB to which the technology of an embodiment of the present disclosure may be applied. An eNB 830 includes one or more antennas 840, a base station apparatus 850, and an RRH 860. Each antenna 840 and the RRH 860 may be connected to each other via an RF cable. The base station apparatus 850 and the RRH 860 may be connected to each other via a high speed line such as an optical fiber cable.

Each of the antennas 840 includes a single or multiple antenna elements (such as multiple antenna elements included in an MIMO antenna), and is used for the RRH 860 to transmit and receive radio signals. The eNB 830 may include the multiple antennas 840, as illustrated in FIG. 28. For example, the multiple antennas 840 may be compatible with multiple frequency bands used by the eNB 830. Although FIG. 28 illustrates the example in which the eNB 830 includes the multiple antennas 840, the eNB 830 may also include a single antenna 840.

The base station apparatus 850 includes a controller 851, a memory 852, a network interface 853, a radio communication interface 855, and a connection interface 857. The controller 851, the memory 852, and the network interface 853 are the same as the controller 821, the memory 822, and the network interface 823 described with reference to FIG. 27.

The radio communication interface 855 supports any cellular communication scheme such as LTE and LTE-Advanced, and provides radio communication to a terminal positioned in a sector corresponding to the RRH 860 via the RRH 860 and the antenna 840. The radio communication interface 855 may typically include, for example, a BB processor 856. The BB processor 856 is the same as the BB processor 826 described with reference to FIG. 27, except the BB processor 856 is connected to the RF circuit 864 of the RRH 860 via the connection interface 857. The radio communication interface 855 may include the multiple BB processors 856, as illustrated in FIG. 28. For example, the multiple BB processors 856 may be compatible with multiple frequency bands used by the eNB 830. Although FIG. 28 illustrates the example in which the radio communication interface 855 includes the multiple BB processors 856, the radio communication interface 855 may also include a single BB processor 856.

The connection interface 857 is an interface for connecting the base station apparatus 850 (radio communication interface 855) to the RRH 860. The connection interface 857 may also be a communication module for communication in the above-described high speed line that connects the base station apparatus 850 (radio communication interface 855) to the RRH 860.

The RRH 860 includes a connection interface 861 and a radio communication interface 863.

The connection interface 861 is an interface for connecting the RRH 860 (radio communication interface 863) to the base station apparatus 850. The connection interface 861 may also be a communication module for communication in the above-described high speed line.

The radio communication interface 863 transmits and receives radio signals via the antenna 840. The radio communication interface 863 may typically include, for example, the RF circuit 864. The RF circuit 864 may include, for example, a mixer, a filter, and an amplifier, and transmits and receives radio signals via the antenna 840. The radio communication interface 863 may include multiple RF circuits 864, as illustrated in FIG. 28. For example, the multiple RF circuits 864 may support multiple antenna elements. Although FIG. 28 illustrates the example in which the radio communication interface 863 includes the multiple RF circuits 864, the radio communication interface 863 may also include a single RF circuit 864.

In the eNB 830 illustrated in FIG. 28, the information acquisition unit 151 and the interleaving unit 153 described with reference to FIG. 2 may be mounted on the radio communication interface 855 or the radio communication interface 863. As one example, a module that includes a part (for example, the BB processor 856) or all of the radio communication interface 855 may be mounted on the eNB 830, and the information acquisition unit 151 and the interleaving unit 153 may be mounted on the module. In this case, the module may store a program causing a processor to function as the information acquisition unit 151 and the interleaving unit 153 (in other words, a program causing a processor to execute operations of the information acquisition unit 151 and the interleaving unit 153) and may execute the program. As another example, a program causing a processor to function as the information acquisition unit 151 and the interleaving unit 153 may be installed in the eNB 830 and the radio communication interface 855 (for example, the BB processor 856) may execute the program. As described above, as an apparatus that includes the information acquisition unit 151 and the interleaving unit 153, the eNB 830, the base station apparatus 820, or the module may be provided or a program causing a processor to function as the information acquisition unit 151 and the interleaving unit 153 may be provided. Further, a readable recording medium that records the program may be provided. For these points, the information acquisition unit 251 and the de-interleaving unit 253 described with reference to FIG. 5 are the same as the information acquisition unit 151 and the interleaving unit 153.

Furthermore, in the eNB 830 illustrated in FIG. 28, the radio communication unit 120 described by using, for example, FIG. 2 may be implemented by the radio communication interface 863 (e.g., the RF circuit 864). Further, the antenna 110 may also be implemented by the antenna 840. For this point, the antenna unit 210 and the radio communication unit 220 described with reference to FIG. 5 are the same as the antenna unit 110 and the radio communication unit 120.

(Third Application Example)

Figure 29:
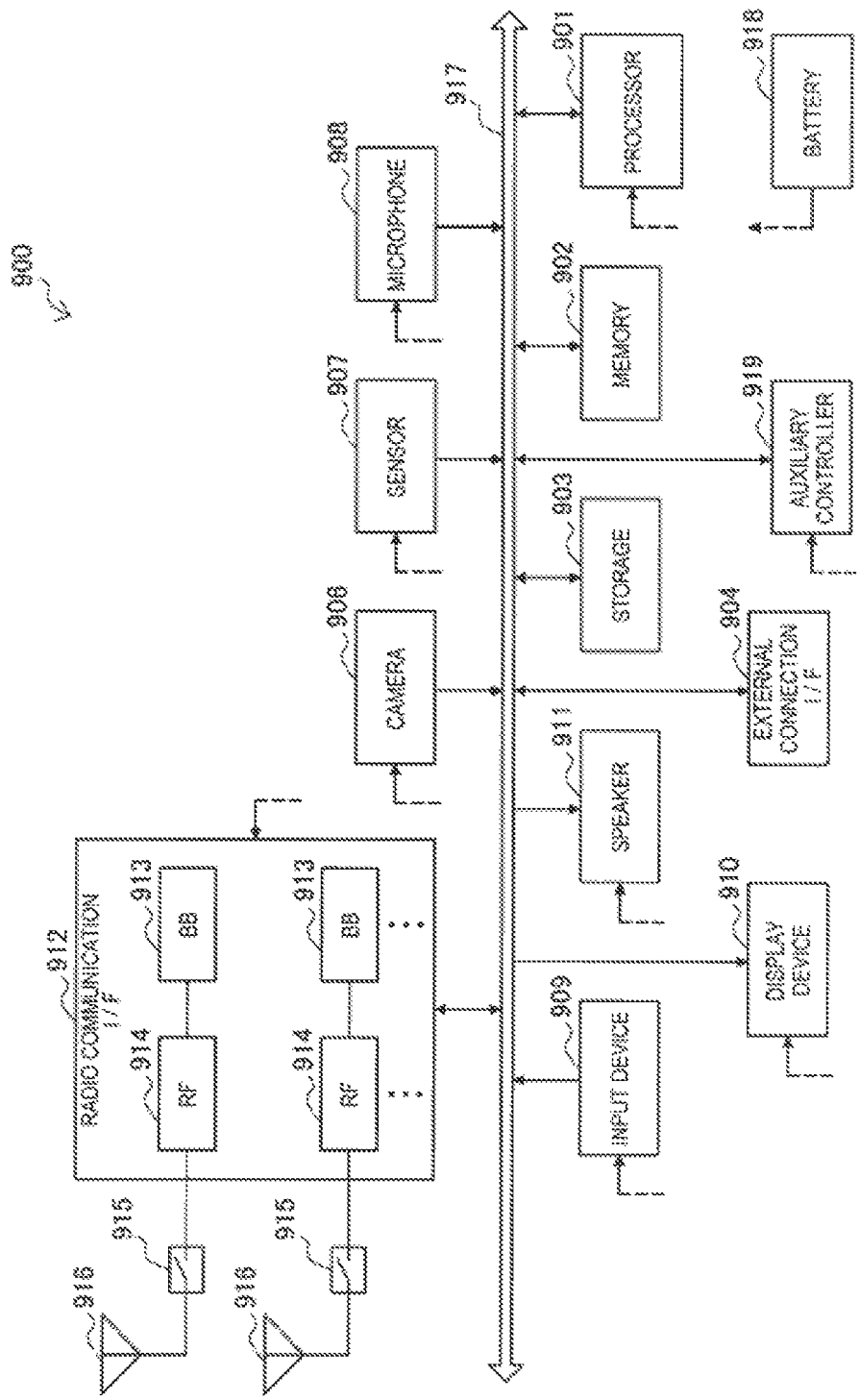
FIG. 29 is a block diagram illustrating an example of a schematic configuration of a smartphone.

FIG. 29 is a block diagram illustrating an example of a schematic configuration of a smartphone 900 to which the technology of an embodiment of the present disclosure may be applied. The smartphone 900 includes a processor 901, a memory 902, a storage 903, an external connection interface 904, a camera 906, a sensor 907, a microphone 908, an input device 909, a display device 910, a speaker 911, a radio communication interface 912, one or more antenna switches 915, one or more antennas 916, a bus 917, a battery 918, and an auxiliary controller 919.

The processor 901 may be, for example, a CPU or a system on a chip (SoC), and controls functions of an application layer and another layer of the smartphone 900. The memory 902 includes RAM and ROM, and stores a program that is executed by the processor 901, and data. The storage 903 may include a storage medium such as a semiconductor memory and a hard disk. The external connection interface 904 is an interface for connecting an external device such as a memory card and a universal serial bus (USB) device to the smartphone 900.

The camera 906 includes an image sensor such as a charge coupled device (CCD) and a complementary metal oxide semiconductor (CMOS), and generates a captured image. The sensor 907 may include a group of sensors such as a measurement sensor, a gyro sensor, a geomagnetic sensor, and an acceleration sensor. The microphone 908 converts sounds that are input to the smartphone 900 to audio signals. The input device 909 includes, for example, a touch sensor configured to detect touch onto a screen of the display device 910, a keypad, a keyboard, a button, or a switch, and receives an operation or an information input from a user. The display device 910 includes a screen such as a liquid crystal display (LCD) and an organic light-emitting diode (OLED) display, and displays an output image of the smartphone 900. The speaker 911 converts audio signals that are output from the smartphone 900 to sounds.

The radio communication interface 912 supports any cellular communication scheme such as LTE and LTE-Advanced, and performs radio communication. The radio communication interface 912 may typically include, for example, a BB processor 913 and an RF circuit 914. The BB processor 913 may perform, for example, encoding/decoding, modulating/demodulating, and multiplexing/demultiplexing, and performs various types of signal processing for radio communication. Meanwhile, the RF circuit 914 may include, for example, a mixer, a filter, and an amplifier, and transmits and receives radio signals via the antenna 916. The radio communication interface 913 may also be a one chip module that has the BB processor 913 and the RF circuit 914 integrated thereon. The radio communication interface 912 may include the multiple BB processors 913 and the multiple RF circuits 914, as illustrated in FIG. 29. Although FIG. 29 illustrates the example in which the radio communication interface 913 includes the multiple BB processors 913 and the multiple RF circuits 914, the radio communication interface 912 may also include a single BB processor 913 or a single RF circuit 914.

Furthermore, in addition to a cellular communication scheme, the radio communication interface 912 may support another type of radio communication scheme such as a short-distance wireless communication scheme, a near field communication scheme, and a radio local area network (LAN) scheme. In that case, the radio communication interface 912 may include the BB processor 913 and the RF circuit 914 for each radio communication scheme.

Each of the antenna switches 915 switches connection destinations of the antennas 916 among multiple circuits (such as circuits for different radio communication schemes) included in the radio communication interface 912.

Each of the antennas 916 includes a single or multiple antenna elements (such as multiple antenna elements included in an MIMO antenna), and is used for the radio communication interface 912 to transmit and receive radio signals. The smartphone 900 may include the multiple antennas 916, as illustrated in FIG. 29. Although FIG. 29 illustrates the example in which the smartphone 900 includes the multiple antennas 916, the smartphone 900 may also include a single antenna 916.

Furthermore, the smartphone 900 may include the antenna 916 for each radio communication scheme. In that case, the antenna switches 915 may be omitted from the configuration of the smartphone 900.

The bus 917 connects the processor 901, the memory 902, the storage 903, the external connection interface 904, the camera 906, the sensor 907, the microphone 908, the input device 909, the display device 910, the speaker 911, the radio communication interface 912, and the auxiliary controller 919 to each other. The battery 918 supplies power to blocks of the smartphone 900 illustrated in FIG. 29 via feeder lines, which are partially shown as dashed lines in the figure. The auxiliary controller 919 operates a minimum necessary function of the smartphone 900, for example, in a sleep mode.

In the smartphone 900 illustrated in FIG. 29, the information acquisition unit 151 and the interleaving unit 153 described with reference to FIG. 2 may be mounted on the radio communication interface 912. As one example, a module that includes a part (for example, the BB processor 913) or all of the radio communication interface 912 may be mounted on the smartphone 900, and the information acquisition unit 151 and the interleaving unit 153 may be mounted on the module. In this case, the module may store a program causing a processor to function as the information acquisition unit 151 and the interleaving unit 153 (in other words, a program causing a processor to execute operations of the information acquisition unit 151 and the interleaving unit 153) and may execute the program. As another example, a program causing a processor to function as the information acquisition unit 151 and the interleaving unit 153 may be installed in the smartphone 900 and the radio communication interface 912 (for example, the BB processor 913) may execute the program. As described above, as an apparatus that includes the information acquisition unit 151 and the interleaving unit 153, the smartphone 900, or the module may be provided or a program causing a processor to function as the information acquisition unit 151 and the interleaving unit 153 may be provided. Further, a readable recording medium that records the program may be provided. For these points, the information acquisition unit 251 and the de-interleaving unit 253 described with reference to FIG. 5 are the same as the information acquisition unit 151 and the interleaving unit 153.

Furthermore, in the smartphone 900 illustrated in FIG. 29, the radio communication unit 120 described by using FIG. 2 may be implemented by the radio communication interface 912 (e.g., the RF circuit 914). Further, the antenna 110 may also be implemented by the antenna 916. For this point, the antenna unit 210 and the radio communication unit 220 described with reference to FIG. 5 are the same as the antenna unit 110 and the radio communication unit 120.

(Fourth Application Example)

Figure 30:
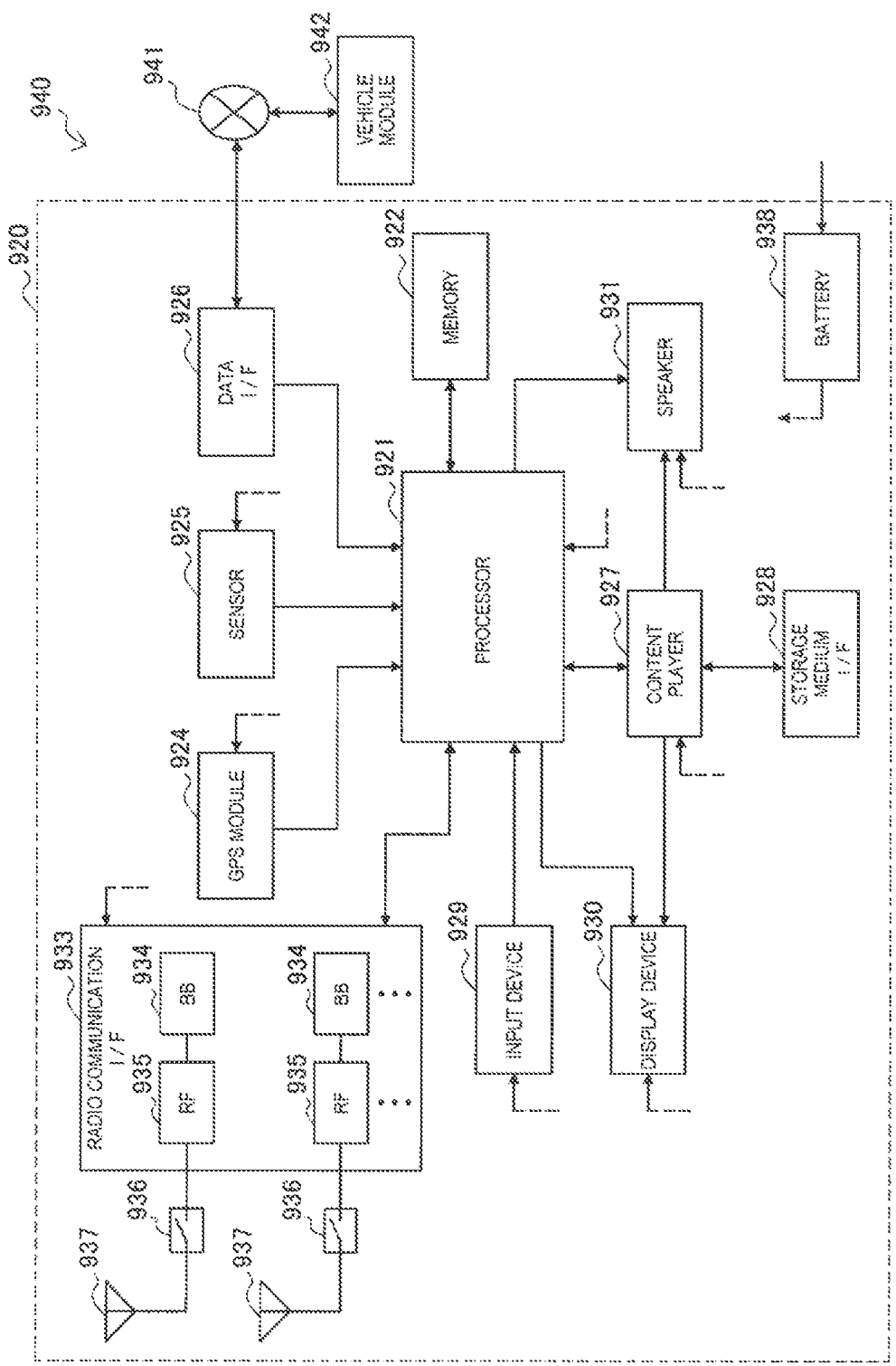
FIG. 30 is a block diagram illustrating an example of a schematic configuration of a car navigation device.

FIG. 30 is a block diagram illustrating an example of a schematic configuration of a car navigation apparatus 920 to which the technology of an embodiment of the present disclosure may be applied. The car navigation apparatus 920 includes a processor 921, a memory 922, a global positioning system (GPS) module 924, a sensor 925, a data interface 926, a content player 927, a storage medium interface 928, an input device 929, a display device 930, a speaker 931, a radio communication interface 933, one or more antenna switches 936, one or more antennas 937, and a battery 938.

The processor 921 may be, for example, a CPU or a SoC, and controls a navigation function and another function of the car navigation apparatus 920. The memory 922 includes RAM and ROM, and stores a program that is executed by the processor 921, and data.

The GPS module 924 uses GPS signals received from a GPS satellite to measure a position (such as latitude, longitude, and altitude) of the car navigation apparatus 920. The sensor 925 may include a group of sensors such as a gyro sensor, a geomagnetic sensor, and a barometric sensor. The data interface 926 is connected to, for example, an in-vehicle network 941 via a terminal that is not shown, and acquires data generated by the vehicle, such as vehicle speed data.

The content player 927 reproduces content stored in a storage medium (such as a CD and a DVD) that is inserted into the storage medium interface 928. The input device 929 includes, for example, a touch sensor configured to detect touch onto a screen of the display device 930, a button, or a switch, and receives an operation or an information input from a user. The display device 930 includes a screen such as a LCD or an OLED display, and displays an image of the navigation function or content that is reproduced. The speaker 931 outputs sounds of the navigation function or the content that is reproduced.

The radio communication interface 933 supports any cellular communication scheme such as LET and LTE-Advanced, and performs radio communication. The radio communication interface 933 may typically include, for example, a BB processor 934 and an RF circuit 935. The BB processor 934 may perform, for example, encoding/decoding, modulating/demodulating, and multiplexing/demultiplexing, and performs various types of signal processing for radio communication. Meanwhile, the RF circuit 935 may include, for example, a mixer, a filter, and an amplifier, and transmits and receives radio signals via the antenna 937. The radio communication interface 933 may be a one chip module having the BB processor 934 and the RF circuit 935 integrated thereon. The radio communication interface 933 may include the multiple BB processors 934 and the multiple RF circuits 935, as illustrated in FIG. 30. Although FIG. 30 illustrates the example in which the radio communication interface 933 includes the multiple BB processors 934 and the multiple RF circuits 935, the radio communication interface 933 may also include a single BB processor 934 or a single RF circuit 935.

Furthermore, in addition to a cellular communication scheme, the radio communication interface 933 may support another type of radio communication scheme such as a short-distance wireless communication scheme, a near field communication scheme, and a radio LAN scheme. In that case, the radio communication interface 933 may include the BB processor 934 and the RF circuit 935 for each radio communication scheme.

Each of the antenna switches 936 switches connection destinations of the antennas 937 among multiple circuits (such as circuits for different radio communication schemes) included in the radio communication interface 933.

Each of the antennas 937 includes a single or multiple antenna elements (such as multiple antenna elements included in an MIMO antenna), and is used for the radio communication interface 933 to transmit and receive radio signals. The car navigation apparatus 920 may include the multiple antennas 937, as illustrated in FIG. 30. Although FIG. 30 illustrates the example in which the car navigation apparatus 920 includes the multiple antennas 937, the car navigation apparatus 920 may also include a single antenna 937.

Furthermore, the car navigation apparatus 920 may include the antenna 937 for each radio communication scheme. In that case, the antenna switches 936 may be omitted from the configuration of the car navigation apparatus 920.

The battery 938 supplies power to blocks of the car navigation apparatus 920 illustrated in FIG. 30 via feeder lines that are partially shown as dashed lines in the figure. The battery 938 accumulates power supplied from the vehicle.

In the car navigation apparatus 920 illustrated in FIG. 30, the information acquisition unit 151 and the interleaving unit 153 described with reference to FIG. 2 may be mounted on the radio communication interface 933. As one example, a module that includes a part (for example, the BB processor 934) or all of the radio communication interface 933 may be mounted on the car navigation apparatus 920, and the information acquisition unit 151 and the interleaving unit 153 may be mounted on the module. In this case, the module may store a program causing a processor to function as the information acquisition unit 151 and the interleaving unit 153 (in other words, a program causing a processor to execute operations of the information acquisition unit 151 and the interleaving unit 153) and may execute the program. As another example, a program causing a processor to function as the information acquisition unit 151 and the interleaving unit 153 may be installed in the car navigation apparatus 920 and the radio communication interface 933 (for example, the BB processor 934) may execute the program. As described above, as an apparatus that includes the information acquisition unit 151 and the interleaving unit 153, the car navigation apparatus 920, or the module may be provided or a program causing a processor to function as the information acquisition unit 151 and the interleaving unit 153 may be provided. Further, a readable recording medium that records the program may be provided. For these points, the information acquisition unit 251 and the de-interleaving unit 253 described with reference to FIG. 5 are the same as the information acquisition unit 151 and the interleaving unit 153.

Furthermore, in the car navigation apparatus 920 illustrated in FIG. 30, the radio communication unit 120 described by using FIG. 2 may be implemented by the radio communication interface 933 (e.g., the RF circuit 935). Further, the antenna 110 may also be implemented by the antenna 937. For this point, the antenna unit 210 and the radio communication unit 220 described with reference to FIG. 5 are the same as the antenna unit 110 and the radio communication unit 120.

The technology of an embodiment of the present disclosure may also be realized as an in-vehicle system (or a vehicle) 940 including one or more blocks of the car navigation apparatus 920, the in-vehicle network 941, and a vehicle module 942. That is, the in-vehicle system (or a vehicle) 940 may be provided as an apparatus including the information acquisition unit 151 and the interleaving unit 153 (or the information acquisition unit 251 and the de-interleaving unit 253). The vehicle module 942 generates vehicle data such as vehicle speed, engine speed, and trouble information, and outputs the generated data to the in-vehicle network 941.

10. Conclusion

The apparatuses and the processes according to the embodiments of the present disclosure have been described above with reference to FIGS. 1 to 30.

(1) First Embodiment

According to the first embodiment, the first radio communication apparatus 100 includes the information acquisition unit 151 that acquires an information block generated from transmission data for a user and subjected to error correction coding and the interleaving unit 153 that interleaves a bit sequence of the information block using an interleaver unique to the user. In particular, the interleaving unit 153 interleaves the bit sequence by interleaving two or more partial sequences obtained from the bit sequence.

Furthermore, in the first embodiment, each of the two or more partial sequences is included in the bit sequence and does not overlap the other of the two or more partial sequences.

Thus, for example, it is possible to transmit data more flexibly and with a lesser burden in the IDMA system. More specifically, for example, in the IDMA system, it is possible to transmit a bit sequence which has any length without transmitting and receiving interleavers between a transmission side and a reception side.

(2) Second Embodiment

According to the second embodiment, the first radio communication apparatus 100 includes the information acquisition unit 151 that acquires an information block generated from transmission data for a user and subjected to error correction coding and the interleaving unit 153 that interleaves a bit sequence of the information block using an interleaver unique to the user. In particular, the interleaving unit 153 interleaves the bit sequence by interleaving two or more partial sequences obtained from the bit sequence.

Furthermore, according to the second embodiment, at least one of the two or more partial sequences includes a part of a sequence obtained by interleaving the other of the two or more partial sequences. That is, at least a part of the bit sequence is interleaved repeatedly.

Thus, for example, it is possible to transmit data more flexibly and with a lesser burden in the IDMA system. More specifically, for example, in the IDMA system, it is possible to transmit a bit sequence which has any length without transmitting and receiving interleavers between a transmission side and a reception side.

(3) Third Embodiment

According to the third embodiment, the first radio communication apparatus 100 includes the information acquisition unit 151 that acquires an information block generated from transmission data for a user and subjected to error correction coding and the interleaving unit 153 that interleaves a bit sequence of the information block using another interleaver obtained from an interleaver longer than the bit sequence of the information block and unique to the user or an interleaver unique to the user.

Thus, for example, it is possible to transmit data more flexibly and with a lesser burden in the IDMA system. More specifically, for example, in the IDMA system, it is possible to transmit a bit sequence which has any length without transmitting and receiving interleavers between a transmission side and a reception side.

(4) Fourth Embodiment

According to the fourth embodiment, the first radio communication apparatus 100 includes the information acquisition unit 151 that acquires an information block generated from transmission data for a user and the interleaving unit 153 that interleaves a bit sequence of the information block using an interleaver unique to the user. In particular, the information block is a block after segmentation for error correction coding and the error correction coding and before integration after the error correction coding.

Thus, for example, it is possible to further narrow the range of the length of the bit sequence which is the interleaving target in the IDMA system.

(5) Fifth Embodiment

According to the fifth embodiment, the first radio communication apparatus 100 includes the interleaving unit 153 that interleaves a bit sequence of an information block generated from transmission data for a user using an interleaver generated based on a predetermined calculation equation and unique to the user. In particular, the predetermined calculation equation includes a shift value according to identification information regarding the user.

Accordingly, for example, it is desirable to provide a structure that makes it possible to reduce overlap of values of interleavers between users in the IDMA system.

The preferred embodiment of the present disclosure has been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

For example, the example in which an interleaver unique to a user is used to interleave a bit sequence of an information block (for example, a codeword or a code block) generated from transmission data (for example, a transport block) for the user has been described. In the present disclosure, the interleaver may be an interleaver which is unique to the user and unique to the transmission data (for example, a transport block) or the information block (for example, a codeword or a code block). For example, the interleaver unique to the transmission data or the information block may be generated by applying a shift unique to the transmission data or the information block to the interleaver unique to the user.

Further, it is not always necessary to execute the processing steps in the processing in the present specification in chronological order in order described in the flowcharts or the sequence diagrams. For example, the processing steps in the above-described processing may be executed in order different from the order described in the flowcharts or the sequence diagrams or may be executed in parallel.

Further, a computer program (in other words, a computer program causing the processor to perform operations of constituent elements of the apparatus) that causes a processor (for example, a CPU or a DSP) including an apparatus (for example, a radio communication apparatus or a module for the radio communication apparatus) according to the present specification to function as the constituent elements (for example, an information acquisition unit, and an interleaving unit or a de-interleaving unit) of the apparatus can be generated. A recording medium that records the computer program may also be provided. An apparatus (for example, a radio communication apparatus or a module for the radio communication apparatus) including a memory that stores the computer program and one or more processors that is capable of executing the computer program may be provided. A method including operations of constituent elements (for example, an information acquisition unit, and an interleaving unit or a de-interleaving unit) of the apparatus is also included in a technology according to the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification. Additionally, the present technology may also be configured as below.

(1)

An apparatus including:

an acquisition unit configured to acquire an information block generated from transmission data for a user and subjected to error correction coding; and an interleaving unit configured to interleave a bit sequence of the information block using an interleaver unique to the user, wherein the interleaving unit interleaves the bit sequence by interleaving each of two or more partial sequences obtained from the bit sequence.

(2)

The apparatus according to (1), wherein each of the two or more partial sequence has a length of a power of two.

(3)

The apparatus according to (1) or (2), wherein the bit sequence has a length which is not a power of two.

(4)

The apparatus according to any one of (1) to (3), wherein the information block is a codeword or a code block.

(5)

The apparatus according to any one of (1) to (4), wherein the interleaving unit interleaves each of the two or more partial sequences using a corresponding interleaver, and the corresponding interleaver is an interleaver which has a same length as a length of the partial sequence and is unique to the user.

(6)

The apparatus according to any one of (1) to (5), wherein each of the two or more partial sequences is included in the bit sequence and does not overlap the other of the two or more partial sequences.

(7)

The apparatus according to (6), wherein a total sum of lengths of the two or more partial sequences is equal to a length of the bit sequence.

(8)

The apparatus according to (6) or (7), wherein the two or more partial sequences have different lengths.

(9)

The apparatus according to any one of (6) to (8), wherein the interleaving unit interleaves the two or more partial sequences in parallel.

(10)

The apparatus according to any one of (6) to (9), wherein the interleaving unit interleaves the bit sequence using one concatenated interleaver which includes an interleaver corresponding to each of the two or more partial sequences and has a same length as a length of the bit sequence, and the interleaver corresponding to each of the two or more partial sequences is an interleaver which has a same length as a length of the partial sequence and is unique to the user.

(11)

The apparatus according to any one of (1) to (5), wherein at least one of the two or more partial sequences includes a part of a sequence obtained by interleaving the other of the two or more partial sequences.

(12)

The apparatus according to (11), wherein the at least one of the partial sequences further includes a part of the bit sequence.

(13)

The apparatus according to (11) or (12), wherein a total sum of lengths of the two or more partial sequences is greater than a length of the bit sequence.

(14)

The apparatus according to any one of (11) to (13), wherein the two or more partial sequences have a same length.

(15)

The apparatus according to any one of (11) to (14), wherein a length of each of the two or more partial sequences is a length according to a length of the bit sequence among a plurality of predetermined lengths.

(16)

The apparatus according to (15), wherein a length of at least one of the two or more partial sequences is a maximum length among one or more lengths equal to or less than the length of the bit sequence and included in the plurality of predetermined lengths.

(17)

The apparatus according to any one of (11) to (16), wherein a length of each of the two or more partial sequences is one predetermined length.

(18)

An apparatus including:

an acquisition unit configured to acquire a received bit sequence; and a de-interleaving unit configured to generate a bit sequence of an information block not subjected to error correction decoding by de-interleaving the received bit sequence using a de-interleaver corresponding to an interleaver unique to a user, wherein the de-interleaving unit de-interleaves the received bit sequence by de-interleaving each of two or more partial sequences obtained from the received bit sequence.

(19)

An apparatus including:

an acquisition unit configured to acquire an information block generated from transmission data for a user and subjected to error correction coding; and an interleaving unit configured to interleave a bit sequence using an interleaver unique to the user or another interleaver obtained from the interleaver unique to the user and longer than the bit sequence of the information block.

(20)

The apparatus according to (19), wherein the interleaver unique to the user is an interleaver which has a length of a power of two.

(21)

The apparatus according to (19) or (20), wherein the other interleaver is an interleaver which has the same length as a length of the bit sequence of the information block.

(22)

The apparatus according to (21), wherein the other interleaver is an interleaver obtained by excluding a portion in which input bits are output to bits not included in an output bit sequence which has a same length as the length of the bit sequence from the interleaver unique to the user.

(23)

The apparatus according to any one of (19) to (22), wherein the bit sequence has a length which is not a power of two.

(24)

The apparatus according to any one of (19) to (23), wherein the information block is a codeword or a code block.

(25)

An apparatus including:

an acquisition unit configured to acquire a received bit sequence; and a de-interleaving unit configured to generate a bit sequence of an information block not subjected to error correction decoding by de-interleaving the received bit sequence using a de-interleaver corresponding to another interleaver obtained from an interleaver longer than the received bit sequence and unique to a user.

(26)

An apparatus including:

an acquisition unit configured to acquire an information block generated from transmission data for a user; and an interleaving unit configured to interleave a bit sequence of the information block using an interleaver unique to the user, wherein the information block is a block after segmentation for error correction coding and the error correction coding and before integration after the error correction coding.

(27)

The apparatus according to (26), wherein the information block is a code block.

(28)

The apparatus according to (26) or (27), wherein the interleaving unit interleaves a bit sequence of two or more information blocks corresponding to the same unit block using the same interleaver.

(29)

The apparatus according to any one of (26) to (28), wherein the interleaver unique to the user is an interleaver which has a length of a power of two.

(30)

The apparatus according to any one of (26) to (29), wherein the interleaver unique to the user is an interleaver which is unique to a cell, a unit block larger than the information block, or a link direction.

(31)

The apparatus according to any one of (26) to (30), wherein the integration after the error correction coding is concatenation or bit collection of exclusive OR.

(32)

An apparatus including:

an acquisition unit configured to acquire a received bit sequence; and a de-interleaving unit configured to generate a bit sequence of an information block by de-interleaving the received bit sequence using a de-interleaver corresponding to an interleaver unique to a user, wherein the information block is a block after segmentation for error correction decoding and before the error correction decoding.

(33)

A method comprising: by a processor, acquiring information block generated from transmission data for a user and subjected to error correction coding; and interleaving a bit sequence of the information block using an interleaver unique to the user, wherein the interleaving of the bit sequence includes interleaving two or more partial sequences obtained from the bit sequence.

(34)

A program causing a processor to execute:

acquiring information block generated from transmission data for a user and subjected to error correction coding; and interleaving a bit sequence of the information block using an interleaver unique to the user, wherein the interleaving of the bit sequence includes interleaving two or more partial sequences obtained from the bit sequence.

(35)

A readable recording medium having a program recorded thereon, the program causing a processor to execute:

acquiring information block generated from transmission data for a user and subjected to error correction coding; and interleaving a bit sequence of the information block using an interleaver unique to the user, wherein the interleaving of the bit sequence includes interleaving two or more partial sequences obtained from the bit sequence.

(36)

A method comprising: by a processor, acquiring a received bit sequence; and generating a bit sequence of an information block not subjected to error correction decoding by de-interleaving the received bit sequence using a de-interleaver corresponding to an interleaver unique to a user, wherein the de-interleaving of the received bit sequence includes de-interleaving two or more partial sequences obtained from the received bit sequence.

(37)

A program causing a processor to execute:

acquiring a received bit sequence; and generating a bit sequence of an information block not subjected to error correction decoding by de-interleaving the received bit sequence using a de-interleaver corresponding to an interleaver unique to a user, wherein the de-interleaving of the received bit sequence includes de-interleaving two or more partial sequences obtained from the received bit sequence.

(38)

A readable recording medium having a program recorded thereon, the program causing a processor to execute:

acquiring a received bit sequence; and generating a bit sequence of an information block not subjected to error correction decoding by de-interleaving the received bit sequence using a de-interleaver corresponding to an interleaver unique to a user, wherein the de-interleaving of the received bit sequence includes de-interleaving two or more partial sequences obtained from the received bit sequence.

(39)

A method including: by a processor, acquiring an information block generated from transmission data for a user and subjected to error correction coding; and interleaving a bit sequence using an interleaver unique to the user or another interleaver obtained from the interleaver unique to the user and longer than the bit sequence of the information block.

(40)

A program causing a processor to execute:

acquiring an information block generated from transmission data for a user and subjected to error correction coding; and interleaving a bit sequence using an interleaver unique to the user or another interleaver obtained from the interleaver unique to the user and longer than the bit sequence of the information block.

(41)

A readable recording medium having a program recorded thereon, the program causing a processor to execute:

acquiring an information block generated from transmission data for a user and subjected to error correction coding; and interleaving a bit sequence using an interleaver unique to the user or another interleaver obtained from the interleaver unique to the user and longer than the bit sequence of the information block.

(42)

A method including: by a processor, acquiring a received bit sequence; and generating a bit sequence of an information block not subjected to error correction decoding by de-interleaving the received bit sequence using a de-interleaver corresponding to another interleaver obtained from an interleaver longer than the received bit sequence and unique to a user.

(43)

A program causing a processor to execute:

acquiring a received bit sequence; and generating a bit sequence of an information block not subjected to error correction decoding by de-interleaving the received bit sequence using a de-interleaver corresponding to another interleaver obtained from an interleaver longer than the received bit sequence and unique to a user.

(44)

A readable recording medium having a program recorded thereon, the program causing a processor to execute:

acquiring a received bit sequence; and generating a bit sequence of an information block not subjected to error correction decoding by de-interleaving the received bit sequence using a de-interleaver corresponding to another interleaver obtained from an interleaver longer than the received bit sequence and unique to a user.

(45)

A method including: by a processor, acquiring an information block generated from transmission data for a user; and interleaving a bit sequence of the information block using an interleaver unique to the user, wherein the information block is a block after segmentation for error correction coding and the error correction coding and before integration after the error correction coding.

(46)

A program causing a processor to execute:

acquiring an information block generated from transmission data for a user; and interleaving a bit sequence of the information block using an interleaver unique to the user, wherein the information block is a block after segmentation for error correction coding and the error correction coding and before integration after the error correction coding.

(47)

A readable recording medium having a program recorded thereon, the program causing a processor to execute:

acquiring an information block generated from transmission data for a user; and interleaving a bit sequence of the information block using an interleaver unique to the user, wherein the information block is a block after segmentation for error correction coding and the error correction coding and before integration after the error correction coding.

(48)

An apparatus including: by a processor, acquiring a received bit sequence; and generating a bit sequence of an information block by de-interleaving the received bit sequence using a de-interleaver corresponding to an interleaver unique to a user, wherein the information block is a block after segmentation for error correction decoding and before the error correction decoding.

(49)

A program causing a processor to execute:

acquiring a received bit sequence; and generating a bit sequence of an information block by de-interleaving the received bit sequence using a de-interleaver corresponding to an interleaver unique to a user, wherein the information block is a block after segmentation for error correction decoding and before the error correction decoding.

(50)

A readable recording medium having a program recorded thereon, the program causing a processor to execute:

acquiring a received bit sequence; and generating a bit sequence of an information block by de-interleaving the received bit sequence using a de-interleaver corresponding to an interleaver unique to a user, wherein the information block is a block after segmentation for error correction decoding and before the error correction decoding.

REFERENCE SIGNS LIST 1 system
11, 31, 51, 71 bit sequence
13, 33, 43, 53, 65 partial sequence
100 first radio communication apparatus
150 transmission processing unit
151 information acquisition unit
153 interleaving unit
200 second radio communication apparatus
250 reception processing unit
251 information acquisition unit
253 de-interleaving unit

The invention claimed is:

1. An apparatus, comprising:
circuitry configured to:
acquire an information block from transmission data, wherein the information block is subjected to an error correction coding operation; and
interleave a bit sequence of the information block, wherein
the interleave of the bit sequence is based on interleave of each of a plurality of partial sequences obtained from the bit sequence, and
a length of each of the plurality of partial sequences is a power of two.

2. The apparatus according to claim 1, wherein the information block is one of a codeword or a code block.

3. The apparatus according to claim 1, wherein:
the circuitry is further configured to interleave each of the plurality of partial sequences by a corresponding interleaver,
a length of the corresponding interleaver is equal to a length of one of the plurality of partial sequences, and
the corresponding interleaver is unique to a user.

4. The apparatus according to claim 1, wherein:
each of the plurality of partial sequences is included in the bit sequence, and
a first partial sequence of the plurality of partial sequences non-overlaps with a second partial sequence of the plurality of partial sequences.

5. The apparatus according to claim 4, wherein a total sum of lengths of the plurality of partial sequences is equal to the length of the bit sequence.

6. The apparatus according to claim 4, wherein the plurality of partial sequences have different lengths.

7. The apparatus according to claim 4, wherein the circuitry is further configured to interleave the plurality of partial sequences in parallel.

8. The apparatus according to claim 4, wherein:
the circuitry is further configured to interleave the bit sequence based on a concatenated interleaver, wherein the concatenated interleaver includes a first interleaver corresponding to each of the plurality of partial sequences, and
a length of the concatenated interleaver is equal to the length of the bit sequence,
a length of the first interleaver corresponding to each of the plurality of partial sequences is equal to a length of one of the plurality of partial sequences, and
the first interleaver is unique to a user.

9. The apparatus according to claim 1, wherein a first partial sequence of the plurality of partial sequences further includes a part of the bit sequence.

10. The apparatus according to claim 1, wherein a total sum of lengths of the partial sequences is greater than the length of the bit sequence.

11. The apparatus according to claim 1, wherein the plurality of partial sequences have a same length.

12. The apparatus according to claim 1, wherein
a length of each of the plurality of partial sequences is based on the length of the bit sequence, and
the length of each of the plurality of partial sequences is among a plurality of lengths.

13. The apparatus according to claim 1, wherein a length of each of the plurality of partial sequences is a same length.

14. An apparatus, comprising:
circuitry configured to:
acquire a bit sequence; and
generate an information block by de-interleave of the acquired bit sequence based on a de-interleaver, wherein
the de-interleaver corresponds to an interleaver unique to a user,
the de-interleave of the acquired bit sequence is by de-interleave of each of the plurality of partial sequences obtained from the acquired bit sequence,
the information block is non-decoded for error correction, and
a length of each of the plurality of partial sequences is a power of two.

15. An apparatus, comprising:
circuitry configured to:
acquire an information block from transmission data, wherein the information block is subjected to an error correction coding operation; and
interleave a bit sequence based on one of a first interleaver or a second interleaver obtained from the first interleaver, wherein
the second interleaver is longer than the bit sequence of the information block,
a plurality of partial sequences is obtained from the bit sequence, and
a length of each of the plurality of partial sequences is a power of two.

16. A method, comprising:
acquiring an information block from transmission data, wherein the information block is subjected to an error correction coding operation; and
interleaving a bit sequence of the information block, wherein
the interleave of the bit sequence is based on interleave of each of a plurality of partial sequences obtained from the bit sequence, and
a length of each of the plurality of partial sequences is a power of two.

* * * * *